(12) United States Patent
Kunikiyo et al.

(10) Patent No.: US 6,741,495 B2
(45) Date of Patent: May 25, 2004

(54) MAGNETIC MEMORY DEVICE AND MAGNETIC SUBSTRATE

(75) Inventors: Tatsuya Kunikiyo, Tokyo (JP); Katsumi Eikyu, Tokyo (JP); Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/424,086

(22) Filed: Apr. 28, 2003

(65) Prior Publication Data

US 2003/0210591 A1 Nov. 13, 2003

Related U.S. Application Data

(62) Division of application No. 09/989,155, filed on Nov. 21, 2001, now Pat. No. 6,567,299.

(30) Foreign Application Priority Data

Feb. 6, 2001 (JP) ..................................... P2001-029426

(51) Int. Cl.[7] .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS

| | | | |
|---|---|---|---|
| 5,193,074 A | 3/1993 | Anami | 365/230.03 |
| 5,640,343 A | 6/1997 | Gallagher et al. | 365/171 |
| 5,793,697 A | 8/1998 | Scheuerlein | 365/171 |
| 5,852,574 A | 12/1998 | Naji | 365/158 |
| 5,946,228 A | 8/1999 | Abraham et al. | 365/173 |
| 5,982,660 A | 11/1999 | Bhattacharyya et al. | 365/173 |
| 6,097,625 A | 8/2000 | Scheuerlein | 365/171 |
| 6,335,890 B1 * | 1/2002 | Reohr et al. | 365/225.5 |
| 6,445,612 B1 * | 9/2002 | Naji | 365/158 |
| 6,473,336 B1 * | 10/2002 | Nakajima et al. | 365/171 |

* cited by examiner

Primary Examiner—Son Mai
(74) Attorney, Agent, or Firm—McDermott, Will & Emery

(57) ABSTRACT

A plurality of word lines (WL1) are provided in parallel to one another and a plurality of bit lines (BL1) are provided in parallel to one another, intersecting the word lines (WL1) thereabove. MRAM cells (MC2) are formed at intersections of the word lines and the bit lines therebetween. MRAM cells (MC3) are provided so that an easy axis indicated by the arrow has an angle of 45 degrees with respect to the bit lines and the word lines. Thus, an MRAM capable of cutting the power consumption in writing is achieved and further an MRAM capable of reducing the time required for erasing and writing operations is achieved.

2 Claims, 51 Drawing Sheets

F I G. 1 3
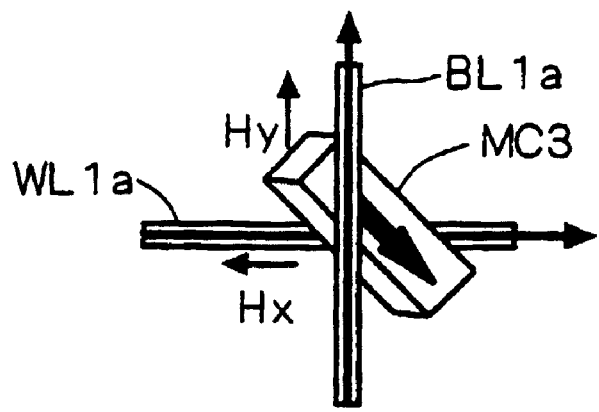
F I G. 1 4
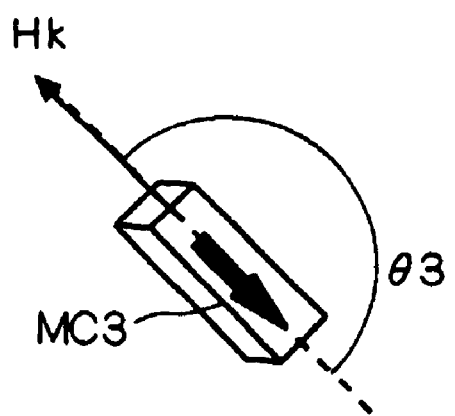

F I G. 24
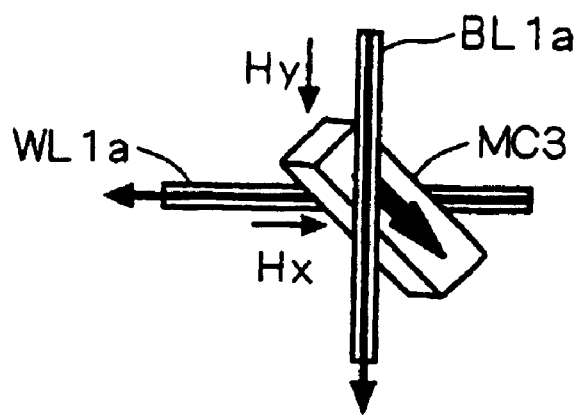
F I G. 25
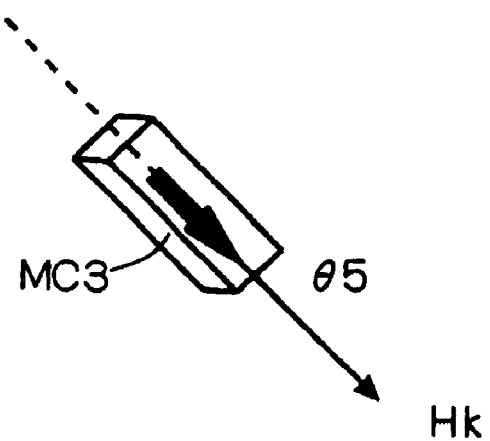

F I G. 49
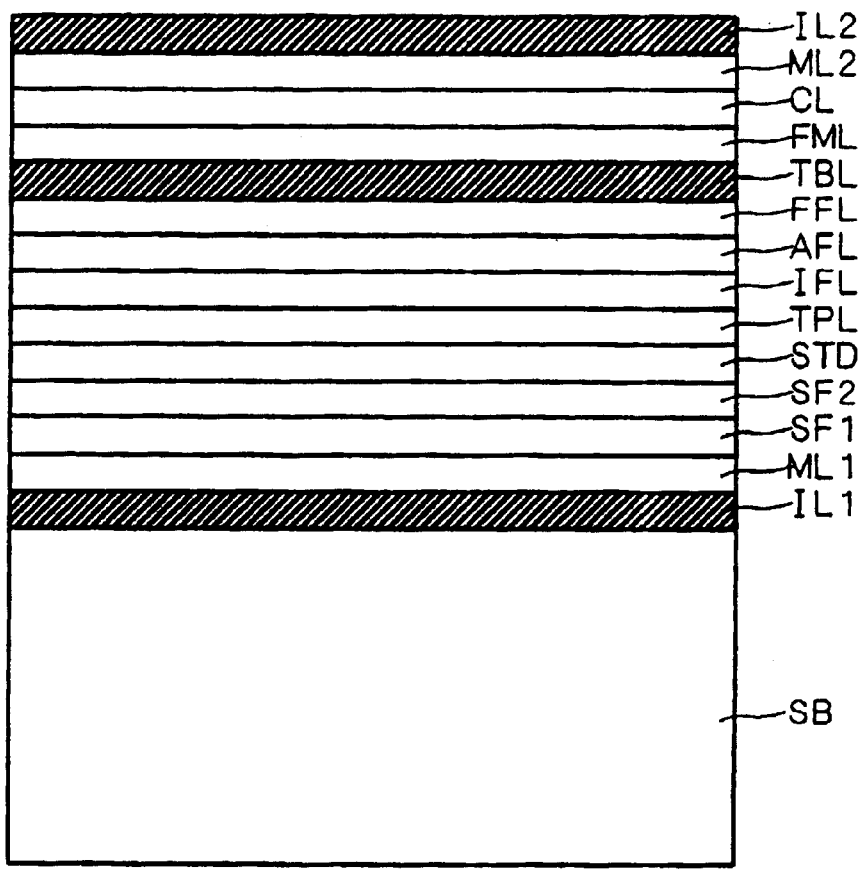

F I G. 52
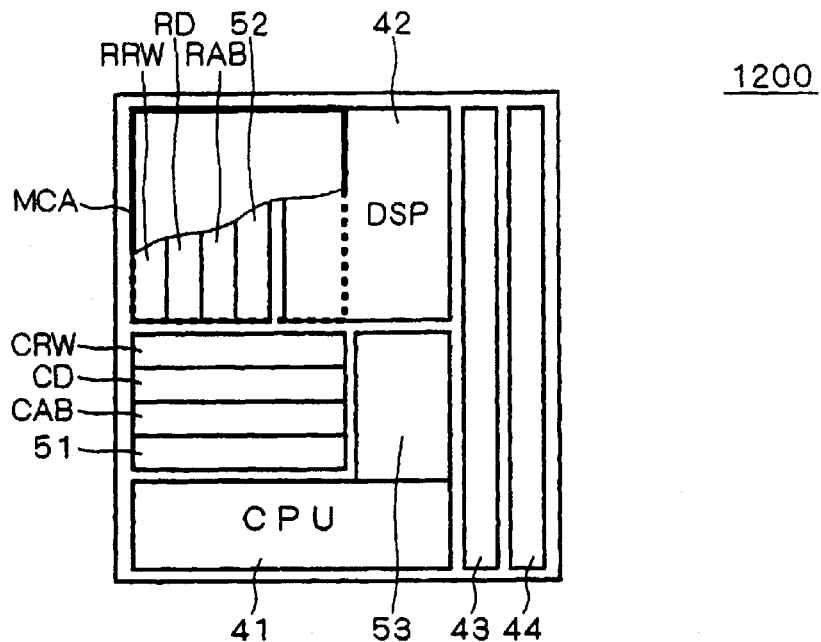
F I G. 53
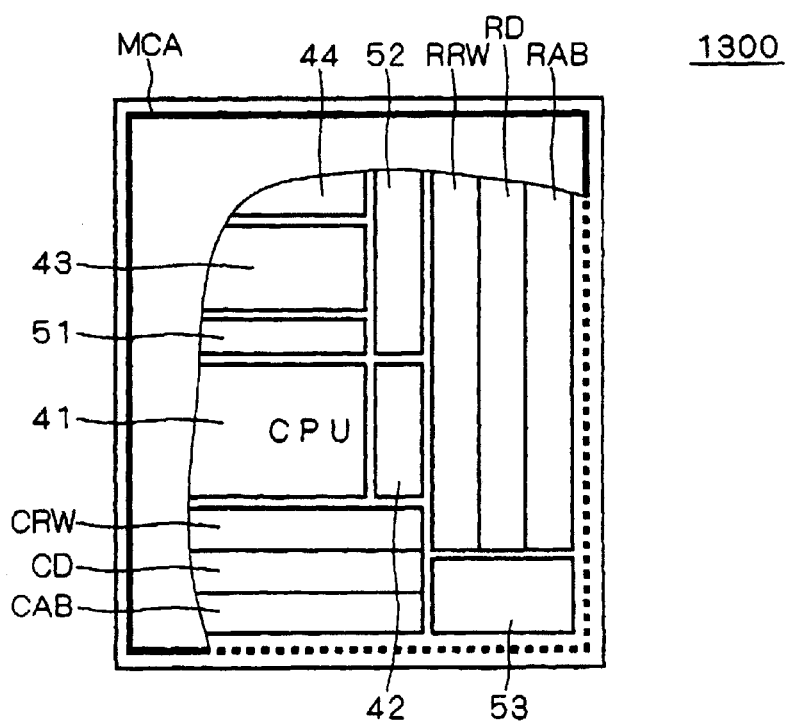

F / G. 6 3
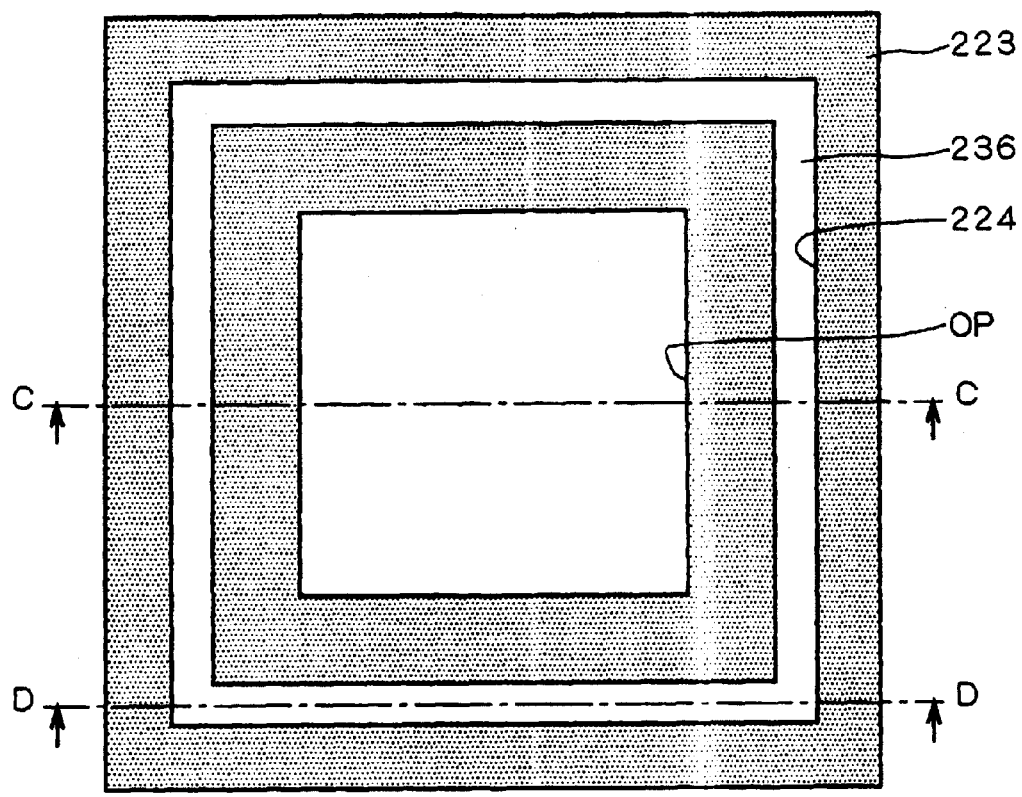
F / G. 6 4 A
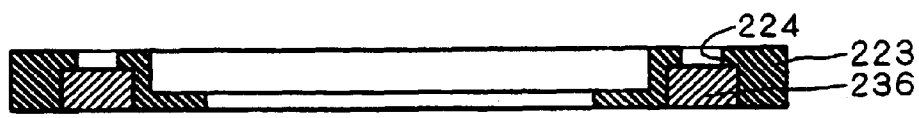
F / G. 6 4 B

MAGNETIC MEMORY DEVICE AND MAGNETIC SUBSTRATE

This application is a divisional of application Ser. No. 09/989,155 filed Nov. 21, 2000, now U.S. Pat. No. 6,567,299.

BACKGROUND OF THE INVENTION

1. Field of the Invention

The present invention relates to a magnetic memory device, and more particularly to a magnetic memory device having a nonvolatile memory cell array which uses a magnetic tunnel junction as each memory cell.

2. Description of the Background Art

<Tunnel Magnetic Resistance Effect>

A structure in which an insulative material is sandwiched between two ferromagnetic materials is termed "magnetic tunnel junction (MTJ)".

FIG. 67 shows a concept of an MTJ. In FIG. 67, an insulating layer TB is provided, being sandwiched between ferromagnetic layers FM21 and FM22 and a voltage is applied to the ferromagnetic layers FM21 and FM22.

In this structure, when a current tunneling the insulating layer TB is measured, it is observed that the measured current value varies depending on the directions of magnetization of the two ferromagnetic layers.

This phenomenon is termed "tunnel magnetic resistance (TMR) effect". The TMR effect will be discussed, referring to FIGS. 68 to 70.

FIG. 68 is a schematic view showing the density of states N(E) of a transition metal. In FIG. 68, the horizontal axis indicates the density of states and the vertical axis indicates an energy E, and electrons included in atoms are grouped according to the directions of spin. Specifically, in FIG. 68, the density of states of atoms having electrons whose direction of spin is downward is shown on the left hand and that of atoms having electrons whose direction of spin is upward is shown on the right hand.

Further, in FIG. 68, since the atoms filled with electrons up to the Fermi level are schematically shown among the 3d orbit and the 4s orbit, the atoms filled with electrons up to the Fermi level are hatched with the Fermi level as the boundary.

The reason why the transition metal becomes a ferromagnetic substance is that the number of electrons whose direction of spin is downward and that of electrons whose direction of spin is upward are different on the 3d orbit among the atoms filled with electrons up to the Fermi level.

In other words, since number of electrons whose direction of spin is downward and that of electrons whose direction of spin is upward are equal on the 4s orbit, the electrons on the 4s orbit do not contribute to generation of magnetism.

FIGS. 69 and 70 are schematic views illustrating the TMR effect. In FIG. 69, among the 3d orbit of atoms constituting the ferromagnetic layer FM21 on the left side of the insulating layer TB, the density of states of atoms having the electrons of downward spin is higher than that of atoms having the electrons of upward spin and therefore the direction of magnetization is downward on the whole.

Similarly, the direction of magnetization of the ferromagnetic layer FM22 on the right side of the insulating layer TB is downward on the whole.

Tunneling of electrons mainly occurs so that the directions of spin in an initial state and a final state can be conserved. In the case of FIG. 69, since both the density of states of downward spin in the initial state (inside the ferromagnetic layer FM21) and that in the final state (inside the ferromagnetic layer FM22) are large, the tunneling probability is large and a tunneling current is also large. In other words, the tunnel magnetic resistance is small.

On the other hand, in FIG. 70, since the density of states of upward spin in the initial state (inside the ferromagnetic layer FM21) is large and that in the final state (inside the ferromagnetic layer FM22) is small, the tunneling probability is small and the tunneling current is also small. In other words, the tunnel magnetic resistance is large.

The tunnel magnetic resistance rate (TMRR) is expressed by the following equation;

$$TMRR = \frac{R_{AF} - R_F}{R_A} = \frac{P_1 P_2}{1 - P_1 P_2} \quad (1)$$

where the resistance in a case where the directions of magnetization of the two ferromagnetic layers are the same is $R_F$ and that in a case where those are opposite is $R_{AF}$.

Further, in the above Eq. (1), $P_1$ and $P_2$ denotes the spin polarizabilities of the ferromagnetic layers FM21 and FM22, respectively.

Assuming that the density of states of ρ spin band in the Fermi surface is D ρ ($E_F$), the spin polarizability is expressed as;

$$P = \frac{D\uparrow(E_F) - D\downarrow(E_F)}{D\uparrow(E_F) + D\downarrow(E_F)} \quad (2)$$

Specifically, the spin polarizability becomes larger as the difference between the density of states of upward spin and that of downward spin is larger. Further, as the spin polarizability approximates 1, the TMRR becomes larger. Furthermore, it is known that the spin polarizability and the magnetization are in proportion to each other. Herein, the spin polarizabilities of various magnetic materials are shown in Table 1:

TABLE 1

| Materials | Spin Polarizability |
| --- | --- |
| Fe | 0.44 |
| Co | 0.35 |
| Ni | 0.23 |
| $Ni_{80}Fe_{20}$ | 0.25, 0.45 |
| FeCo | 0.53 |
| NiMnSb | 1, 0.58 |
| PtMnSb | 1 |
| $CrO_2$ | 1 |
| $Fe_3O_4$ | 1 |
| $(La.Sr)MnO_3$ | 1 |

A device utilizing the above TMR effect to store data, making correspondence between the directions of magnetization of two ferromagnetic layers and two values, 0 and 1, is an MRAM (Magnetic Random Access Memory).

Accordingly, though it is required to change the direction of magnetization of one of the two ferromagnetic layers in the MTJ, in some cases, the directions of magnetization of both ferromagnetic layers are changed in the structure of FIG. 67 when the magnetic field is given thereto. Then proposed is a structure as shown in FIG. 71, in which an antiferromagnetic layer is formed on the one of the ferromagnetic layers to fix the direction of magnetization of the one of the ferromagnetic layers.

In FIG. 71, the insulating layer TB is sandwiched between the ferromagnetic layers FM21 and FM22 and an antiferromagnetic layer AF is formed above the ferromagnetic layer FM21. Further, a positive electrode of a DC power supply is connected to the antiferromagnetic layer AF and a negative electrode thereof is connected to the ferromagnetic layer FM22.

When a ferromagnetic material and an antiferromagnetic material are formed adjacently to each other, a magnetic flux penetrating these materials is closed to fix the direction of magnetization. This structure is termed "spin valve type ferromagnetic tunnel junction element".

FIG. 72 shows a structure of variation of the spin valve type ferromagnetic tunnel junction element. In FIG. 72, the insulating layer TB is sandwiched between the ferromagnetic layers FM21 and FM22, the antiferromagnetic layer AF is formed above the ferromagnetic layer FM21 and a ferromagnetic layer FM23 is formed below the ferromagnetic layer FM22.

Herein, the antiferromagnetic layer AF is made of, e.g., IrMn containing Ir (iridium) of 20 to 30 atom. %, to fix the direction of magnetization of the ferromagnetic layer FM21, and the ferromagnetic layer FM21 is made of CoFe having large coercivity because it is better that the direction of magnetization should be hard to reverse with respect to the external magnetic field.

Further, as discussed earlier referring to Eq. (1), since the tunnel magnetic resistance rate (TMRR) becomes larger as the spin polarizability is larger, CoFe is used as a material having large spin polarizability.

On the other hand, though the ferromagnetic layer FM22 is also made of CoFe, it is desirable that the ferromagnetic layer FM22 should be made of a material having small coercivity so that its direction of magnetization may be controlled by a smaller external magnetic field.

In the structure of FIG. 72, $Ni_{80}Fe_{20}$ (permalloy) having small coercivity and small spin polarizability is used as the ferromagnetic layer FM23 to allow easy reverse in the direction of magnetization of the ferromagnetic layer FM22. The direction of magnetization of the ferromagnetic layer FM22 can be thereby reversed by a small external magnetic field.

FIG. 73 shows a practical structure of the spin valve type ferromagnetic tunnel junction element of FIG. 72, and FIG. 74 shows measured characteristics of TMR in this structure.

In FIG. 73, the insulating layer TB is formed above a layered structure consisting of the antiferromagnetic layer AF and the ferromagnetic layer FM21 which are formed two-dimensionally on a substrate BD, and the ferromagnetic layer FM23 is formed above the insulating layer TB. A measured result of change in magnetic resistance MR at the time when the external magnetic field is given to such a structure is shown in FIG. 74.

In FIG. 74, the horizontal axis indicates the magnetic field (converted by 1 oersted=about 79 A/m) and the vertical axis indicates the tunnel magnetic resistance rate (TMRR). It can be seen from FIG. 74 that the TMRR is 36%, the magnetic field required to reverse the direction of magnetization is low, i.e., about 30 (×79 A/m), and a hysteresis symmetric with respect to the direction of magnetization is achieved.

<Structure and Operation Principles of MRAM>

In the MRAM, the directions of magnetization of the two ferromagnetic materials in the magnetic tunnel junction element making up a memory cell are controlled to be the same or opposite by the external magnetic field and the state where the directions of magnetization are the same or the state where the directions of magnetization are opposite is brought into correspondence with 0 or 1, to store data.

The stored data can be read out by passing a predetermined current through the memory cell and sensing the voltages at both ends of the tunnel magnetic resistance. Since sensing becomes easier as the tunnel magnetic resistance rate (TMMR) is larger, a ferromagnetic material having large spin polarizability is advantageous to the MRAM.

Further, in order to write data, it is only necessary to change the direction of magnetization of one of the ferromagnetic materials by using the magnetic field generated by passing a predetermined current through the lines (word line and bit line).

<Structure of MRAM Cell>

Now, discussion will be made below on a structure and an operation of an MRAM disclosed in U.S. Pat. No. 5,793,697 as a background-art example.

FIG. 75 is a perspective view showing an MRAM cell array and cells. In FIG. 75, word lines 1, 2 and 3 are provided in parallel to one another and bit lines 4, 5 and 6 are provided in parallel to one another, intersecting the word lines thereabove.

MRAM cells (hereinafter, sometimes referred to simply as "cell") 9 are formed at intersections of the word lines and the bit lines therebetween. In FIG. 75, as shown in an enlarged view, the MRAM cell 9 has a structure in which a silicon pn-junction diode 7 and a magnetic tunnel junction element (MTJ) 8 are layered on the word lines.

FIG. 76 is a schematic view showing a cross-sectional structure of the MRAM cell 9. Further, FIG. 76 shows the MRAM cell 9 on the word line 3, where the word line 3 is provided on a silicon substrate 80 and thereon an $n^+$ silicon layer 10 and a $p^+$ silicon layer 11 are layered to make up the pn-junction diode 7. The pn-junction diode 7 is covered with an insulating film such as a silicon oxide film 13.

A tungsten stud 12 is formed above the pn-junction diode 7 and the pn-junction diode 7 is electrically connected to the MTJ 8 through the tungsten stud 12. Further, the silicon oxide film 13 is so provided as to also cover the tungsten stud 12 and surfaces of the tungsten stud 12 and the silicon oxide film 13 are planarized by CMP (Chemical Mechanical Polishing).

MTJ 8 has a layered structure consisting of a template layer 15 (having a film thickness of 10 nm) made of platinum (Pt), an initial ferromagnetic layer 16 (having a film thickness of 4 nm) made of permalloy of $Ni_{81}Fe_{19}$, a diamagnetic layer 18 (having a film thickness of 10 nm) made of $Mn_{54}Fe_{46}$, a ferromagnetic layer 20 (having a film thickness of 8 nm) made of permalloy of CoFe or $Ni_{81}Fe_{19}$ and having a fixed direction of magnetization, a tunnel barrier layer 22 made of $Al_2O_3$, a soft ferromagnetic layer 24 made of a multilayer film consisting of CoFe having a film thickness of 2 nm and $Ni_{81}Fe_{19}$ having a film thickness of 20 nm, and a contact layer 25 made of Pt from the bottom.

Further, the tunnel barrier layer 22 is formed by depositing Al having a film thickness of 1 to 2 nm and performing the plasma oxidation method for 60 to 240 seconds with the power density of 25 W/cm$^2$ under the oxygen pressure of 100 mTorr ($100 \times 10^{-3} \times 1.33 \times 10^2$ Pa).

Furthermore, not shown in FIG. 76, a large MTJ is actually formed entirely over a surface of the silicon oxide film 13 on the substrate 80 and the MTJ is patterned by argon ion milling with a photoresist mask, to form a plurality of small MTJs 8 as shown in FIG. 76. Each MTJ 8 is covered with a silicon oxide film 26. Further, not shown in FIG. 76, the contact layer 25 is connected to the bit lines.

The magnetic tunnel resistance of the MTJ 8 varies depending on whether the direction of magnetization of the soft ferromagnetic layer 24 discussed above is the same as that of the ferromagnetic layer 20 or opposite to. The direction of magnetization of the soft ferromagnetic layer 24 can be changed by a magnetic field generated by a current flowing the bit lines and the word lines.

Further, the magnetic tunnel resistance of the MTJ 8 greatly depends on the film thickness and the barrier height of the tunnel barrier layer 22 and the material characteristics of a film, such as roughness, at an interface below the junction.

The soft ferromagnetic layer 24 is so formed as to have an easy axis which is a direction of easy magnetization. There are two directions of magnetization along the easy axis, corresponding to two data of the memory cell, 0 and 1, respectively.

On the other hand, the ferromagnetic layer 20 is formed so that its direction of magnetization should be the same as the easy axis of the soft ferromagnetic layer 24 and the direction should not be changed depending on the operating state of the MRAM.

Such a direction of magnetization is termed "unidirectional anisotropy direction". The easy axis of the soft ferromagnetic layer 24 is defined by a combination of the intrinsic anisotropy, the stress induced anisotropy and an anisotropy which depends on shape of the MTJ 8.

The intrinsic anisotropy refers to an anisotropy of magnetization intrinsic to a ferromagnetic substance, and the stress induced anisotropy refers to an anisotropy of magnetization generated at the time when a stress is applied to a ferromagnetic substance.

Further, as shown in FIG. 75, the MTJ 8 has a rectangular shape with a long side L and a short side W in a plan view. This is because the easy axis of the soft ferromagnetic layer 24 is defined by using the anisotropy which depends on the shape of the MTJ 8.

Next discussion will be made on a method of setting the unidirectional anisotropy direction of the ferromagnetic layer 20. The initial ferromagnetic layer 16 deposited on the template layer 15 grows with a surface ({111} surface) whose crystal orientation is a {111} orientation upward. Further, the diamagnetic layer 18 made of MnFe is deposited on the initial ferromagnetic layer 16.

These magnetic layers are deposited under the magnetic field whose direction is the same as that of the easy axis of the soft ferromagnetic layer 24 which is deposited later, and the unidirectional anisotropy direction of the soft ferromagnetic layer 24 is thereby defined.

Further, since the magnetic flux is closed between the ferromagnetic layer 20 and the diamagnetic layer 18, the direction of magnetization of the ferromagnetic layer 20 becomes harder to change by the external magnetic field than that of the soft ferromagnetic layer 24, and the direction of magnetization of the ferromagnetic layer 20 is fixed within a range of magnitude of the magnetic field generated by the current flowing the word lines and the bit lines. Moreover, since the MTJ 8 has a rectangular shape in a plan view, a magnetizing anisotropy which depends on the shape of the ferromagnetic layer 20 is generated, which contributes to the stabilization in the direction of magnetization of the ferromagnetic layer 20.

<Outline of Writing/Reading Operation of MRAM>

Discussion will be made below on writing/reading operation of the MRAM.

When a predetermined current is passed through a word line and a bit line for address selection (referred to as "selected word line" and "selected bit line"), magnetic fields are generated around the lines and a coupled magnetic field obtained by coupling these magnetic fields is generated at an intersection (selected address) of these lines. When this magnetic field is given, the direction of magnetization of the soft ferromagnetic layer 24 in the MTJ 8 provided at the intersection of these lines is rotated in a surface of the layer, to write data.

The magnitude of the magnetic field is so designed as to be larger than that of a switching magnetic field (the magnetic field at which the direction of magnetization starts rotating) of the soft ferromagnetic layer 24, which mainly depends on the coercivity and the magnetizing anisotropy of the soft ferromagnetic layer 24.

Further, the magnetic fields generated around the selected word line and the selected bit line must be designed enough small to avoid rotation of the unidirectional anisotropy direction of the ferromagnetic layer 20. This is intended not to change the direction of magnetization of a half-selected cell. The half-selected cell refers to a cell in which the current flows in only one of the word line and the bit line which are provided thereabove and therebelow.

Thus, the architecture of the memory cell array is so designed as to avoid direct flow of the writing current into the MTJ 8, for the purpose of cutting the power consumption in data writing.

Further, the data written into the MRAM cell 9 are read out by sensing the current flowing vertically through the pn-junction diode 7 and the MTJ 8. Furthermore, since a tunneling current flows vertically through the MRAM cell 9 during operation, the occupied area of the MRAM cell 9 can be reduced.

The resistance of the tunnel barrier layer 22 made of $Al_2O_3$ in the MTJ 8 varies almost exponentially with respect to the film thickness thereof. Specifically, the current flowing in the tunnel barrier is reduced as the film thickness becomes thicker and only a current tunneling the junction flows vertically with respect to the junction.

The data in the MRAM cell 9 are read out by monitoring a voltage of the MRAM cell 9 generated when a sense current too much smaller than the writing current flows vertically in the MTJ 8.

As discussed earlier, the tunneling probability of the MTJ 8 increases as the density of states of the spin having the same polarity as the spin in the soft ferromagnetic layer 24 in the initial state is higher in the ferromagnetic layer 20 in the final state.

Accordingly, the magnetic tunnel resistance of the MTJ 8 is low when the states of spin of the soft ferromagnetic layer 24 and the ferromagnetic layer 20 are the same, in other words, the directions of magnetization of these layers are the same and is high when the directions of magnetization of these layers are opposite. Therefore, the data in the MRAM cell 9 can be read out only by monitoring the resistance of the MTJ with a microcurrent.

Further, the magnetic field generated by the sense current is negligible, which has no effect on the state of magnetization of the MRAM cell 9. Furthermore, since lines required for the reading/writing operation of the MRAM cell 9 are only the bit lines and the word lines shown in FIG. 75, an efficient memory cell array can be achieved.

<Writing Operation>

Further discussion will be made below on the writing operation of the MRAM, referring to FIGS. 77 and 78.

FIG. 77 is an equivalent circuit diagram of the MRAM cell array of FIG. 75, where both ends of the word lines 1 to 3 are connected to a word-line control circuit 53 and both ends of the bit lines 4 to 6 are connected to a bit-line control circuit 51. Further, for convenience of illustration in FIG. 78, the word lines 1 to 3 are represented as word lines WL1 to WL3 and the bit lines 4 to 6 are represented as bit lines BL4 to BL6 in some cases.

At the intersections of the word lines 1 to 3 and the bit lines 4 to 6 provided are the MTJs 8 represented by resistance symbols and the pn-junction diodes 7 represented by diode symbols.

Herein, assuming that the word line 1 and the bit line 4 are selected, an MRAM cell 9a located at the intersection of these lines is selected.

Writing to the selected MRAM cell 9a is performed by the coupled magnetic field generated by a current $I_B$ flowing in the bit line 4 and a current $I_W$ flowing in the word line 1.

A magnetic field generated by either one of the current $I_B$ and the current $I_W$ in the cell region is smaller than that required to change the direction of magnetization of the soft ferromagnetic layer 24 in the MTJ 8.

Therefore, in the MRAM cell arrays 9b to 9e which are half-selected cells (cells in which only one of the current $I_B$ and the current $I_W$ flows in the bit lines or the word lines), no writing operation is performed.

When the magnetic fields generated by the current $I_B$ and the current $I_W$ are coupled, however, the magnitude of the coupled magnetic field becomes enough large to change the direction of magnetization of the soft ferromagnetic layer 24 in the selected memory cell 9a.

Further, at least one of the current $I_B$ and the current $I_W$ is so designed as to flow bidirectionally in order to allow the direction of magnetization of the soft ferromagnetic layer 24 in the cell 9a to be two opposite ones. Furthermore, in FIG. 77, since two bit-line control circuits 51 and two word-line control circuits 53 are provided in pairs, both the currents $I_B$ and $I_W$ can change the directions of current flow.

FIG. 78 is a timing chart showing voltages and currents of the bit lines 4 to 6 (bit lines BL4 to BL6) and the word lines 1 to 3 (word lines WL1 to WL3).

As shown in FIG. 78, the voltages of the bit lines BL4 to BL6 in writing are set to a voltage $V_b$ which is suitable for bidirectional currents. The voltages of the word lines WL1 to WL3 are set to a voltage $V_w$ which is larger than the voltage $V_b$ and positive.

On standby, these voltages are so set as to apply a reverse bias to the pn-junction diodes 7 in all the cells 9. Accordingly, neither the current $I_B$ nor the current $I_W$ flows in the memory cells on standby.

<Reading Operation>

Next discussion will be made on a reading operation of the MRAM in more detail, referring to FIGS. 77 and 78. As shown in FIG. 78, the voltage of the word line WL1 is lowered from $V_w$ to $V_b$ and the voltage of the bit line BL4 is raised from $V_b$ to $V_w$, to apply a forward bias to the pn-junction diode 7 in the selected cell 9a.

In reading, the voltages of non-selected bit lines 5 and 6 are still the standby voltage $V_b$ and those of the non-selected word lines 2 and 3 are still the standby voltage $V_w$.

Further, since there is no voltage drop from the word lines to the bit lines (in other words, 0 V is applied to the pn-junction diodes 7) in the half-selected cells 9b to 9e, no current flows in the cells.

The magnitude of a sense current 30 (see FIG. 77) flowing through the bit line BL4 and the cell 9a into the word line WL1 depends on the magnetic tunnel resistance of the selected cell 9a. In a sense circuit which is a constituent element of the bit-line control circuit 51, assuming that an average value of two current values estimated correspondingly to two states of the cell is defined as a reference current, the sense current is compared with the reference current. Then, the difference between the sense current and the reference current is amplified, to read data stored in the selected cell 9a.

Further, as shown by the waveform of the sense current 30 in FIG. 77, the sense current 30 has two kinds of current waveforms corresponding to two magnetic states of the MTJ 8.

After reading data, the voltages of the bit line BL4 and the word line WL1 are returned to the respective standby voltages, but the magnetic state of the memory cell 9a remains after the reading operation.

As discussed above, in writing data into the MRAM cell, the magnetic fields are generated by passing a current through the bit line and the word line. Since a magnetic field larger than the switching magnetic field of the soft ferromagnetic layer which is a constituent element of the cell has to be applied to the memory cell at the selected address, a relative large current is needed to flow. For this reason, the power consumption in writing disadvantageously becomes large.

Further, the background-art MRAM cell array has a problem that it takes long period of time to perform a batch erasing or a batch writing of data in a unit of memory block constituted of at least one memory cell array.

SUMMARY OF THE INVENTION

The present invention is directed to a magnetic memory device. According to a first aspect of the present invention, the magnetic memory device comprises a plurality of bit lines and a plurality of word lines, intersecting one another without being in contact to make up a matrix; a plurality of memory cells provided at intersections of the plurality of bit lines and the plurality of word lines, including at least one magnetic tunnel junction; a plurality of first switching means connected to first ends of the plurality of bit lines, being capable of switching the electrical connection between the first ends and a first power supply or a second power supply; and a plurality of second switching means connected to second ends of the plurality of bit lines, being capable of switching the electrical connection between the second ends and the first power supply or the second power supply.

According to a second aspect of the present invention, in the magnetic memory device of the first aspect, the first switching means have first MOS transistors and second MOS transistors of the same conductivity type whose first main electrodes connected to the first ends of the plurality of bit lines, respectively, and second main electrodes connected to the first power supply and the second power supply, respectively, and the second switching means have third MOS transistors and fourth MOS transistors of the same conductivity type whose first main electrodes connected to the second ends of the plurality of bit lines, respectively, and second main electrodes connected to the first power supply and the second power supply, respectively.

According to a third aspect of the present invention, in the magnetic memory device of the first aspect, the first switching means have first MOS transistors and second MOS transistors of different conductivity types whose first main electrodes connected to the first ends of the plurality of bit lines, respectively, and second main electrodes connected to the first power supply and the second power supply, respectively, and the second switching means have third MOS transistors and fourth MOS transistors of different conductivity types whose first main electrodes connected to the second ends of the plurality of bit lines, respectively, and second main electrodes connected to the first power supply and the second power supply, respectively.

According to a fourth aspect of the present invention, in the magnetic memory device of the third aspect further comprises: fifth MOS transistors connected between the first main electrodes of the first and second MOS transistors, having the same conductivity type as that of the second MOS transistors; and sixth MOS transistors connected between the first main electrodes of the third and fourth MOS transistors, having the same conductivity type as that of the fourth MOS transistors, and in the magnetic memory device of the fourth aspect, control electrodes of the fifth and sixth MOS transistors are connected to a third power supply supplying a predetermined voltage which always brings an ON state.

According to a fifth aspect of the present invention, the magnetic memory device comprises: a plurality of memory cell arrays consisting of a plurality of bit lines and a plurality of word lines, intersecting one another without being in contact to make up a matrix, and a plurality of memory cells provided at intersections of the plurality of bit lines and the plurality of word lines, including at least one magnetic tunnel junction; and at least one memory cell array group having a plurality of main word lines provided across the plurality of memory cell arrays, and a plurality of memory cell array selecting lines provided correspondingly to the plurality of memory cell arrays, and in the magnetic memory device of the fifth aspect, the plurality of word lines are connected to outputs of first combined logic gates which are provided at intersections of the plurality of main word lines and the plurality of memory cell array selecting lines, respectively, and inputs of the first combined logic gates are connected to one of the plurality of main word lines and one of the plurality of memory cell array selecting lines which intersect each other.

According to a sixth aspect of the present invention, in the magnetic memory device of the fifth aspect, the at least one memory cell array group includes a plurality of memory cell array groups, the magnetic memory device further comprises: a plurality of global word lines provided across the plurality of memory cell array groups; and a plurality of memory cell array group selecting lines provided correspondingly to the plurality of memory cell array groups, in the magnetic memory device of the sixth aspect, the plurality of main word lines are connected to outputs of second combined logic gates which are provided at intersections of the plurality of global word lines and the plurality of memory cell array group selecting lines, respectively, and inputs of the second combined logic gates are connected to one of the plurality of global word lines and one of the plurality of memory cell array group selecting lines which intersect each other.

According to a seventh aspect of the present invention, the magnetic memory device comprises: a plurality of memory cell arrays consisting of a plurality of bit lines and a plurality of word lines, intersecting one another without being in contact to make up a matrix, and a plurality of memory cells provided at intersections of the plurality of bit lines and the plurality of word lines, including at least one magnetic tunnel junction; and at least one memory cell array group having a plurality of main bit lines provided across the plurality of memory cell arrays, and a plurality of memory cell array selecting lines provided correspondingly to the plurality of memory cell arrays, and in the magnetic memory device of the seventh aspect, the plurality of bit lines are connected to outputs of first combined logic gates which are provided at intersections of the plurality of main bit lines and the plurality of memory cell array selecting lines, respectively, and inputs of the first combined logic gates are connected to one of the plurality of main bit lines and one of the plurality of memory cell array selecting lines which intersect each other.

According to an eighth aspect of the present invention, in the magnetic memory device of the seventh aspect, the at least one memory cell array group includes a plurality of memory cell array groups, the magnetic memory device further comprises: a plurality of global bit lines provided across the plurality of memory cell array groups; and a plurality of memory cell array group selecting lines provided correspondingly to the plurality of memory cell array groups, and in the magnetic memory device of the eighth aspect, the plurality of main bit lines are connected to outputs of second combined logic gates which are provided at intersections of the plurality of global bit lines and the plurality of memory cell array group selecting lines, respectively, and inputs of the second combined logic gates are connected to one of the plurality of global bit lines and one of the plurality of memory cell array group selecting lines which intersect each other.

According to a ninth aspect of the present invention, the magnetic memory device comprises: a memory cell array consisting of a plurality of bit lines and a plurality of word lines, intersecting one another without being in contact to make up a matrix, and a plurality of memory cells provided at intersections of the plurality of bit lines and the plurality of word lines, including at least one magnetic tunnel junction; and an inductor, and in the magnetic memory device of the ninth aspect, the at least one magnetic tunnel junction has a soft ferromagnetic layer whose direction of magnetization is changeable, and the inductor generates a magnetic field along an easy axis which is a direction for easy magnetization of the soft ferromagnetic layer.

According to a tenth aspect of the present invention, in the magnetic memory device of the ninth aspect, the at least one magnetic tunnel junction is provided so that the easy axis coincides with a direction of extension of the plurality of bit lines or the plurality of word lines, and the inductor has a coil-like shape, being so provided along the direction of extension of the plurality of bit lines or the plurality of word lines which coincides with the easy axis, as to surround the memory cell array.

According to an eleventh aspect of the present invention, the magnetic memory device comprises: at least one memory cell array consisting of a plurality of bit lines and a plurality of word lines, intersecting one another without being in contact to make up a matrix, and a plurality of memory cells provided at intersections of the plurality of bit lines and the plurality of word lines, including at least one magnetic tunnel junction; and at least one flash bit line and at least one flash word line both having a flat-plate shape, being so provided outside the plurality of bit lines and the plurality of word lines in the at least one memory cell array, as to cover a formation region of the plurality of bit lines and the plurality of word lines.

According to a twelfth aspect of the present invention, in the magnetic memory device of the eleventh aspect, the at least one memory cell array includes a plurality of memory cell arrays, the plurality of memory cell arrays are provided in matrix, the at least one flash bit line and at least one flash word line include a plurality of flash bit lines and a plurality of flash word lines, respectively, which are provided in matrix along the arrangement of the plurality of memory cell arrays.

According to a thirteenth aspect of the present invention, the magnetic memory device comprises: at least one semiconductor chip; a shield body made of conductive material, for containing the at least one semiconductor chip; a package made of resin, for containing the shield body; a bottom-surface substrate for closing an opening of the package to seal the package; a signal transmitting bump provided in an outer main surface of the bottom-surface substrate, for transmitting a signal between the at least one semiconductor chip and the outside; and a shielding bump so provided as to surround the signal transmitting bump, being electrically connected to the shield body, and in the magnetic memory device of the thirteenth aspect, the at least one semiconductor chip includes a magnetic memory chip comprising a memory cell array which has a plurality of memory cells including at least one magnetic tunnel junction.

According to a fourteenth aspect of the present invention, the magnetic memory device of the thirteenth aspect further comprises: a first stress relieving film provided inside and outside an opening edge of the shield body; and a second stress relieving film provided on an inner wall of the shield body.

According to a fifteenth aspect of the present invention, in the magnetic memory device of the fourteenth aspect, the at least one semiconductor chip further includes a circuit chip including peripheral circuits of the memory cell array, and the magnetic memory chip and the circuit chip are contained in the shield body, being vertically layered.

According to a sixteenth aspect of the present invention, in the magnetic memory device of the thirteenth aspect, the at least one magnetic tunnel junction has a soft ferromagnetic layer whose direction of magnetization is changeable, and the shield body is made of ferromagnetic material having magnetic permeability equal to or higher than that of the soft ferromagnetic layer.

According to a seventeenth aspect of the present invention, in the magnetic memory device of the thirteenth aspect, the shield body is made of antiferromagnetic material.

According to an eighteenth aspect of the present invention, in the magnetic memory device of the thirteenth aspect, the shield body is made of multilayer film consisting of ferromagnetic material and antiferromagnetic material.

According to a nineteenth aspect of the present invention, the magnetic memory device comprises: a plurality of bit lines and a plurality of word lines, intersecting one another without being in contact to make up a matrix; and a plurality of memory cells provided at intersections of the plurality of bit lines and the plurality of word lines, including at least one magnetic tunnel junction, and in the magnetic memory device of the nineteenth aspect, the plurality of memory cells are each provided between one of the plurality of bit lines and one of the plurality of word lines, the at least one magnetic tunnel junction has a soft ferromagnetic layer whose direction of magnetization is changeable, and the at least one magnetic tunnel junction is provided so that an easy axis which is a direction for easy magnetization of the soft ferromagnetic layer has an angle of 40 to 50 degrees with respect to the direction of extension of the plurality of bit lines and the plurality of word lines.

According to a twentieth aspect of the present invention, in the magnetic memory device of the nineteenth aspect, the magnetic tunnel junction has a rectangular shape in a plan view, whose side parallel to the easy axis is longer than a side perpendicular to the easy axis.

According to a twenty-first aspect of the present invention, the magnetic memory device comprises: a memory cell array consisting of a plurality of bit lines and a plurality of word lines, intersecting one another without being in contact to make up a matrix, and a plurality of memory cells provided at intersections of the plurality of bit lines and the plurality of word lines, including at least one magnetic tunnel junction; and at least one inductor and at least one capacitor provided at two ends, respectively, of at least one of the plurality of bit lines and the plurality of word lines, for conserving a current flowing in at least one of selected bit line and selected word line by LC resonant.

According to a twenty-second aspect of the present invention, in the magnetic memory device of the twenty-first aspect, the at least one inductor includes a plurality of inductors and the at least one capacitor includes a plurality of capacitors, the plurality of bit lines includes a plurality of bit line pairs of two bit lines, the plurality of inductors includes a plurality of first inductors so provided correspondingly to the plurality of bit line pairs, as to be electrically connected between the two bit lines, and the plurality of capacitors includes a plurality of first capacitors so provided at an end opposite to the end at which the plurality of inductors are provided, as to be electrically connected to the plurality of bit lines, respectively.

According to a twenty-third aspect of the present invention, in the magnetic memory device of the twenty-second aspect, the plurality of word lines includes a plurality of word line pairs of two word lines, the plurality of inductors includes a plurality of second inductors so provided correspondingly to the plurality of word line pairs, as to be electrically connected between the two word lines, and the plurality of capacitors includes a plurality of second capacitors so provided at an end opposite to the end at which the plurality of inductors are provided, as to be electrically connected to the plurality of word lines, respectively.

The present invention is also directed to a magnetic substrate. According to a twenty-fourth aspect of the present invention, the magnetic substrate at least has a multilayer film provided entirely on a main surface thereof, for making up at least one magnetic tunnel junction.

According to a twenty-fifth aspect of the present invention, in the magnetic substrate of the twenty-fourth, the multilayer film includes an antiferromagnetic layer, a ferromagnetic layer, a tunnel barrier layer made of insulative material and a soft ferromagnetic layer provided in this order as at least one magnetic tunnel junction.

According to a twenty-sixth aspect of the present invention, in the magnetic substrate of the twenty-fifth aspect, the multilayer film further includes a two-layered film consisting of a first conductivity type impurity layer and a second conductivity type impurity layer provided below the at least one magnetic tunnel junction, constituting a pn junction.

According to a twenty-seventh aspect of the present invention, in the magnetic substrate of the twenty-fourth aspect, the multilayer film is provided on a SOI substrate, the SOI substrate comprising: a substrate portion as a base; a buried oxide film provided on the substrate portion; and a SOI layer provided on the buried oxide film.

In the magnetic memory device of the first aspect of the present invention, since the first and second switching means allow the first and second ends of the bit line to be selectively connected to the first and second power supplies, it is possible to pass bidirectional currents through the bit line, changing the direction of magnetization of the magnetic tunnel junction, to allow writing and erasing of the data In the magnetic memory device of the second aspect of the present invention, since the first and second switching means are constituted of the first to fourth MOS transistors of the same conductivity type, the manufacturing process becomes simple.

In the magnetic memory device of the third aspect of the present invention, since the first switching means is constituted of the first and second MOS transistors of different conductivity types and the second switching means is constituted of the third and fourth MOS transistors of different conductivity types, it is possible to eliminate the necessity of applying a voltage not lower than the power supply voltage to the control electrodes of one of the first and second MOS transistors and one of the third and fourth MOS transistors in an ON state and therefore the load on the gate insulating film becomes smaller.

In the magnetic memory device of the fourth aspect of the present invention, since the fifth and sixth MOS transistors which are always in the ON state are provided between the first main electrodes of the first and second MOS transistors and between the first main electrodes of the third and fourth first MOS transistors, the stress voltage on the first main electrode of one of the first and second MOS transistors and the stress voltage on the first main electrode of one of the third and fourth MOS transistors are reduced, and the leak current caused by the stress voltages can be reduced, to thereby cut the power consumption.

In the magnetic memory device of the fifth aspect of the present invention, in a case of the magnetic memory device having a plurality of memory cell arrays, since a plurality of main word lines across a plurality of memory cell arrays and a word line across a single memory cell array are used to reduce the number of memory cells connected directly to one line, the capacitance of load can be reduced. As a result, the delay time caused by the capacitance of load becomes shorter and a high-speed access can be thereby achieved.

In the magnetic memory device of the sixth aspect of the present invention, in a case of the magnetic memory device comprising a plurality of memory cell array groups each having a plurality of memory cell arrays, since a word line across a single memory cell array, a plurality of main word lines across a plurality of memory cell arrays and a plurality of global word lines across a plurality of memory cell array groups are used to reduce the number of memory cells connected directly to one line, the capacitance of load can be reduced. As a result, the delay time caused by the capacitance of load becomes shorter and a high-speed access can be thereby achieved.

In the magnetic memory device of the seventh aspect of the present invention, in a case of the magnetic memory device having a plurality of memory cell arrays, since a plurality of main bit lines across a plurality of memory cell arrays and a bit line across a single memory cell array are used to reduce the number of memory cells connected directly to one line, the capacitance of load can be reduced. As a result, the delay time caused by the capacitance of load becomes shorter and a high-speed access can be thereby achieved.

In the magnetic memory device of the eighth aspect of the present invention, in a case of the magnetic memory device comprising a plurality of memory cell array groups each having a plurality of memory cell arrays, since a bit line across a single memory cell array, a plurality of main bit lines across a plurality of memory cell arrays and a plurality of global bit lines across a plurality of memory cell array groups are used to reduce the number of memory cells connected directly to one line, the capacitance of load can be reduced. As a result, the delay time caused by the capacitance of load becomes shorter and a high-speed access can be thereby achieved.

Since the magnetic memory device of the ninth aspect of the present invention comprises the inductor which generates a magnetic field in a direction along the easy axis which is a direction for easy magnetization of the soft ferromagnetic layer, the batch erasing or batch writing of data in a plurality of memory cells each having at least one magnetic tunnel junction can be achieved, thereby allowing a short-time processing.

In the magnetic memory device of the tenth aspect of the present invention, since the magnetic field can be efficiently generated by the coil-shaped inductor, the power supply can be cut in batch erasing or batch writing of data in a plurality of memory cells.

In the magnetic memory device of the eleventh aspect of the present invention, since the flash bit line and the flash word line are provided outside a plurality of bit lines and a plurality of word lines in at least one memory cell array and the batch erasing or batch writing of data in a plurality of memory cells each having at least one magnetic tunnel junction can be performed by passing a current through the flash bit line and the flash word line in a predetermined direction, a short-time processing can be achieved.

In the magnetic memory device of the twelfth aspect of the present invention, in a case of the magnetic memory device comprising a plurality of memory cell arrays provided in matrix, since the flash bit line and the flash word line are so provided along the arrangement of a plurality of memory cell arrays as to make up a matrix and the batch erasing or batch writing of data in a plurality of memory cells can be thereby performed, a short-time processing can be achieved.

In the magnetic memory device of the thirteenth aspect of the present invention, since at least one semiconductor chip is contained in the shield body made of conductive material, it becomes possible, in a plurality of memory cells including at least one magnetic tunnel junction, to prevent reverse of the direction of magnetization of the magnetic tunnel junction by the external magnetic field, which causes rewriting of data.

In the magnetic memory device of the fourteenth aspect of the present invention, since the first and second stress relieving films hold at least one semiconductor chip, it is possible to reduce application of an external stress on a plurality of semiconductor chips.

In the magnetic memory device of the fifteenth aspect of the present invention, since two kinds of chips, the magnetic memory chip and the circuit chip including peripheral circuits of the memory cell array, are provided, these chips are separately manufactured, thereby eliminating the necessity for considering the difference in formation temperature and allowing optimization of the respective formation temperatures. Further, the manufacturing processes proceed in parallel, thereby cutting the manufacturing time.

In the magnetic memory device of the sixteenth aspect of the present invention, since the shield body is made of ferromagnetic material having magnetic permeability equal to or higher than that of the soft ferromagnetic layer, it is possible to effectively block off the external magnetic field.

In the magnetic memory device of the seventeenth aspect of the present invention, since the shield body is made of antiferromagnetic material, it is possible to effectively block off the external magnetic field.

In the magnetic memory device of the eighteenth aspect of the present invention, since the shield body is made of multilayer film consisting of the ferromagnetic material and the antiferromagnetic material, it is possible to effectively block off the external magnetic field.

In the magnetic memory device of the nineteenth aspect of the present invention, since at least one magnetic tunnel junction is provided so that the easy axis which is a direction for easy magnetization of the soft ferromagnetic layer may have an angle of 40 to 45 degrees with respect to the direction of extension of a plurality of bit lines and a plurality of word lines, the direction of magnetization of the soft ferromagnetic layer can be surely reversed with a small amount of writing current and the power consumption in a writing operation can be thereby reduced.

In the magnetic memory device of the twentieth aspect of the present invention, since the magnetic tunnel junction has a rectangular shape whose side parallel to the easy axis is longer than the side perpendicular to the easy axis in the plan view, it becomes easy to define the easy axis by the anisotropy which depends on the shape and it becomes possible to prevent a change of easy axis.

Since the magnetic memory device of the twenty-first aspect of the present invention comprises at least one inductor and at least one capacitor for conserving a current flowing in at least one of the selected bit line and the selected word line by LC resonant, the writing current can be recycled and the power consumption in a writing operation can be thereby cut.

In the magnetic memory device of the twenty-second aspect of the present invention, a specific structure to recycle the writing current in the bit line can be obtained.

In the magnetic memory device of the twenty-third aspect of the present invention, a specific structure to recycle the writing current in the word line can be obtained.

Since the magnetic substrate of the twenty-fourth aspect of the present invention at least has the multilayer film provided entirely on a main surface thereof to make up at least one magnetic tunnel junction, in manufacturing the magnetic memory device comprising the memory cells having at least one magnetic tunnel junction, the manufacturing process can be omitted and the manufacturing cost can be cut as compared with a case where a simple semiconductor substrate is prepared and the multilayer film is formed on a main surface thereof.

In the twenty-fifth aspect of the present invention, it is possible to obtain a magnetic substrate suitable to manufacture the magnetic memory device comprising a memory cell having a single magnetic tunnel junction.

In the twenty-sixth aspect of the present invention, it is possible to obtain a semiconductor substrate suitable to manufacture the magnetic memory device comprising a memory cell having a pn-junction diode below the single magnetic tunnel junction.

In the magnetic substrate of the twenty-seventh aspect of the present invention, since at least one magnetic tunnel junction is formed on the SOI substrate which reduces parasitic capacitance of a MOSFET, the operation speed of the MOSFET becomes high and consequently that of the magnetic memory device can becomes high.

A first object of the present invention is to provide an MRAM capable of cutting power consumption in writing.

A second object of the present invention is to provide an MRAM capable of cutting time required for erasing and writing operations.

These and other objects, aspects and advantages of the present invention will become more apparent from the following detailed description of the present invention when taken in conjunction with the accompanying drawings.

BRIEF DESCRIPTION OF THE DRAWINGS

FIGS. 11 to 14 are views illustrating an operation of the MRAM cell in accordance with the first preferred embodiment of the present invention;

FIGS. 18 to 25 are views illustrating an operation of the MRAM cell in accordance with the first preferred embodiment of the present invention;

FIGS. 49 and 50 are cross sections each showing a structure of a semiconductor substrate in accordance with a sixth preferred embodiment of the present invention;

FIGS. 52 and 53 are block diagrams each showing a structure of an MRAM in accordance with a seventh preferred embodiment of the present invention;

FIG. 63 is a plan view illustrating a partial structure of the MRAM in accordance with the eighth preferred embodiment of the present invention;

FIGS. 64A and 64B are cross sections each illustrating a partial structure of the MRAM in accordance with the eighth preferred embodiment of the present invention;

DESCRIPTION OF THE PREFERRED EMBODIMENTS

<A. The First Preferred Embodiment>

Figure 1:
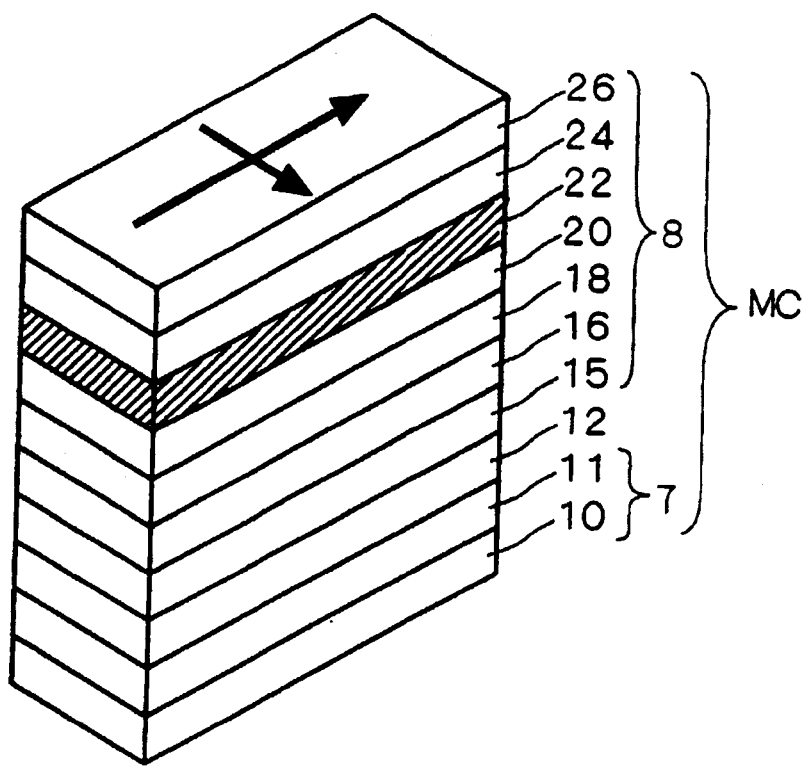
FIG. 1 is a perspective view showing a structure of an MRAM cell.

<Characteristic Feature of the First Preferred Embodiment>

An MRAM in accordance with the first preferred embodiment of the present invention is characteristically provided so that an easy axis of a soft ferromagnetic layer which is a constituent element of an MRAM cell may not be parallel to bit lines or word lines, and more specifically, may have an angle of 40 to 50 degrees with respect to the bit lines and the word lines.

<A-1. Device Structure>

<A-1-1. Structure of MRAM Cell>

First, a typical structure of an MRAM cell will be discussed, referring to FIG. 1. An MRAM cell MC shown in FIG. 1 has the pn-junction diode 7 constituted of the $n^+$ silicon layer 10 and the $p^+$ silicon layer 11 which are layered.

The tungsten stud 12 is formed above the pn-junction diode 7, and the pn-junction diode 7 is electrically connected to the magnetic tunnel junction (MTJ) 8 through the tungsten stud 12.

MTJ 8 has a layered structure consisting of the template layer 15 (having a film thickness of 10 nm) made of platinum (Pt), the initial ferromagnetic layer 16 (having a film thickness of 4 nm) made of permalloy of $Ni_{81}Fe_{19}$, the diamagnetic layer 18 (having a film thickness of 10 nm) made of $Mn_{54}Fe_{46}$, the ferromagnetic layer 20 (having a film thickness of 8 nm) made of permalloy of CoFe or $Ni_{81}Fe_{19}$ and having a fixed direction of magnetization, the tunnel barrier layer 22 made of $Al_2O_3$, the soft ferromagnetic layer 24 made of a multilayer film consisting of CoFe having a film thickness of 2 nm and $Ni_{81}Fe_{19}$ having a film thickness of 20 nm, and the contact layer 25 made of Pt from the bottom.

The MRAM cell MC including the MTJ 8 has a rectangular shape in a plan view, which is set so that a direction parallel to its longer side may be an easy axis in a direction of spin of electrons of the soft ferromagnetic layer 24. Further, a direction parallel to its shorter side is a hard axis which is a direction in which magnetization is difficult.

<A-1-2. Detailed Study of Background-Art MRAM Cell>

Figure 2:
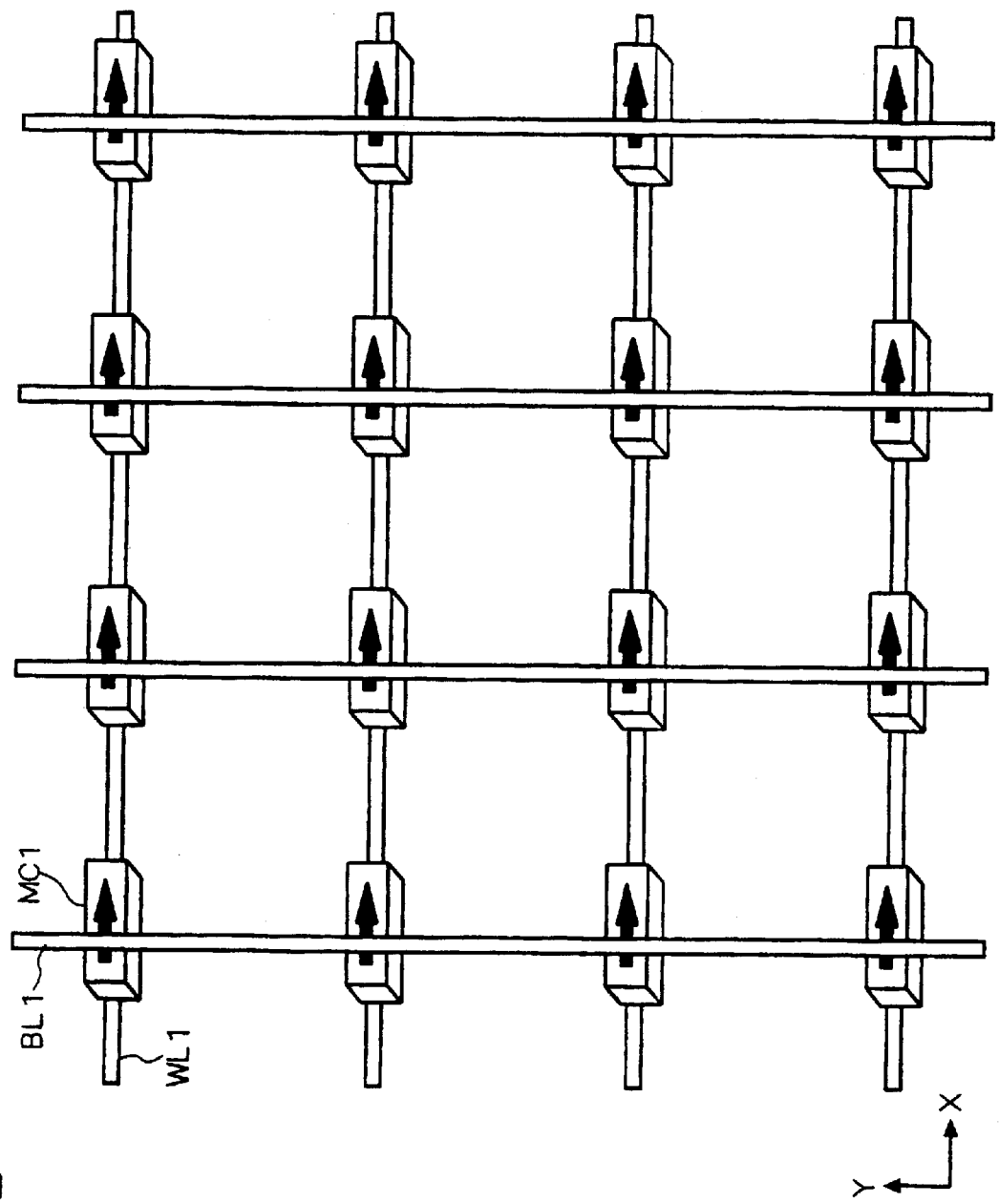
FIG. 2 is a view showing a structure of a general MRAM cell array.

FIG. 2 shows a planar structure of a background-art MRAM cell array. The MRAM cell MC1 is shown prospectively, for convenience of illustration.

As shown in FIG. 2, a plurality of word lines WL1 are provided in parallel to one another and a plurality of bit lines BL1 are provided in parallel to one another, intersecting the word lines WL1 thereabove.

MRAM cells (hereinafter, sometimes referred to simply as "cells") MC1 are formed at intersections of the word lines and the bit lines therebetween. The schematic arrow in each MRAM cell MC1 indicates a direction of spin of the soft ferromagnetic layer 24 in the MRAM cell MC1, and the direction of spins in all the MRAM cells MC1 are rightward on standby shown in FIG. 2. Further, the structure of the MRAM cell MC1 is the same as that of the memory cell MC of FIG. 1, for example, but is not limited to this structure.

Figure 3:
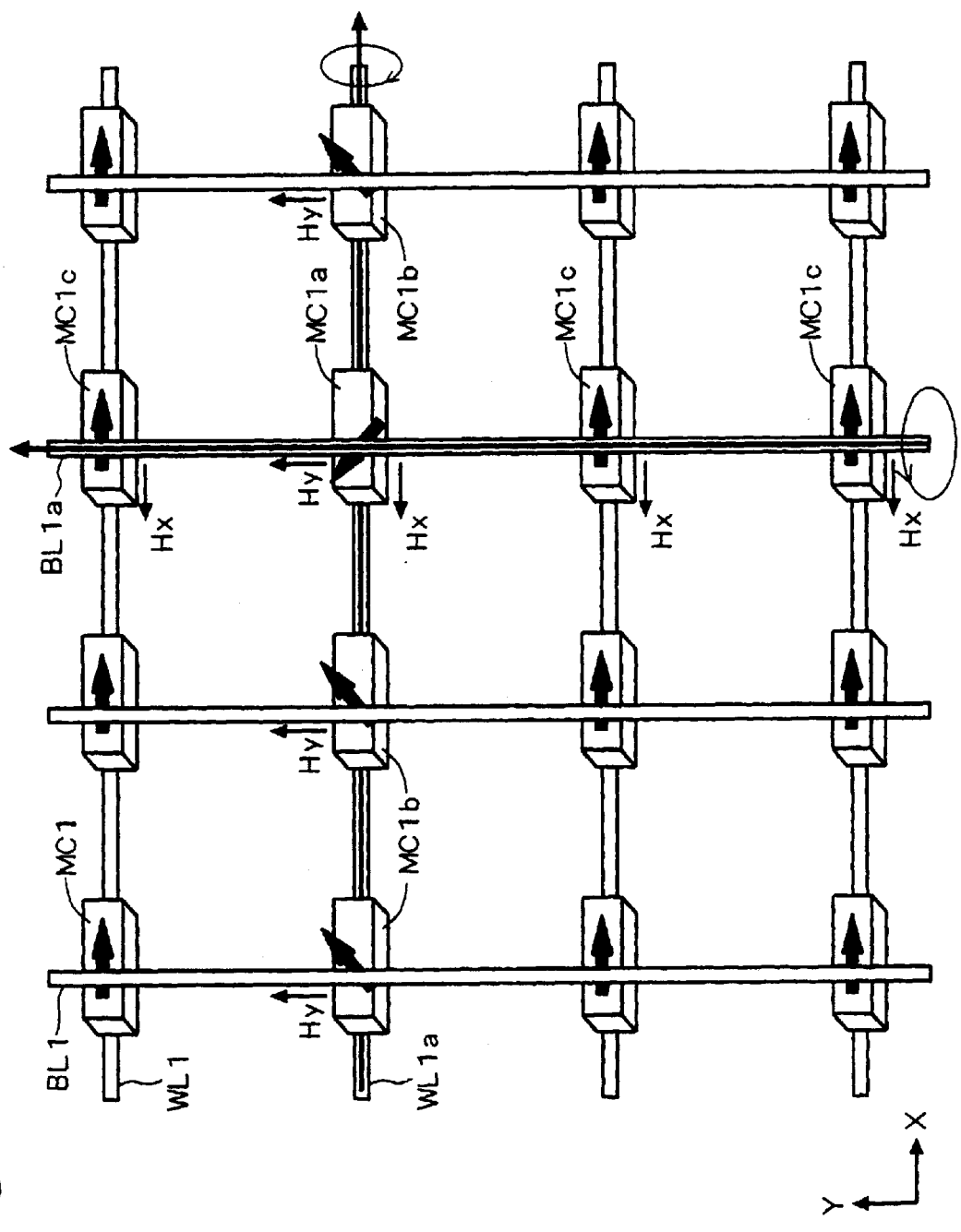
FIG. 3 is a view illustrating an operation of the general MRAM cell array.

FIG. 3 is a plan view schematically showing a writing state in the background-art MRAM cell array. Further, hereinafter, the MRAM cells MC1 are distinguished from one another, being represented by reference signs MC1a, MC1b and MC1c in some cases.

When a predetermined current is passed through a word line and a bit line for address selection (referred to as "selected word line" and "selected bit line") in a writing operation, magnetic fields are generated around the current according to the Biot-Savart's law.

It is assumed herein that the magnetic field generated around the bit line is Hx and the magnetic field generated around the word line is Hy. The selected word line and the selected bit line are represented by reference signs WL1a and BL1a, for convenience of illustration.

Further, a direction of current flow in FIG. 3 is vertically upward in the selected bit line BL1b and horizontally rightward in the selected word line WL1a.

When a predetermined current is passed through the selected word line WL1a and the selected bit line BL1b, the magnetic fields Hx and Hy are coupled at the intersection (selected address) of these lines. When the coupled magnetic field is given, the direction of magnetization of the soft ferromagnetic layer 24 in the MRAM cell MC1a located at the intersection of the selected word line WL1a and the selected bit lines BL1b rotates in a surface of the layer, to write data. In FIG. 3, the direction of spin of the MRAM cell MC1 a rotates not less than 90 degrees.

Then, by magnetizing anisotropy depending on the cell shape, since the spin is rotated along the direction of the easy axis, the spin eventually is reversed (rotates 180 degrees).

On the other hand, the current is set so that the spin of the soft ferromagnetic layer 24 may rotate but should not be reversed in half-selected MRAM cells 9 in which the current flows in only one of the word line and the bit line which are provided thereabove and therebelow, i.e., a plurality of MRAM cells MC1b shown in FIG. 3.

Further, in a plurality of half-selected cells MC1c with current flow in the selected bit line BL1a, since the magnetic field Hx generated around the selected bit line BL1a has a direction which is the same as that of the easy axis, rotation large enough to be shown in FIG. 3 can not be made only by the magnetic field Hx.

Figure 4:
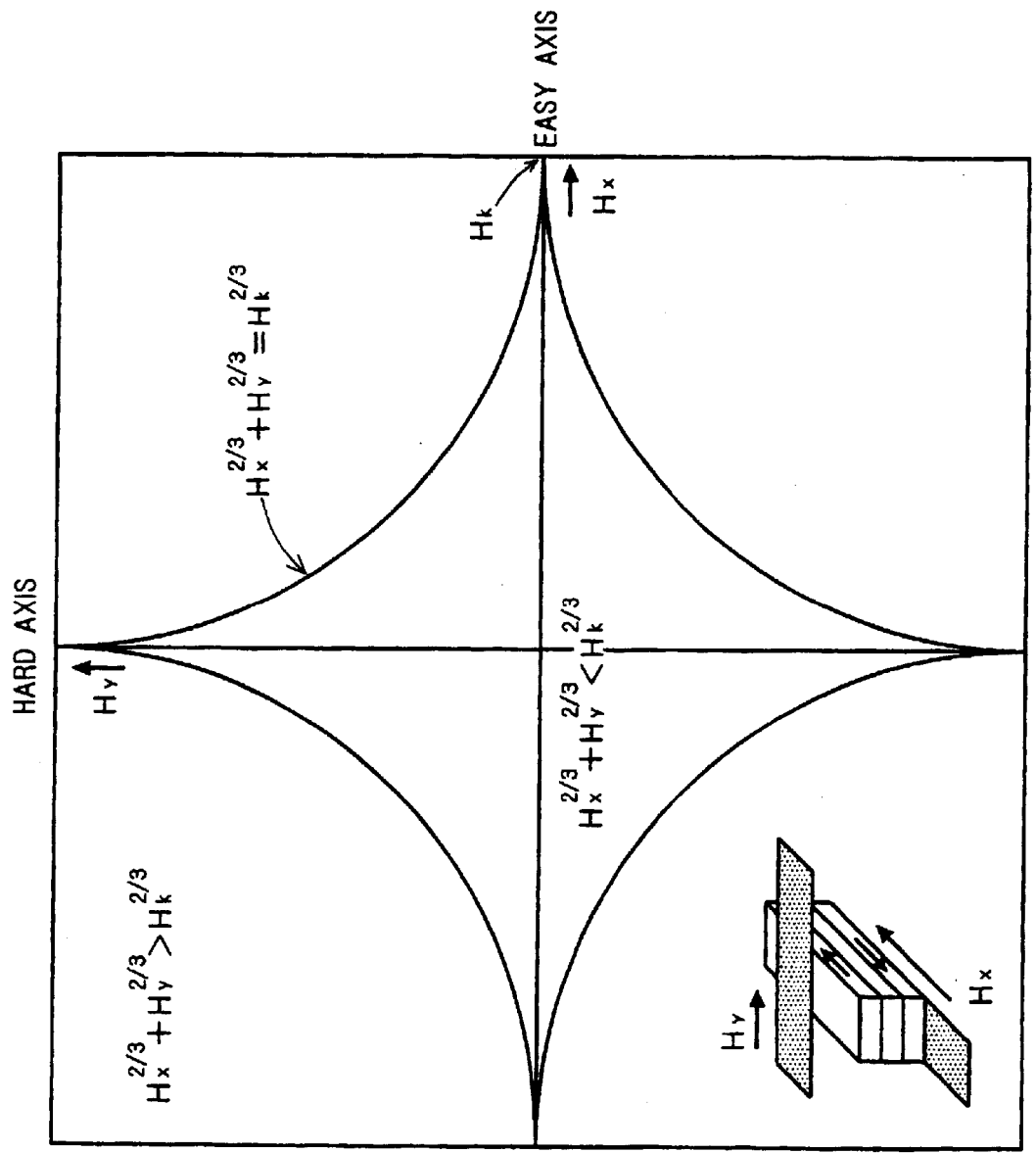
FIG. 4 is a view showing a relation of magnetic fields for reversing a spin.

FIG. 4 shows a relation of the above three magnetic fields in a case where a magnetic field Hk required to reverse the spin is generated by coupling the magnetic fields Hx and Hy. In FIG. 4, the horizontal axis indicates the magnetic field Hx and the vertical axis indicates the magnetic field Hy. The relation is expressed by the following equation:

$$H_x^{2/3} + H_y^{2/3} = H_k^{2/3} \tag{3}$$

The curve in FIG. 4 is termed "asteroid curve". When the magnetic field Hk is expressed by Eq. (4) as below, the spin of the soft ferromagnetic layer 24 is reversed.

$$H_x^{2/3} + H_y^{2/3} > H_k^{2/3} \tag{4}$$

Further, the magnetic field Hk is expressed by Eq. (5) as below, the direction of spin of the soft ferromagnetic layer 24 is kept.

$$H_x^{2/3} + H_y^{2/3} < H_k^{2/3} \tag{5}$$

A magnetic flux density B generated around a stationary current I is expressed by Eq. (6) as below according to the Biot-Savart's law:

$$B(R) = \frac{\mu}{2\pi} \cdot \frac{I}{R} \tag{6}$$

where $\mu$ is magnetic permeability and R is a distance from the current I.

Further, a relation of the magnetic field H and the magnetic flux density B is expressed by Eq. (7) as below:

$$B = \mu H \tag{7}$$

Accordingly, Eq. (8) as below is true.

$$H(R) = \frac{1}{2\pi} \cdot \frac{I}{R} \tag{8}$$

It can be seen from Eq. (8) that the magnetic field H is proportional to the stationary current I. Therefore, in order to cut the power consumption in writing, it is desirable to reduce the magnetic field Hk required to reverse the spin, in other words, to make Hx+Hy as small as possible.

The present inventors has achieved a structure of MRAM cell array which is capable of reducing the magnetic field Hk, based on study of the above background art.

<A-1-3. Structure and Operation of MRAM Cell Array>

Figure 5:
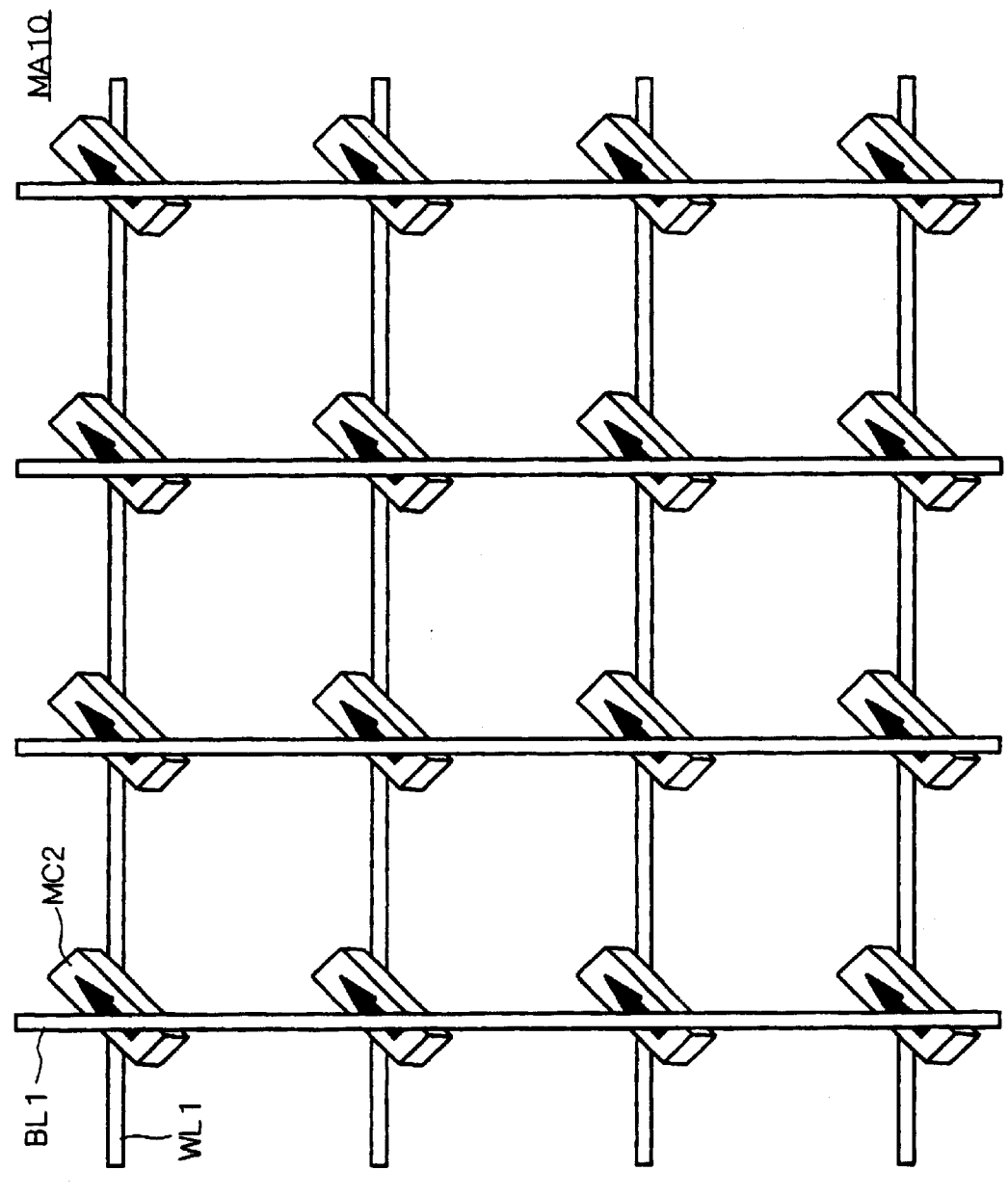
FIG. 5 is a view showing a structure of an MRAM cell array in accordance with a first preferred embodiment of the present invention.

FIG. 5 showing a plane structure of an MRAM cell array MA10 in accordance with the first preferred embodiment of the present invention. As shown in FIG. 5, a plurality of word lines WL1 are provided in parallel to one another and a plurality of bit lines BL1 are provided in parallel to one another, intersecting the word lines WL1 thereabove.

MRAM cells MC2 are formed at intersections of the word lines and the bit lines therebetween. Further, the structure of the MRAM cell MC2 is the same as that of the memory cell MC of FIG. 1, for example, but is not limited to this structure.

As shown in FIG. 5, the MRAM cells MC2 are provided so that the easy axis may have an angle of 45 degrees with respect to the bit lines and the word lines. Further, in this example, since the MRAM cells MC2 are provided to have an angle of 45 degrees diagonally right upward with respect to the word lines WL1, the direction of spins of all the MRAM cells MC2 are diagonally right upward on standby shown in FIG. 5.

Figure 6:
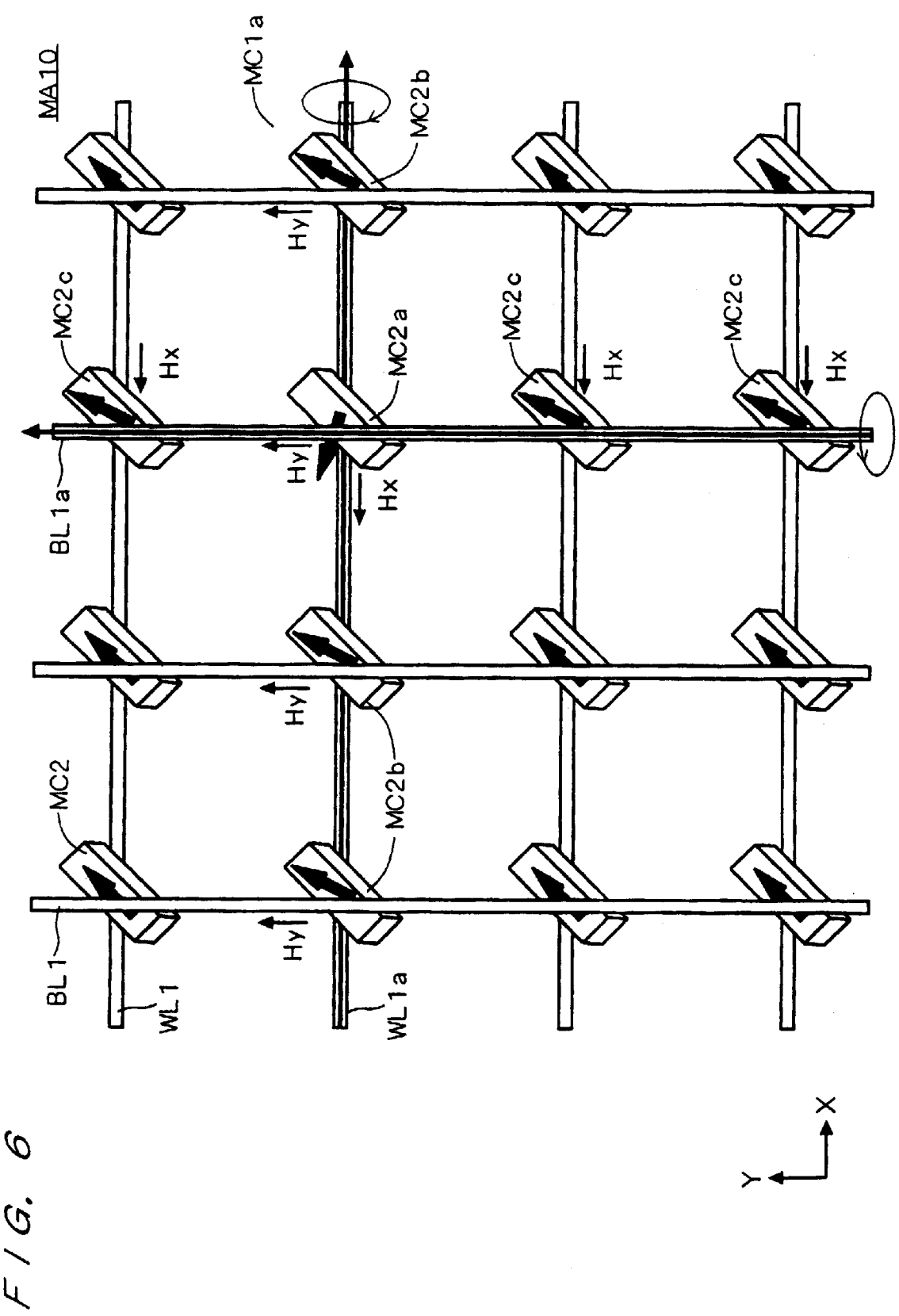
FIG. 6 is a view illustrating an operation of the MRAM cell array in accordance with the first preferred embodiment of the present invention.

FIG. 6 is a plan view schematically showing a writing state of the MRAM cell array MA10. Further, hereinafter, the MRAM cells MC2 are distinguished from one another, being represented by reference signs MC2a, MC2b and MC2c in some cases.

When a predetermined current is passed through the selected word line WL1a and the selected bit line BL1b, the magnetic fields Hx and Hy are coupled at the intersection (selected address) of these lines. Further, a direction of current flow in FIG. 6 is vertically upward in the selected bit line BL1b and horizontally rightward in the selected word line WL1a.

When the coupled magnetic field is given, the direction of magnetization of the soft ferromagnetic layer 24 in the MRAM cell MC2a located at the intersection of the selected word line WL1a and the selected bit line BL1b rotates in a surface of the layer, to write data. In FIG. 6, the direction of spin of the MRAM cell MC2a rotates not less than 90 degrees.

Then, by magnetizing anisotropy depending on the cell shape, since the spin is rotated along the direction of the easy axis, the spin is eventually reversed (rotates 180 degrees).

On the other hand, the current is set so that the spin of the soft ferromagnetic layer 24 may rotate but should not be reversed in the half-selected MRAM cells in which the current flows in only one of the word line and the bit line which are provided thereabove and therebelow, i.e., a plurality of MRAM cells MC2b and MC2c shown in FIG. 6.

In a plurality of half-selected cells MC2c with current flow in the selected bit line BL1a, since the magnetic field Hx generated around the selected bit line BL1a intersects at an angle of 45 degrees with respect to the direction of the easy axis, the spin of the soft ferromagnetic layer 24 rotates as shown in FIG. 6, but it is possible to both reverse the spin and avoid the reverse of the spin by controlling the magnitudes of the currents. The same applies to a plurality of half-selected cells MC2b with current flow in the selected word line WL1a.

<A-1-4. Other Structure>

Figure 7:
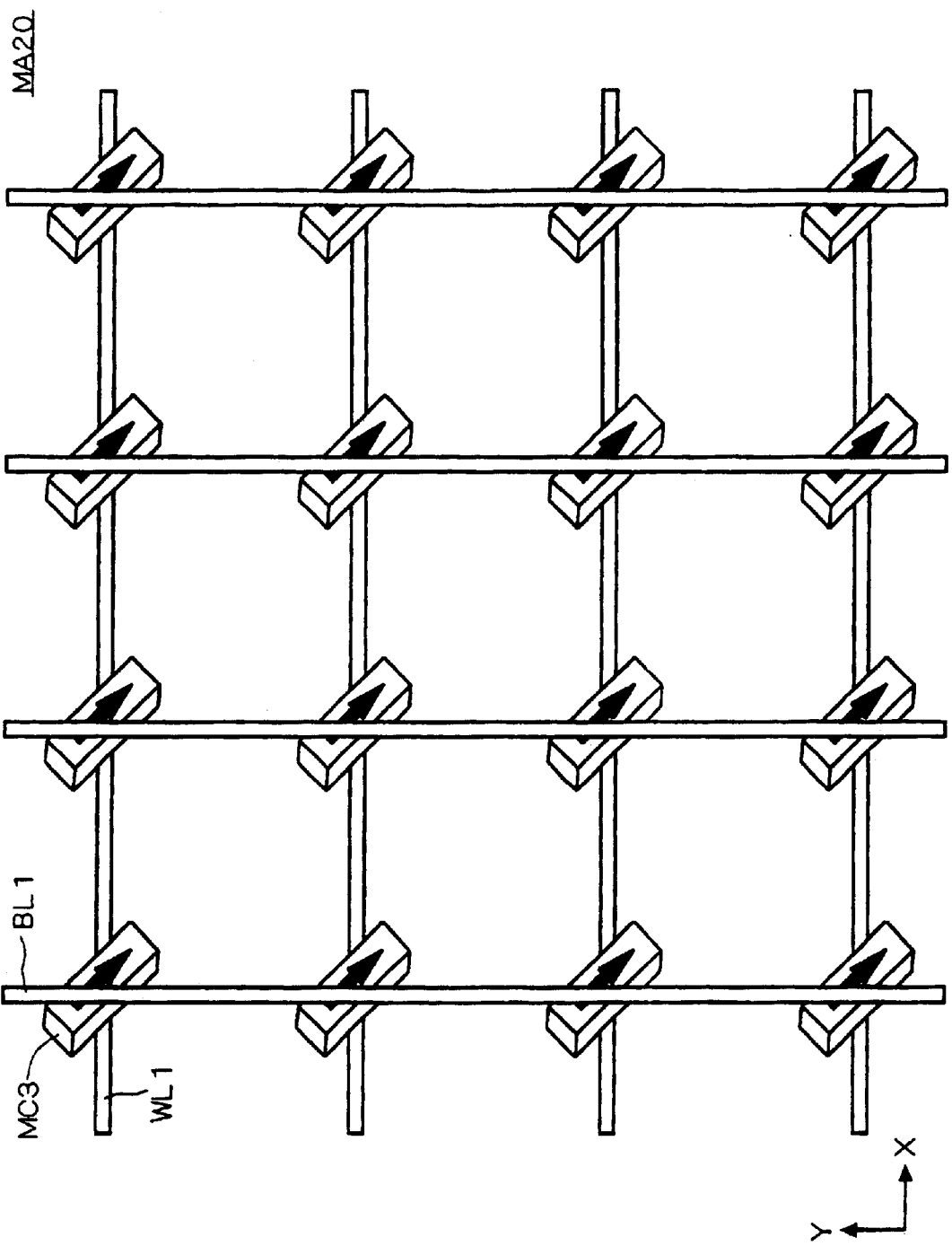
FIG. 7 is a view showing a structure of the MRAM cell array in accordance with the first preferred embodiment of the present invention.

FIG. 7 shows a plane structure of the MRAM cell array MA20 as other exemplary structure in accordance with the first preferred embodiment of the present invention. As shown in FIG. 7, a plurality of word lines WL1 are provided in parallel to one another and a plurality of bit lines BL1 are provided in parallel to one another, intersecting the word lines WL1 thereabove.

MRAM cells MC3 are formed at intersections of the word lines and the bit lines therebetween. Further, the structure of the MRAM cell MC3 is the same as that of the memory cell MC of FIG. 1, for example, but is not limited to this structure.

As shown in FIG. 7, the MRAM cells MC3 are provided so that the easy axis may have an angle of 45 degrees with respect to the bit lines and the word lines. Further, in this example, since the MRAM cells MC3 are provided to have an angle of 45 degrees diagonally right downward with respect to the word lines WL1, the direction of spins of all the MRAM cells MC3 are diagonally right downward on standby shown in FIG. 7.

Figure 8:
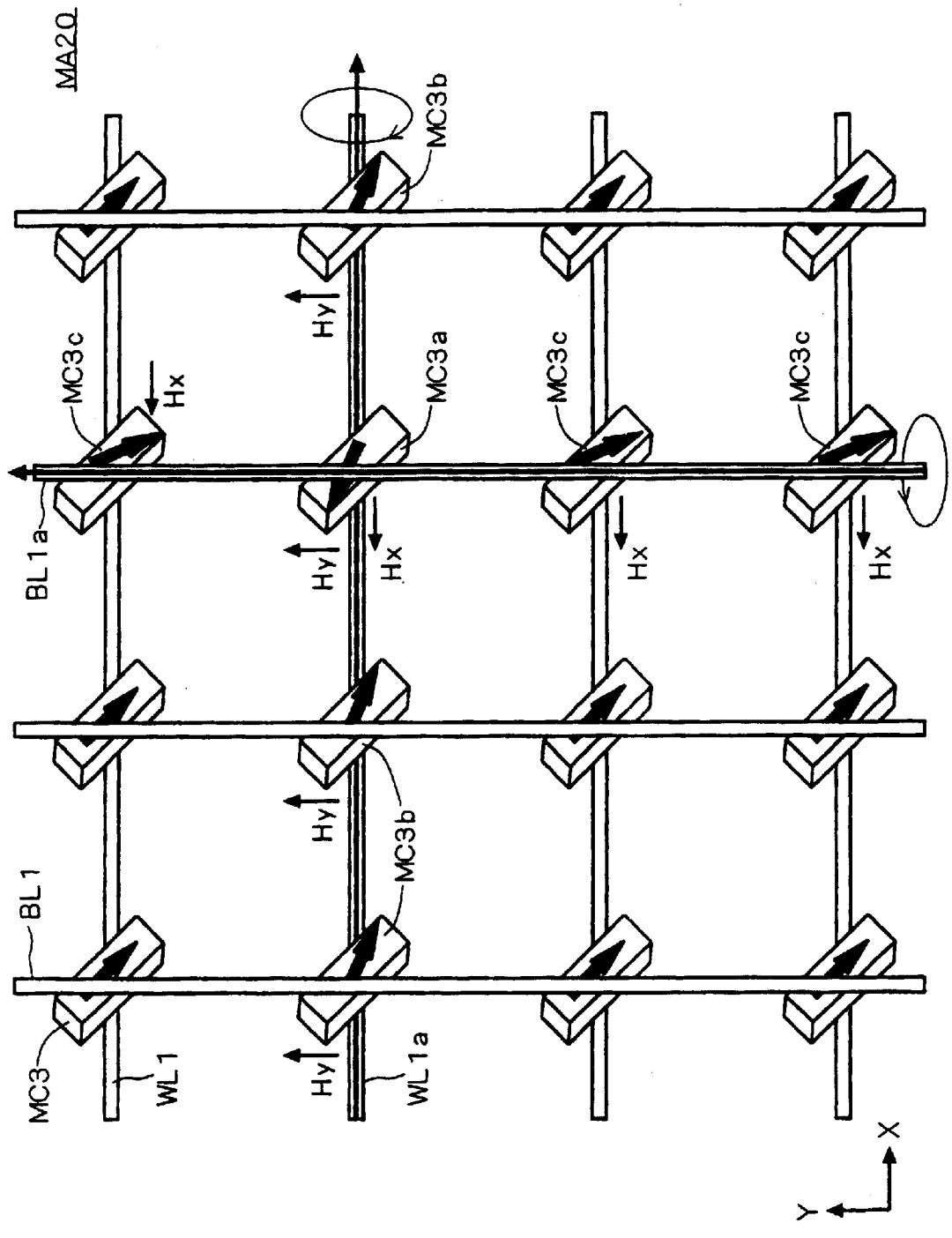
FIG. 8 is a view illustrating an operation of the MRAM cell array in accordance with the first preferred embodiment of the present invention.

FIG. 8 is a plan view schematically showing a writing state of the MRAM cell array MA20. Further, hereinafter, the MRAM cells MC3 are distinguished from one another, being represented by reference signs MC3a, MC3b and MC3c in some cases.

When a predetermined current is passed through the selected word line WL1a and the selected bit line BL1a, the magnetic fields Hx and Hy are coupled at the intersection (selected address) of these lines.

A direction of current flow in FIG. 8 is vertically upward in the selected bit line BL1a and horizontally rightward in the selected word line WL1a.

When the coupled magnetic field is given, the direction of magnetization of the soft ferromagnetic layer 24 in the MRAM cell MC3a provided at the intersection of the selected word line WL1a and the selected bit line BL1a rotates in a surface of the layer, to write data. In FIG. 8, the direction of spin of the MRAM cell MC3a rotates not less than 90 degrees.

Then, by magnetizing anisotropy depending on the cell shape, since the spin is rotated along the direction of the easy axis, the spin is eventually reversed (rotates 180 degrees).

On the other hand, the current is set so that the spin of the soft ferromagnetic layer 24 may rotate but should not be reversed in the half-selected MRAM cells i.e., a plurality of MC3b and MC3c shown in FIG. 8.

<A-1-5. Optimization in Direction of Arranging MRAM Cell>

Next, optimization in direction of arranging the MRAM cells will be discussed, referring to FIGS. 9 to 25.

First discussion will be made on a case of reversing the direction of spin by the coupled magnetic field Hk.

Figure 9:
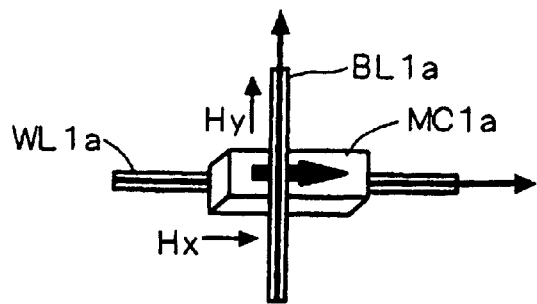
FIGS. 9 and 10 are views illustrating an operation of the general MRAM cell.
Figure 10:
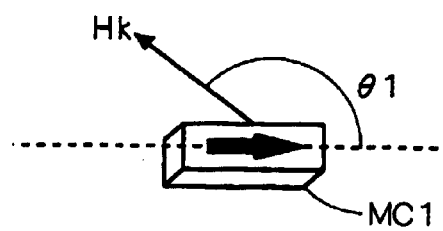

FIGS. 9 and 10 schematically show a relation of a direction of spin of the MRAM cell MC1a at the selected address in writing in the background-art MRAM cell array shown in FIG. 2 and a direction of the coupled magnetic field Hk to reverse the spin.

In FIGS. 9 and 10, assuming that the magnitudes of the magnetic fields Hx and Hy are the same, the angle of the spin and the coupled magnetic field Hk is $\theta_1=135$ degrees.

Figure 11:
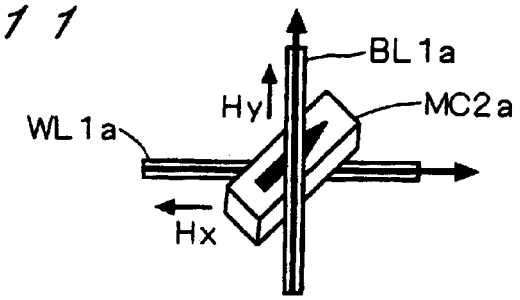
Figure 12:
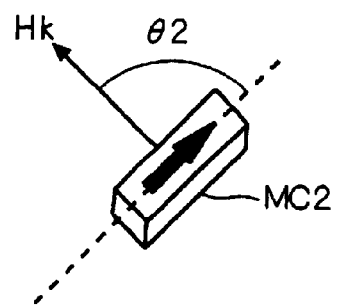

Further, FIGS. 11 and 12 schematically show a relation of a direction of spin of the MRAM cell MC2a at the selected address in writing in the MRAM cell array MA10 shown in FIG. 5 and a direction of the coupled magnetic field Hk to reverse the spin.

In FIGS. 11 and 12, assuming that the magnitudes of the magnetic fields Hx and Hy are the same, the angle of the spin and the coupled magnetic field Hk is $\theta_2=90$ degrees.

Furthermore, FIGS. 13 and 14 schematically show a relation of a direction of spin of the MRAM cell MC3a at the selected address in writing in the MRAM cell array MA20 shown in FIG. 7 and a direction of the coupled magnetic field Hk to reverse the spin.

In FIGS. 13 and 14, assuming that the magnitudes of the magnetic fields Hx and Hy are the same, the angle of the spin and the coupled magnetic field Hk is $\theta_3=180$ degrees.

Figure 15:
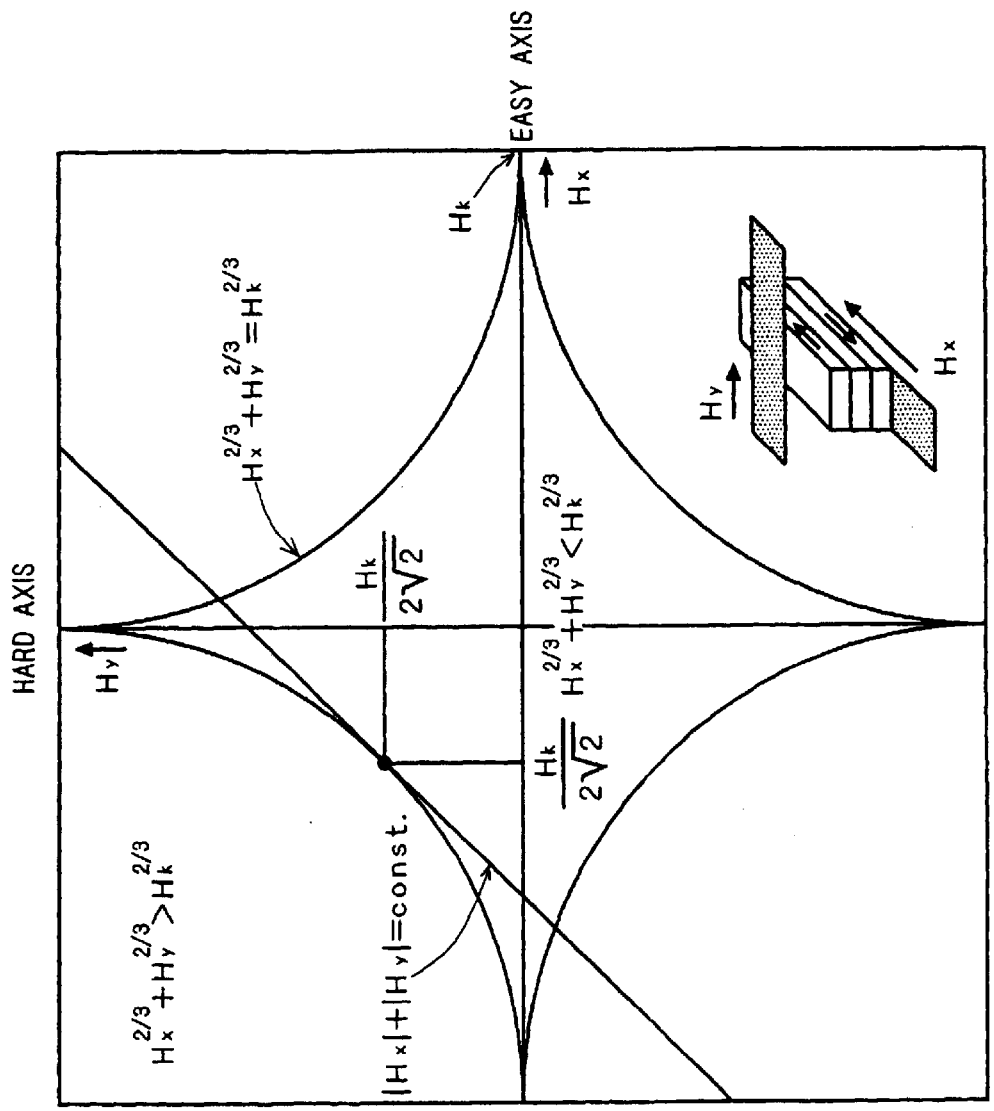
FIG. 15 is a view showing a relation of magnetic fields for reversing a spin.

FIG. 15 shows a relation of the coupled magnetic field Hk and the magnetic fields Hx and Hy. This relation is the same as that shown in FIG. 4 as the asteroid curve, and when the magnetic fields Hx and Hy on the asteroid curve are obtained under the condition that $|Hx|+|Hy|$=constant, i.e., a constant writing current, the relation, $Hx=Hy=Hk/2\sqrt{2}$ holds.

Based on this relation, in the background-art MRAM cell array shown in FIGS. 9 and 10, the spin is rotated up to about 135 degrees by the coupled magnetic field and from this point to 180 degrees, the spin is rotated by using magnetizing anisotropy depending on the shape.

On the other hand, in the MRAM cell array MA10 of FIG. 12, the spin is rotated by about 90 degrees by the coupled magnetic field of the same magnitude. Accordingly, it is in a critical state of whether the spin is reversed or not even if the magnetizing anisotropy depending on the shape is used. Therefore, when the structure of the MRAM cell array MA10 is adopted, it is desirable that the magnetic field Hx should be made slightly larger in magnitude than the magnetic field Hy and the rotation angle $\theta_2$ of the spin should be set to not less than 90 degrees.

Further, in the MRAM cell array MA20 of FIGS. 13 and 14, since the spin is rotated 180 degrees by the coupled magnetic field of the same magnitude, the spin is surely reversed.

Next, on a case where the direction of spin is kept even when the coupled magnetic field Hk is given, FIGS. 16 to 21 each schematically show a relation between a direction of spin and a direction of the coupled magnetic field Hk to keep the direction of spin. Further, since FIGS. 16 to 21 correspond to FIGS. 9 to 14, redundant description will be omitted.

Figure 16:
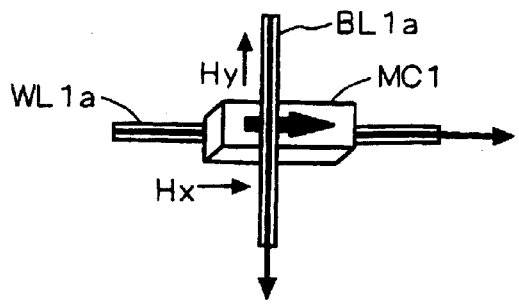
FIGS. 16 and 17 are views illustrating an operation of the general MRAM cell.
Figure 17:
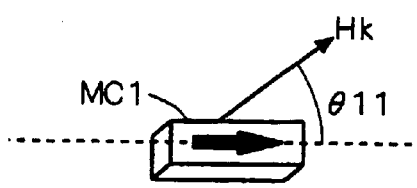

In FIGS. 16 and 17, assuming that the magnitudes of the magnetic fields Hx and Hy are the same, the angle of the spin and the coupled magnetic field Hk is $\theta_{11}$=45 degrees.

Figure 18:
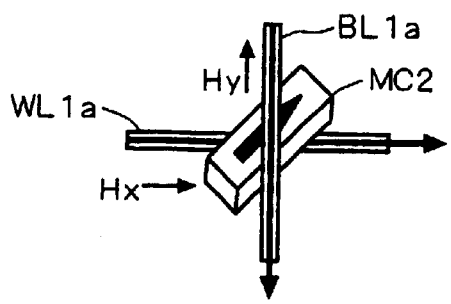
Figure 19:
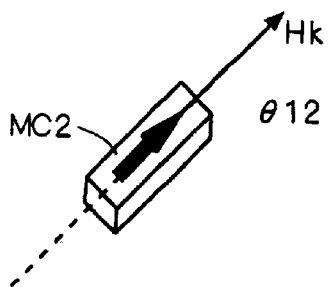

In FIGS. 18 and 19, assuming that the magnitudes of the magnetic fields Hx and Hy are the same, the angle of the spin and the coupled magnetic field Hk is $\theta_{12}$=0 degree.

Figure 20:
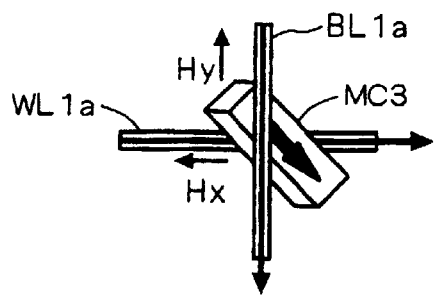
Figure 21:
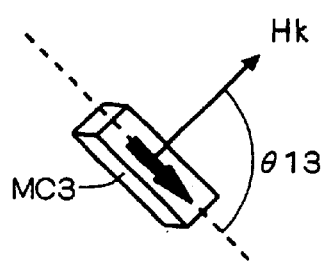

In FIGS. 20 and 21, assuming that the magnitudes of the magnetic fields Hx and Hy are the same, the angle of the spin and the coupled magnetic field Hk is $\theta_{13}$=90 degrees.

Accordingly, in writing, the direction of spin is almost kept in the background-art MRAM cell array of FIG. 16 and the direction of spin is completely kept in the MRAM cell array MA10 of FIG. 18, and the MRAM cell array MA20 of FIG. 20, which is in the critical state of whether the spin is reversed or not, is not desirable.

It is desirable, from the above study, to adopt the structure of the MRAM cell array MA20 of FIGS. 13 and 20 in consideration of the direction of current flowing in the bit line and the word line. This structure will be discussed, referring to FIGS. 22 to 25.

Figure 22:
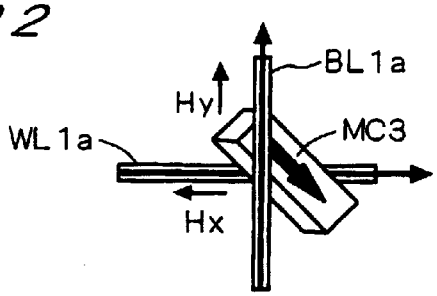
Figure 23:
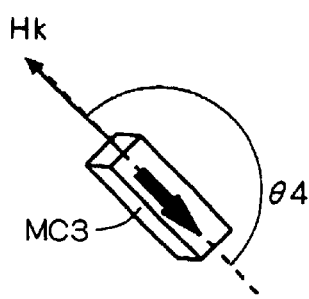

FIGS. 22 and 23 schematically show a relation between the direction of spin of the MRAM cell MC3a at the selected address in writing and the direction of the coupled magnetic field Hk to reverse the spin in a case where the current flows, like in FIG. 8, vertically upward in the selected bit line BL1a and horizontally rightward in the selected word line WL1a in the structure of the MRAM cell array MA20.

In FIGS. 22 and 23, assuming that the magnitudes of the magnetic fields Hx and Hy are the same, the angle of the spin and the coupled magnetic field Hk is $\theta_4$=180 degrees, and therefore this structure is suitable for a case of data writing by revering the direction of spin.

FIGS. 24 and 25 schematically show a relation between the direction of spin of the MRAM cell MC3a at the selected address in writing and the direction of the coupled magnetic field Hk to keep the direction of spin in a case where the current flows vertically downward in the selected bit line BL1a and horizontally leftward in the selected word line WL1a in the structure of the MRAM cell array MA20.

Further, as compared with the case of FIG. 22, the direction of current flowing in the bit line and the word line is changed.

In FIGS. 24 and 25, assuming that the magnitudes of the magnetic fields Hx and Hy are the same, the angle of the spin and the coupled magnetic field Hk is $\theta_5$=0 degree, and therefore this structure is suitable for a case of data writing by keeping the direction of spin.

Further, both the structures of FIGS. 22 and 24 have an advantage that an error in writing becomes smaller than in the background art since the direction of the coupled magnetic field and the easy axis coincide with each other.

<A-2. Action and Effect>

As discussed above, in the MRAM of the first preferred embodiment of the present invention, by arranging the MRAM cell so that the easy axis of the soft ferromagnetic layer 24 which is a constituent element of the MRAM cell may have an angle of 40 to 50 degrees, preferably 45 degrees, diagonally with respect to the bit line and the word line, the direction of spin of the MRAM cell at the selected address can be surely reversed with a small writing current, and therefore the power consumption in writing can be cut.

Further, by changing the direction of current flowing in the bit line and the word line between the cases where the direction of spin of the MRAM cell at the selected address is reversed and where the direction of spin is kept, making the direction of the coupled magnetic field and the easy axis coincident, the error in writing can be reduced.

<B. The Second Preferred Embodiment>

<Characteristic Feature of the Second Preferred Embodiment>

An MRAM in accordance with the second preferred embodiment of the present invention comprises a pair of read/write control circuits at both ends of the bit line and the word line. The read/write control circuit includes a first MOS transistor connecting the bit line and a power supply voltage $V_{DD}$ and a second MOS transistor connecting the bit line and a ground voltage $V_{SS}$ and has a function of carrying bidirectional currents to the bit line in writing and a function of outputting a voltage caused by a sense current to a sense amplifier in reading.

<B-1. Device Structure>

<B-1-1. Overall Structure of MRAM>

Figure 26:
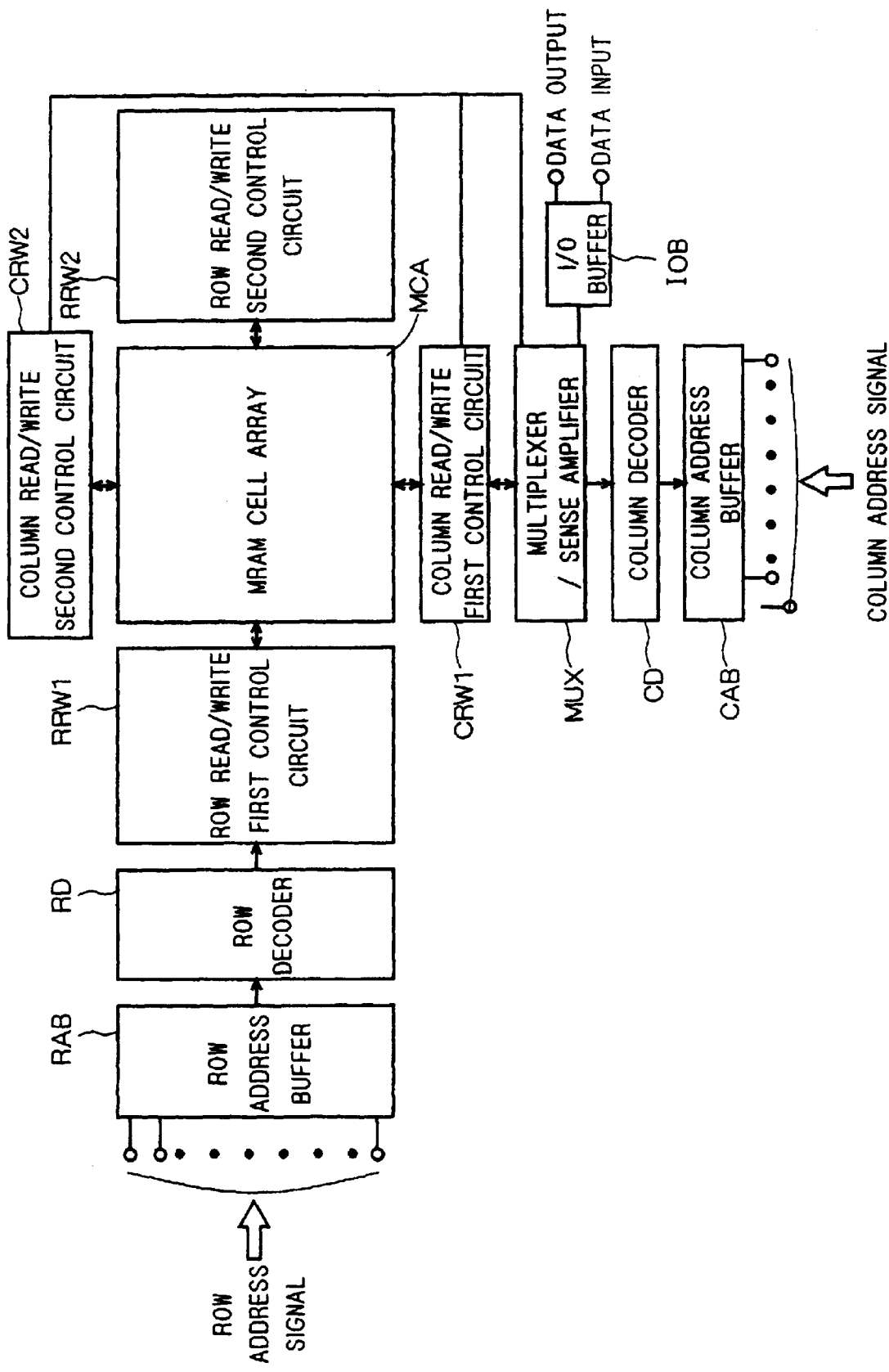
FIG. 26 is a block diagram showing a constitution of an MRAM in accordance with a second preferred embodiment of the present invention.

FIG. 26 is a block diagram showing a constitution of the MRAM in accordance with the second preferred embodiment of the present invention, showing an MRAM cell array MCA and peripheral circuits thereof.

In FIG. 26, a column address buffer CAB receives a column address signal, reversing or amplifying the signal, and outputs it to a column decoder CD.

The column decoder CD decodes the column address signal and outputs the decoded signal to a multiplexer MUX.

The multiplexer MUX selects a bit line according to the decoded column address signal. At the same time, the multiplexer MUX outputs the signal to a column read/write first control circuit CRWI connected to one end of the bit line, and the column read/write first control circuit CRWI applies a voltage and a current according to whether reading or writing to the selected bit line.

A row address buffer RAB receives a row address signal, reversing or amplifying the signal, and outputs it to row decoder RD.

The row decoder RD decodes the row address signal and selects a word line according to the decoded row address signal. At the same time, the row decoder RD outputs the signal to a row read/write first control circuit RRW1 connected to one end of the word line, and the row read/write first control circuit RRW1 applies a voltage and a current according to whether reading or writing to the selected word line.

Further, data read out from the MRAM cell array MCA or data to be written into the MRAM cell array MCA are outputted to or inputted from the outside through an I/O buffer.

Furthermore, a column read/write second control circuit CRW2 is connected to the other end of the bit line and a row read/write second control circuit RRW2 is connected to the other end of the word line.

<B-1-2. Detailed Structure of MRAM>

Figure 27:
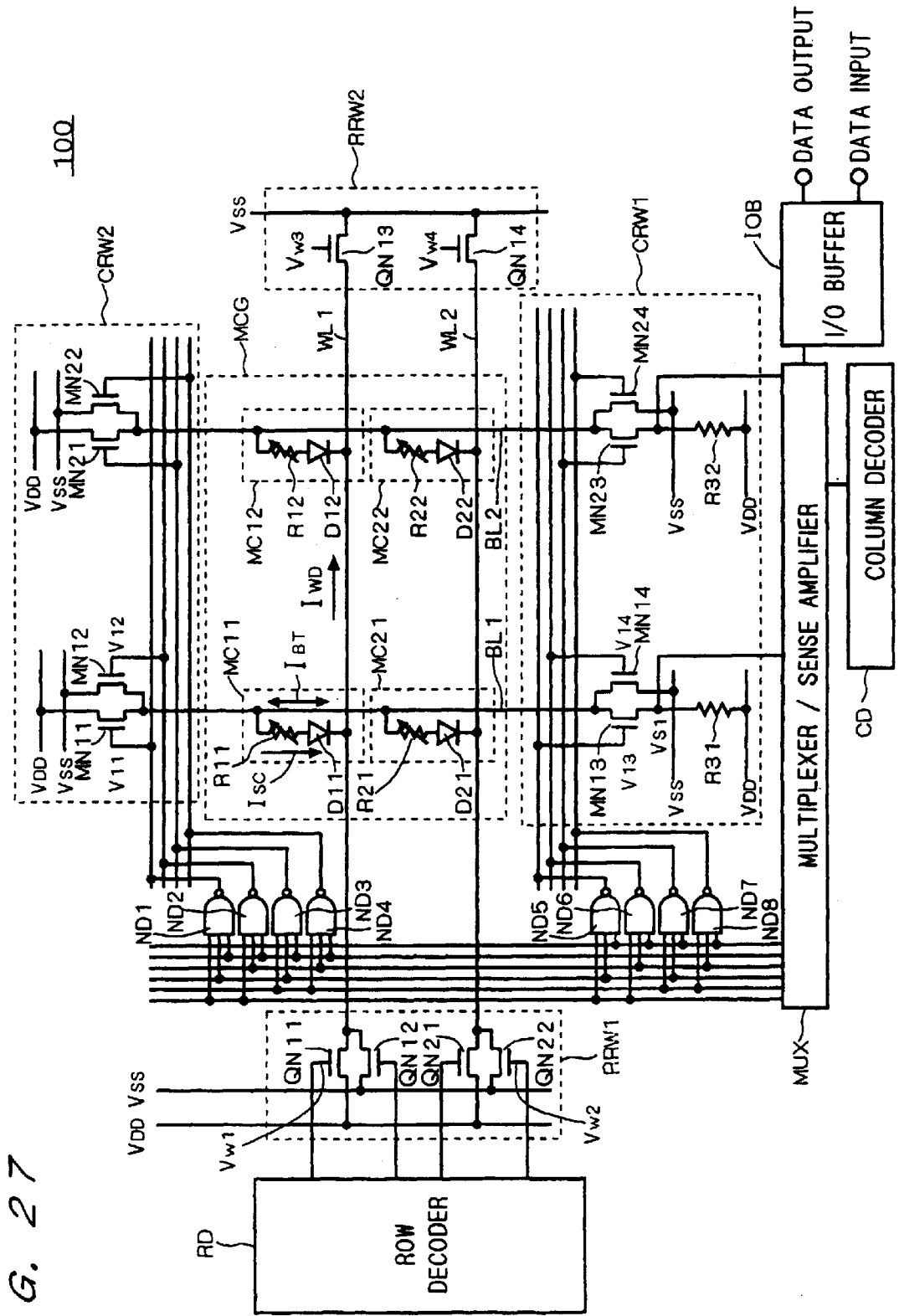
FIG. 27 is a circuit diagram showing a configuration of the MRAM in accordance with the second preferred embodiment of the present invention.

FIG. 27 is a circuit diagram showing a configuration of the MRAM of FIG. 26, where the multiplexer MUX, the column decoder CD, the row decoder RD and the I/O buffer IOB are omitted. Further, the column address buffer CAB and the row address buffer RAB are omitted in this figure, for convenience of illustration. Furthermore, the MRAM of FIG. 27 is referred to as MRAM 100.

In FIG. 27 the MRAM cell array MCA has MRAM cells MC11, MC21, MC12 and MC22. Each MRAM cell has a structure in which a magnetic tunnel junction (MTJ) and a pn-junction diode are connected in series, and the MTJ is represented as a variable resistance and a series connected circuit consisting of the MTJ and the pn-junction diode is represented as an equivalent circuit.

The reason why the MTJ is represented as a variable resistance is that the MTJ is constituted of a soft ferromagnetic layer (whose direction of spin is changeable, in other words, its direction of magnetization is changeable) and a ferromagnetic layer (whose direction of spin is fixed, in other words, its direction of magnetization is fixed), and a tunneling resistance is small when the spins of these layers have the same direction and large when those of these layers have opposite directions. Accordingly, the variable resistance has two resistance values.

The MRAM cell MC11 has a variable resistance R11 and a diode D11 connected in series between the bit line BL1 and the word line WL1, the MRAM cell MC21 has a variable resistance R21 and a diode D21 connected in series between the bit line BL1 and the word line WL2, the MRAM cell MC12 has a variable resistance R12 and a diode D12 connected in series between the bit line BL2 and the word line WL1 and the MRAM cell MC22 has a variable resistance R22 and a diode D22 connected in series between the bit line BL2 and the word line WL2.

In the column read/write second control circuit CRW2, a drain voltage $V_{DD}$ is applied to the bit lines BL1 and BL2 through NMOS transistors MN11 and MN21, respectively. Drain electrodes of the NMOS transistors MN11 and MN21 are connected to drain electrodes of NMOS transistors MN12 and MN22, respectively, and a source voltage $V_{SS}$ is applied to source electrodes of the NMOS transistors MN12 and MN22.

Further, outputs of NAND gates ND1, ND2, ND3 and ND4 are given to gate electrodes of the NMOS transistors MN11, MN12, MN21 and MN22, and respective three inputs of the NAND gates ND1 to ND4 are connected to the multiplexer MUX.

In the column read/write first control circuit CRW1, the drain voltage $V_{DD}$ is applied to the bit lines BL1 and BL2 through an NMOS transistor MN13 and a variable resistance R31, and an NMOS transistor MN23 and a variable resistance R32, respectively. Drain electrodes of the NMOS transistors MN13 and MN23 are connected to drain electrodes of NMOS transistors MN14 and MN24, respectively, and the source voltage $V_{SS}$ is applied to source electrodes of the NMOS transistors MN14 and MN24.

Further, source electrodes of the NMOS transistors MN13 and MN23 are also connected to the multiplexer MUX including the sense amplifier, to detect a sense current.

Furthermore, outputs of NAND gates ND5, ND6, ND7 and ND8 are given to gate electrodes of the NMOS transistors MN13, MN14, MN23 and MN24, and respective three inputs of the NAND gates ND5 to ND8 are connected to the multiplexer MUX.

In the row read/write first control circuit RRW1, the drain voltage $V_{DD}$ is applied to the word lines WL1 and WL2 through NMOS transistors QN11 and QN21, respectively. Drain electrodes of the NMOS transistors QN11 and QN21 are connected to drain electrodes of NMOS transistors QN12 and QN22, respectively, and the source voltage $V_{SS}$ is applied to source electrodes of the NMOS transistors QN12 and QN22.

Further, gate electrodes of the NMOS transistors QN11, QN12, QN21 and QN22 are connected to the row decoder RD.

In the row read/write second control circuit RRW2, the source voltage $V_{SS}$ is applied to the word lines WL1 and WL2 through NMOS transistors QN13 and QN14, respectively.

Though FIG. 27 shows 2-row and 2-colum MRAM cell array MCA, the size of rows and columns is not limited to this example.

<B-2. Device Operation>

Discussion will be made below on an operation of the MRAM 100, referring to FIGS. 27 to 29.

Figure 28:
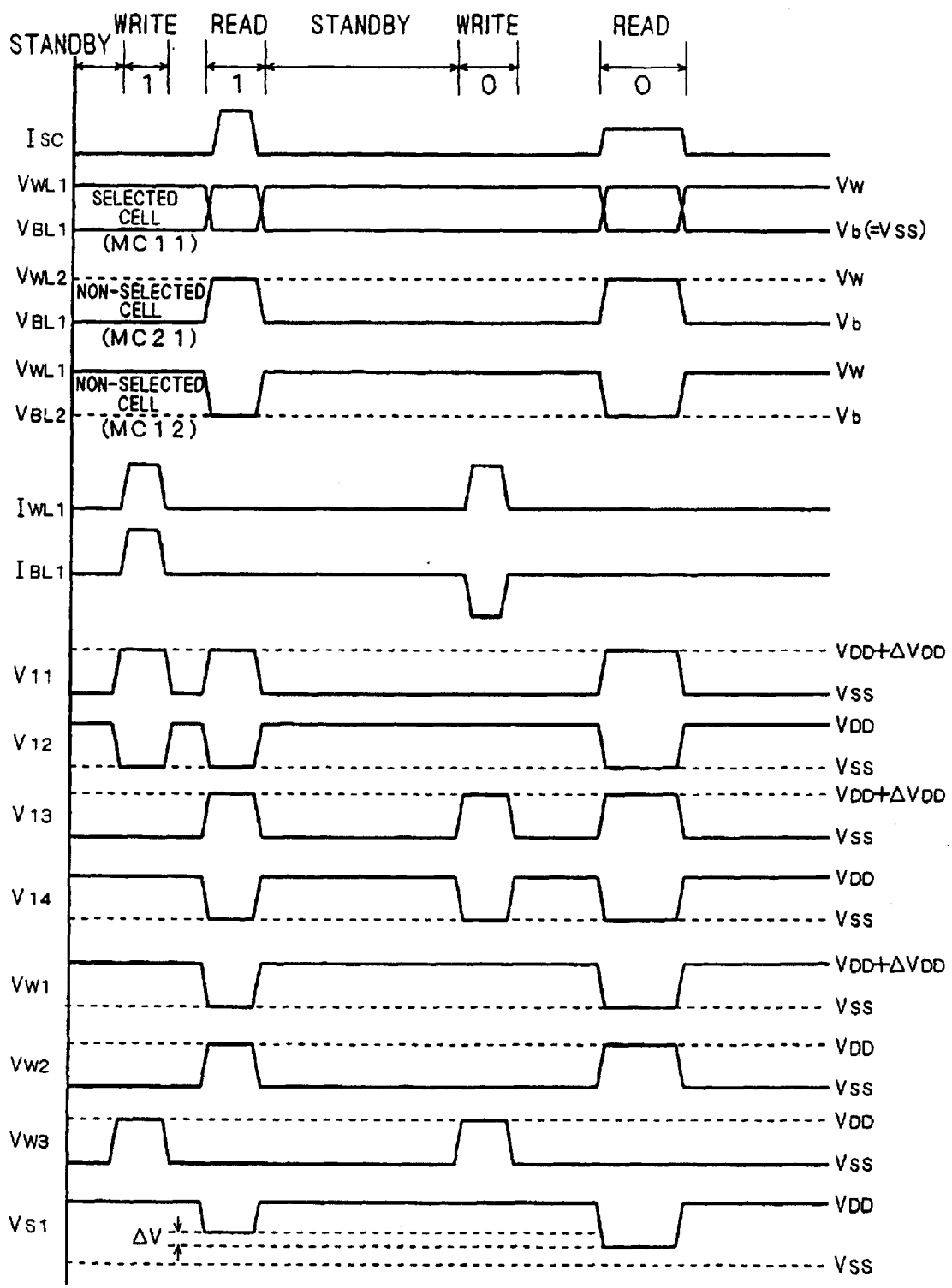
FIG. 28 is a timing chart showing an operation of the MRAM in accordance with the second preferred embodiment of the present invention.

FIG. 28 is a timing chart showing various currents and voltages in the MRAM 100 in reading and writing.

FIG. 28 shows a timing chart of sense current, that of voltage applied to the word line and the bit line in writing and reading of the MRAM cells MC11, MC21 and MC12, that of gate voltages $V_{11}$, $V_{12}$, $V_{13}$ and $V_{14}$ applied to the respective gate electrodes of the NMOS transistors MN11, MN12, MN13 and MN14, that of gate voltages $V_{W1}$, $V_{W2}$ and $V_{W3}$ applied to the respective gate electrodes of the NMOS transistors QN11, QN12 and QN13 and that of source voltage $V_{S1}$ of the NMOS transistor MN13.

In FIG. 28, the voltages of the word line and the bit line on standby are $V_w$ and $V_b$, respectively.

Since each MRAM cell includes a pn-junction diode, the voltages $V_w$ and $V_b$ are applied to the word line and the bit line, respectively, so that a reverse bias may be applied to the pn-junction of the diode on standby. Further, as shown in FIG. 27, since a cathode of each diode is connected to the word line, the voltages $V_w$ and $V_b$ are so set as to hold a relation $V_w > V_b$.

Assuming that the voltage $V_b$=source voltage $V_{SS}$, discussion will be made below on a control of the bit line BL1.

<B-2-1. Standby State>

As shown in FIG. 28, the voltage $V_w$ is applied to all the word lines and the voltage $V_b$ is applied to all the bit lines on standby. In order to realize this, the four NMOS transistors MN11, MN12, MN13 and MN14 of FIG. 28 are provided.

Specifically, on standby, the source voltage $V_{SS}$ is given to the gate voltages $V_{11}$ and $V_{13}$ so that the NMOS transistors MN11 and MN13 should be brought into an OFF state, and the drain voltage $V_{DD}$ is given to the gate voltages $V_{12}$ and $V_{14}$ so that the NMOS transistors MN12 and MN14 should be brought into an ON state.

Further, the gate voltage $V_{W1}$ is applied so that the NMOS transistor QN11 should be brought into an ON state, the gate voltage $V_{W2}$ is applied so that the NMOS transistor QN12 should be brought into an OFF state and the gate voltage $V_{W3}$ is applied so that the NMOS transistor QN13 should be brought into an OFF state.

Furthermore, since the source electrode of the NMOS transistor QN11 is connected to the drain voltage $V_{DD}$, a voltage of $V_{DD}+\Delta V_{DD}$ is applied as the gate voltage $V_{W1}$. This is intended to compensate the voltage drop by a threshold voltage of the transistor.

As a result, the source voltage $V_{SS}$ is applied to the bit lines BL1 and the drain voltage $V_{DD}$ is applied to the word lines WL1.

<B-2-2. Write State 1 (Write 1)>

Writing of data "1" into the MRAM cell MC11 (reversing the direction of spin) needs to carry a current to the selected word line WL1 and the selected bit line BL1. In the MRAM 100 of FIG. 27, it is assumed that bidirectional currents should be passed only through the bit line.

In this case, the NMOS transistors MN11 and MN14 are in the ON state and the NMOS transistors MN12 and MN13 are in the OFF state. Since the source electrode of the NMOS transistor MN11 is connected to the drain voltage $V_{DD}$, however, a voltage of $V_{DD}+\Delta V_{DD}$ is applied as the gate voltage $V_{11}$.

As a result, a current $I_{BT}$ flowing in the selected bit line BL1 has a downward direction in FIG. 27.

On the other hand, by bring the NMOS transistors QN11 and QN13 into the ON state and the NMOS transistor QN12 into the OFF state, a current $I_{WD}$ flowing in the selected word line WL1 has a rightward direction in FIG. 27. Since the source electrode of the NMOS transistor QN11 is connected to the drain voltage $V_{DD}$, however, a voltage of $V_{DD}+\Delta V_{DD}$ is applied as the gate voltage $V_{w1}$.

Thus, a magnetic field generated by the currents $I_{WD}$ and $I_{BT}$ flowing in the selected word line WL1 and the selected bit line BL1, respectively, rotates the spin of the soft ferromagnetic layer in the MTJ of the MRAM cell MC11, to write data.

<B-2-3. Read State 1 (Read 1)>

In reading data "1" written in the MRAM cell MC11, a forward bias is applied only to the diode D11 of the MRAM cell MC11, to carry a sense current $I_{SC}$. The flow of the sense current $I_{SC}$ in the MRAM cell MC11 causes a voltage drop in the bit line BL1. By the magnitude of the voltage drop, whether the data is "0" or "1" is judged.

In order to apply the forward bias to the diode D11, the voltages $V_b$ and $V_w$ are applied to the selected word line WL1 and the selected bit line BL1, respectively. In order to realize this state, the NMOS transistors MN11 and MN13 are brought into the ON state and the NMOS transistors MN12 and MN14 are brought into the OFF state.

Since the source voltage of the NMOS transistors MN11 and MN13 is $V_{DD}$, however, a voltage of $V_{DD}+\Delta V_{DD}$ is applied as the gate voltages $V_{11}$ and $V_{13}$.

At this time, a reverse bias is still applied to the pn-junction diode D22 of the MRAM cell MC22 at the non-selected address (the voltage $V_w$ is applied to the word line WL2 and the voltage $V_b$ is applied to the bit line BL2), there is no potential difference (0 bias) between the diodes D12 and D21 of the MRAM cells MC12 and MC21 at the half-selected address and no current flows in the MRAM cells MC12, MC21 and MC22.

It is assumed here that among two resistance values of the variable resistance R11 (i.e., MTJ), a higher one is RH and a lower one is $R_L$.

The magnitude of the sense current $I_{SC}$ flowing in the MRAM cell MC11 varies with the resistance value of the MTJ (i.e., the value of the variable resistance R11). Assuming that the values of the sense current are $I_L$ and $I_H$ when the resistance values of the MTJ are $R_L$ and $R_H$, since $R_H>R_L$, a relation $I_L>I_H$ holds.

Since the sense current flows in the MRAM cell MC11, a voltage $V_{S1}$ of the source electrode of the NMOS transistor MN13 (connected to the multiplexer MUX) drops to be lower than the drain voltage $V_{DD}$.

The voltage drop depends on the magnetic tunnel resistance value, and the sense amplifier included in the multiplexer MUX compares the drop voltage with a reference voltage, to detect data "1".

<B-2-4. Write State 0 (Write 0)>

Writing of data "0" into the MRAM cell MC11 (keeping the direction of spin) is different from writing of data "1" in that the direction of current flowing in the selected bit line BL1 is opposite. In order to realize this state, the NMOS transistors MN11 and MN14 are brought into the OFF state and the NMOS transistors MN12 and MN13 are brought into the ON state.

As a result, the current $I_{BT}$ flowing in the selected bit line BL1 has an upward direction in FIG. 27.

<B-2-5. Read State 0 (Read 0)>

In reading data "0" written in the MRAM cell MC11, operations of the NMOS transistors MN11, MN12, MN13 and MN14 are the same as those in the read state 1 (read 1).

The potential difference $\Delta V$ between the voltage $V_{S1}$ of the source electrode of the NMOS transistor MN13 in reading data "0" and that in reading data "1", however, becomes larger as the rate of change $(R_H-R_L)$ in the magnetic tunnel resistance is larger. Since a margin with respect to the reference voltage in detection by the sense amplifier becomes larger as the potential difference $\Delta V$ is larger, the detection becomes easy.

Figure 29:
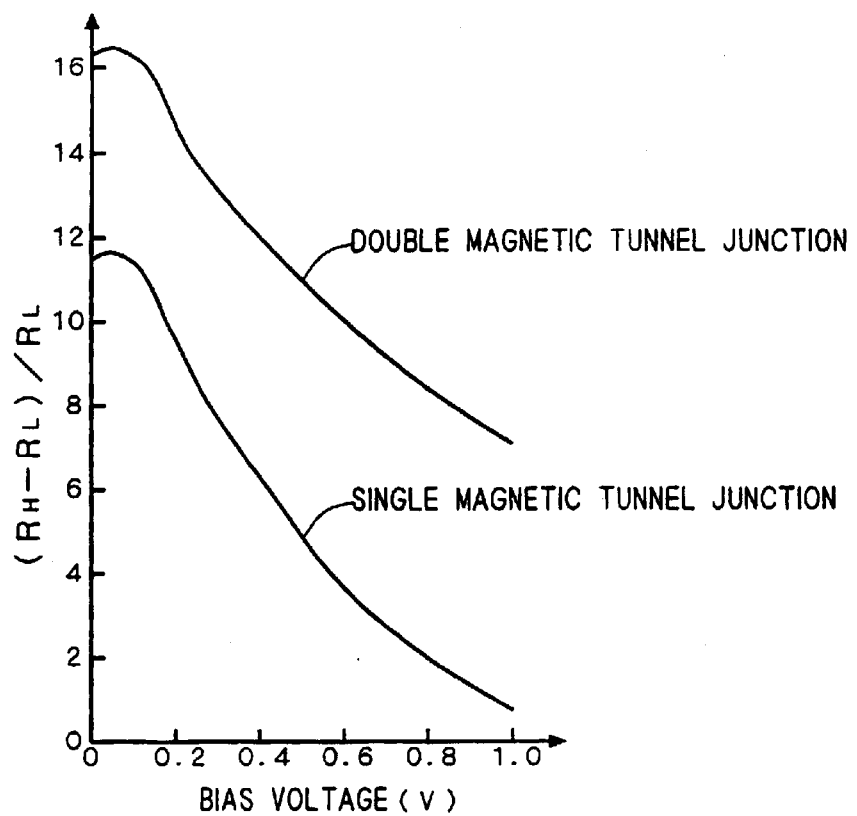
FIG. 29 is a view showing the applied-voltage dependency of rate of change in magnetic tunnel resistance.

FIG. 29 shows the applied-voltage dependency of rate of change in magnetic tunnel resistance. In FIG. 29, the horizontal axis indicates a bias voltage applied to the MTJ and the vertical axis indicates the rate of change in magnetic tunnel resistance $\{(R_H-R_L)/R_L\}$. Further, FIG. 29 shows characteristics of single magnetic tunnel junction having one tunnel barrier layer, which is an MTJ discussed above, and also shows those of double magnetic tunnel junction having two tunnel barrier layers.

As can be seen from FIG. 29, the rate of change in magnetic tunnel resistance becomes maximum when a voltage applied to the (single and double) magnetic tunnel junction is about 0.1 V. Accordingly, it is desirable that the voltage $V_W$ applied to the selected bit line BL1 in reading should be higher than the voltage applied to the pn-junction diode by 0.1 V. This voltage is achieved by controlling the gate voltages of the NMOS transistors MN11 and NM13, $V_{DD}+\Delta V_{DD}$.

Figure 30:
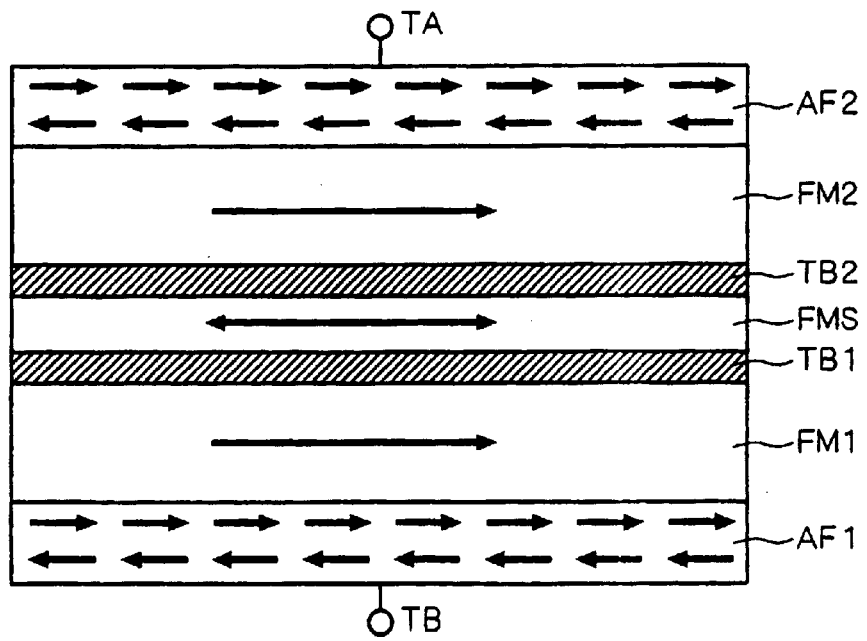
FIG. 30 is a view showing a structure of a double magnetic tunnel junction.

Now, a structure of the double magnetic tunnel junction will be discussed, referring to FIG. 30. As shown in FIG. 30, the double magnetic tunnel junction has a structure in which a first antiferromagnetic layer AF1, a ferromagnetic layer FM1, a first tunnel barrier layer TB1, a soft ferromagnetic layer FMS, a second tunnel barrier layer TB2 and a second antiferromagnetic layer AF2 are layered.

In such a structure, when a voltage $V_X$ is applied between terminals TA and TB of the first and second antiferromagnetic layers AF1 and AF2, a voltage of $V_X/2$ is applied to the first and second tunnel barrier layers TB1 and TB2.

On the other hand, the voltage $V_X$ is applied to a tunnel barrier thin film in the single magnetic tunnel junction and the rate of change in magnetic tunnel resistance is larger in the double magnetic tunnel junction than that in the single magnetic tunnel junction since the rate of change in magnetic tunnel resistance becomes smaller as an applied voltage is larger, and therefore there arises a difference in characteristics of the single magnetic tunnel junction and the double magnetic tunnel junction as shown in FIG. 29.

<B-3. Action and Effect>

As discussed above, since the MRAM of the second preferred embodiment of the present invention comprises the column read/write first control circuit CRW1 and the column read/write second control circuit CRW2 at both ends of the bit lines and the word lines in the MRAM cell array MCA and these control circuits have the first MOS transistors (MN11, MN21, MN13 and MN23) for connecting the bit lines to the voltage $V_{DD}$ and the second MOS transistors (MN12, MN22, MN14 and MN24) for connecting the bit lines to the voltage $V_{SS}$, the direction of current flowing in the selected bit line can be changed by switching the NMOS transistors and therefore the direction of spin of the soft ferromagnetic layer included in the MTJ can be arbitrarily changed. Further, the NMOS transistors MN11 and MN12, MN21 and MN22, MN13 and MN14, and MN23 and MN24, which can switch the target to be connected with both ends of the bit lines between the voltages VDD and VSS, may be referred to as switching means.

Furthermore, since the first MOS transistors in the column read/write first control circuit CRW1 are connected to the multiplexer MUX including the sense amplifier, a voltage caused by the sense current in reading of data is outputted to the multiplexer MUX.

<B-4. Variation 1>

Figure 31:
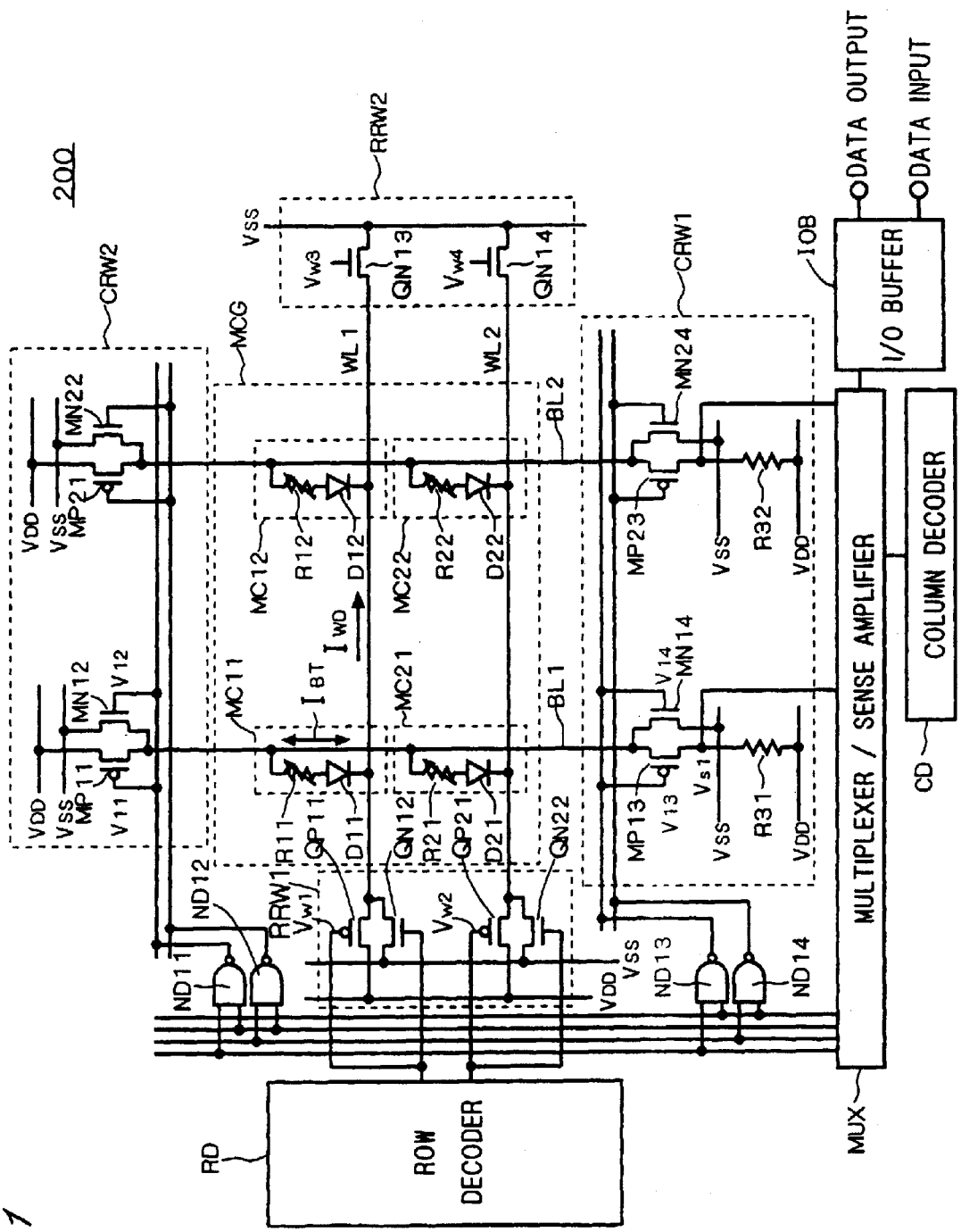
FIG. 31 is a circuit diagram showing a configuration of the MRAM in accordance with the second preferred embodiment of the present invention.

As a first variation of the second preferred embodiment of the present invention, an MRAM 200 is shown in FIG. 31. The MRAM 200 has almost the same structure as that of the MRAM 100 shown in FIG. 27 except that PMOS transistors MP11, MP13, MP21, MP23, QP11 and QP21 are provided, instead of the NMOS transistors MN11, MN13, MN21, MN23, QN11 and QN21 in the MRAM 100, and the output of the NAND gate ND11 is given to the gate electrodes of the PMOS transistor MP11 and the NMOS transistor MN12, the output of the NAND gate ND12 is given to the gate electrodes of the PMOS transistor MP21 and the NMOS transistor MN22, the output of the NAND gate ND13 is given to the gate electrodes of the PMOS transistor MP13 and the NMOS transistor MN14 and the output of the NAND gate ND14 is given to the gate electrodes of the PMOS transistor MP23 and the NMOS transistor MN24, making the gate inputs common.

In the MRAM 100 of FIG. 27, since the voltage $V_{DD}+\Delta V_{DD}$ is applied to the gate electrodes of the NMOS transistors MN11, MN13, MN21 and MN23 in the ON state, there is a possibility that a load on the gate insulating films in these NMOS transistors becomes larger than that in the NMOS transistors MN12, MN14, MN22 and MN24 whose gate voltages are each $V_{DD}$.

In the MRAM 200 of FIG. 30, however, adopting the PMOS transistors MP11, MP13, MP21 and MP23, no more voltage than $V_{DD}$ is applied to the gate electrodes and therefore the load on the gate insulating films is reduced.

Further, adopting the PMOS transistors MP11, MP13, MP21 and MP23, the gate inputs can be made common with the NMOS transistors MN12, MN14, MN22 and MN24, and the PMOS transistor MP11 and the NMOS transistor MN12, the PMOS transistor MP21 and the NMOS transistor MN22, the PMOS transistor MP13 and the NMOS transistor MN14, and the PMOS transistor MP23 and the NMOS transistor MN24 make up inverters (drivers and buffers), respectively, to cut the power consumption as compared with the MRAM 100.

Figure 32:
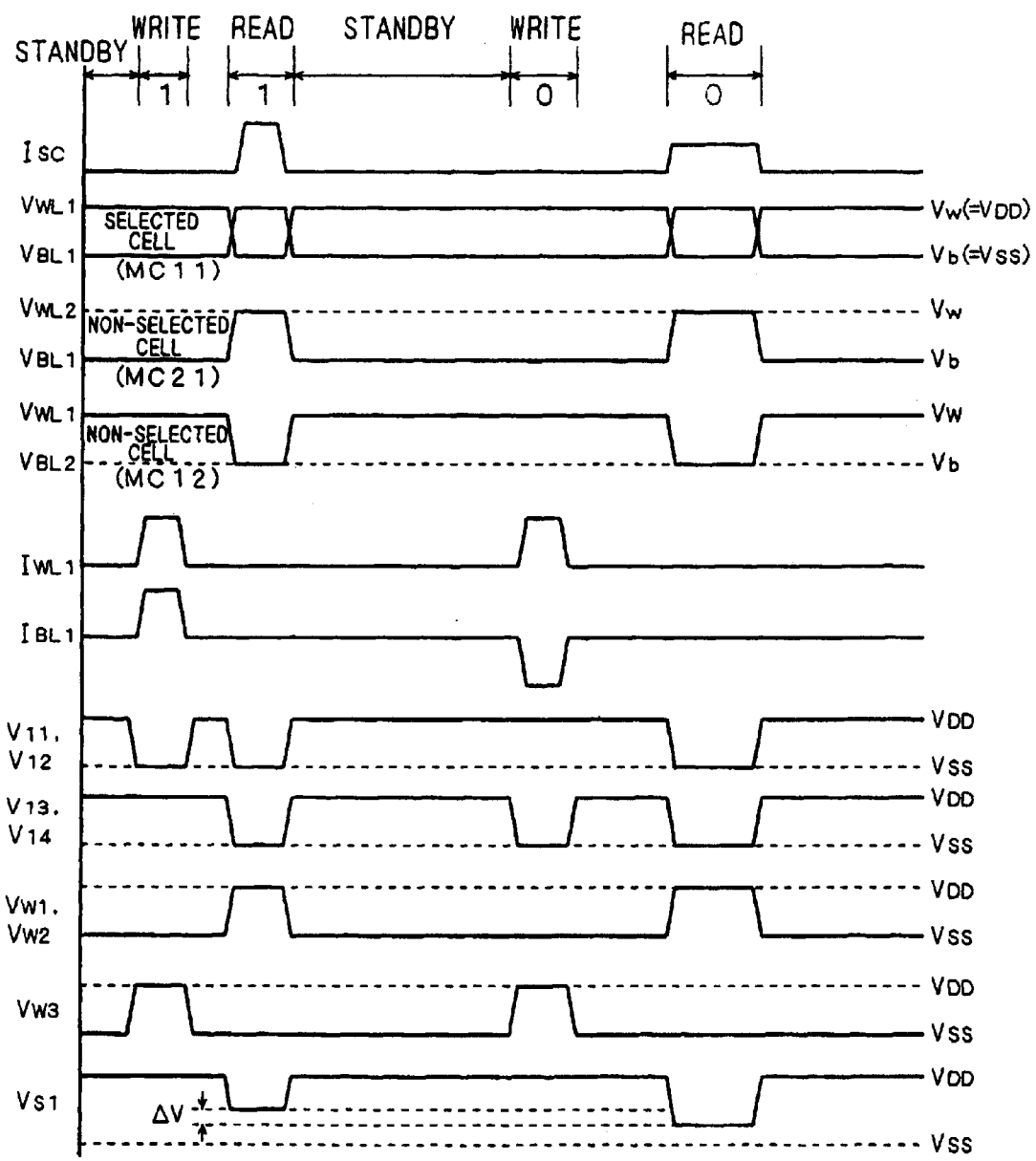
FIG. 32 is a timing chart showing an operation of the MRAM in accordance with the second preferred embodiment of the present invention.

FIG. 32 is a timing chart showing various currents and voltages in the MRAM 200 in reading and writing.

In the MRAM 200, since the gate inputs of the PMOS transistors MP11 and MP13 and those of the NMOS transistors MN12 and MN14 are made common, respectively, the gate voltages $V_{11}$ and $V_{12}$ have the same timing chart and the gate voltages $V_{13}$ and $V_{14}$ have the same timing chart.

Further, since the gate inputs of the PMOS transistor QP11 and the NMOS transistor QN12 (similarly, the gate inputs of the PMOS transistor QP21 and the NMOS transistor QN22) are made common, the gate voltages $V_{W1}$ and $V_{W2}$ have the same timing chart but the basic operation is the same as that of the MRAM 100.

Furthermore, in this example, it is assumed that the voltage $V_b$=the source voltage $V_{SS}$ and the voltage $V_W$=the drain voltage $V_{DD}$. Specifically, when the characteristics of the MTJ is the same as those shown in FIG. 29, the drain voltage $V_{DD}$ is set to be almost equal to a value obtained by adding 0.1 V to the voltage applied to the pn-junction diode in each MRAM cell.

Not shown in this figure, the read/write control circuits of the MRAMs 100 and 200 may be shared with an adjacent MRAM cell array. This case produces an effect of reducing the area of device by sharing.

<B-5. Variation 2>

Figure 33:
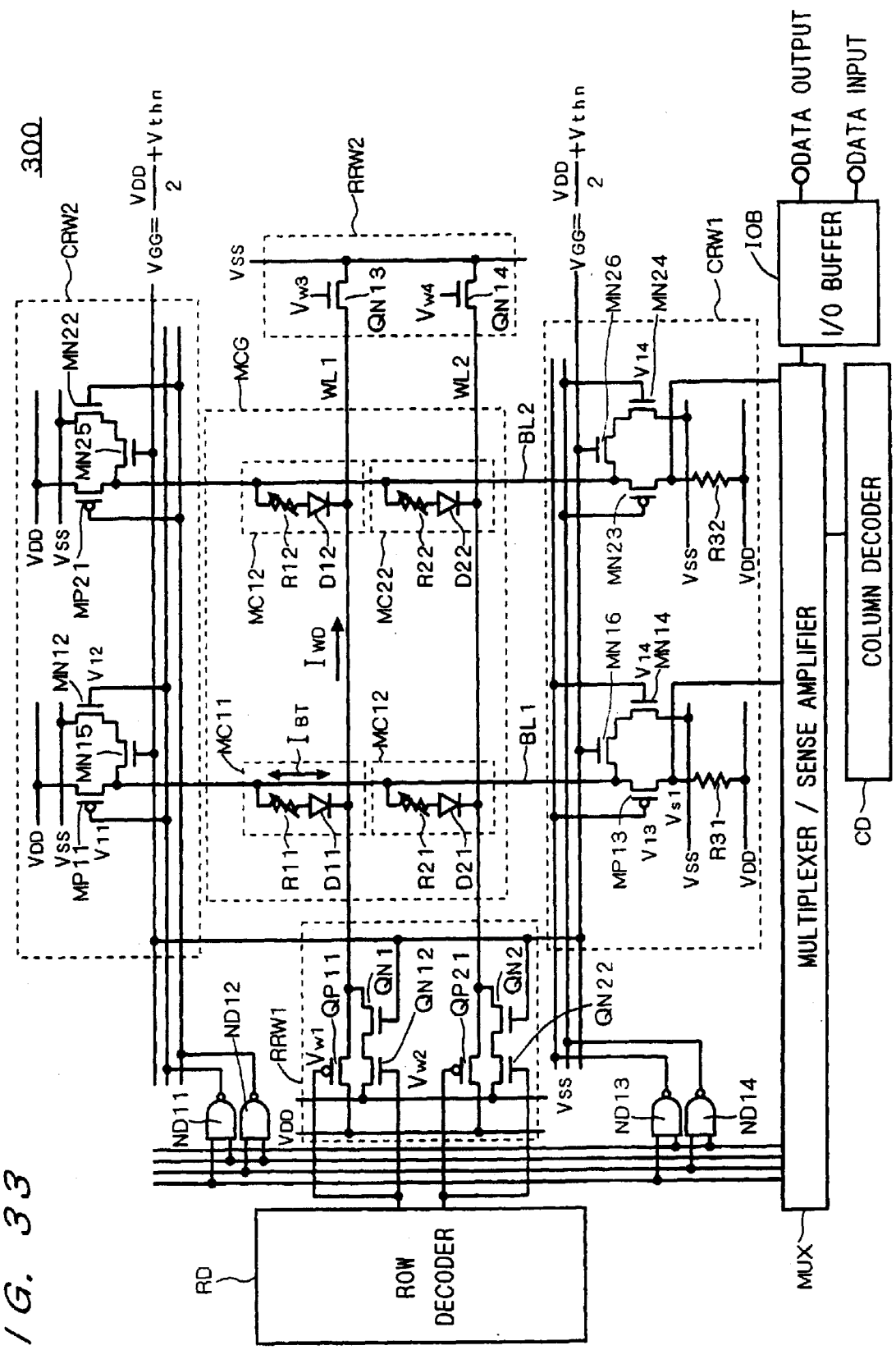
FIG. 33 is a circuit diagram showing a configuration of the MRAM in accordance with the second preferred embodiment of the present invention.

As a second variation of the second preferred embodiment of the present invention, an MRAM 300 is shown in FIG. 33. The MRAM 300 has almost the same structure as that of the MRAM 200 shown in FIG. 31 except that NMOS transistors MN15, MN16, MN25 and MN26 are inserted between the drain electrodes of the PMOS transistor MP11 and the NMOS transistor MN12, those of the PMOS transistor MP13 and the NMOS transistor MN14, those of the PMOS transistor MP21 and the NMOS transistor MN22, and those of the PMOS transistor MP23 and the NMOS transistor MN24, respectively, and NMOS transistors QN1 and QN2 are inserted between the drain electrodes of the PMOS transistor QP11 and the NMOS transistor QN12, and those of the PMOS transistor QP21 and the NMOS transistor QN22.

Further, the gate voltages of the NMOS transistors MN15, MN16, MN25, MN26, QN1 and QN2 are fixed to a DC voltage $V_{GG}$.

These NMOS transistors are provided for the purpose of reducing a leak current. Specifically, the leak current of a MOSFET caused by BTBT (Band To Band Tunneling) due to a high electric field at a drain end, TAT (Trap Assisted Tunneling), impact ionization and SRH (Schockley-Read-Hall process).

In order to reduce the leak current, it is only necessary to reduce the electric field at the drain end. For example, by inserting the NMOS transistor MN15 between the drain electrodes of the PMOS transistor MP11 and the NMOS transistor MN12 and setting the gate voltage of the NMOS transistor MN15 to a predetermined DC voltage (herein, voltage $V_{GG}$), the drain voltages applied to the NMOS transistors MN12 and MN15 can be reduced.

For example, the voltage $V_{GG}$ is set to $V_{DD}/2+V_{thn}$ (the threshold voltage of the NMOS transistor MN15), and applied so that the NMOS transistor MN15 may be always in the ON state. Then, when the NMOS transistor MN12 comes into the ON state, since two resistances are connected in series, together with the NMOS transistor MN15, and the stress voltages (drain voltage $V_{DD}$) on the NMOS transistors MN12 and MN15 are equal to each other by resistance division, total leak current of the NMOS transistors MN12 and MN15 is greatly reduced as compared with the case where the NMOS transistor MN15 is not inserted, in other words, the case of only the NMOS transistor MN12, and the power consumption can be also cut.

Further, setting of the voltage $V_{GG}$ to $V_{DD}/2+V_{thn}$ is based on the knowledge that this setting makes the stress voltages on the NMOS transistors MN12 and MN15 equal and minimum, but the voltage $V_{GG}$ is not practically limited to this voltage value only if the power consumption can be cut.

The same effect as above can be produced by the NMOS transistors MN16, MN25 and MN26.

The NMOS transistors QN1 and QN2 inserted between the drain electrodes of the PMOS transistor QP11 and the NMOS transistor MN12 and those of the PMOS transistor QP21 and the NMOS transistor QN22, respectively, can greatly reduce the leak current and cut the power consumption.

Further, though it is assumed in the above discussion that the bidirectional currents flow in the bit lines and a unidirectional current flows in the word lines of the MRAM cell array in writing of data, there may be a case where the unidirectional current flows in the bit lines and the bidirectional currents flow in the word lines.

Furthermore, elements having ON/OFF characteristics, such as MOSFET, TFT (thin film transistor) and bipolar transistor, may be used instead of the pn-junction diode in the MRAM cell.

C. The Third Preferred Embodiment

<Characteristic Feature of the Third Preferred Embodiment>

Characteristic feature of an MRAM in accordance with the third preferred embodiment of the present invention lies in that the word line or the bit line is divided into a plurality of sub-word lines or sub-bit lines.

Specifically, assuming that the resistivity of line is ρ, the length of line is 1 and the area of cross section of line is S, resistance of line is expressed by the following equation (9):

$$R = \rho \frac{l}{S} \tag{9}$$

Further, assuming that the current flowing in the line is I, power consumption P is expressed by the following equation (10):

$$P = RI^2 = \rho \frac{lI^2}{S} \tag{10}$$

Accordingly, it can be seen that the power consumption can be cut when the length 1 of line is shorten. For example, when a line is divided into two, the power consumption becomes ½ and when a line is divided into n (n is an integer not less than 2), the power consumption becomes 1/n, and thus the power consumption during writing in an MRAM can be cut.

Further, when the number of memory cells connected to one word line increases, capacitance of load increases. As a result, the delay time of signals transmitted through the word line increases, disadvantageously hindering high-speed access.

By dividing the word lines into a plurality of sub-word lines to shorten the length of line, however, the number of memory cells connected to one line is reduced and therefore the capacitance of load is reduced. As a result, the delay time can be reduced as compared with a memory device in which its word line is not divided, and therefore high-speed access can be achieved. The same applies to the bit lines. Hereafter, a specific structure of the MRAM in accordance with the third preferred embodiment of the present invention will be discussed.

<C-1. Division of Word Lines>
<C-1-1. Device Structure>

Figure 34:
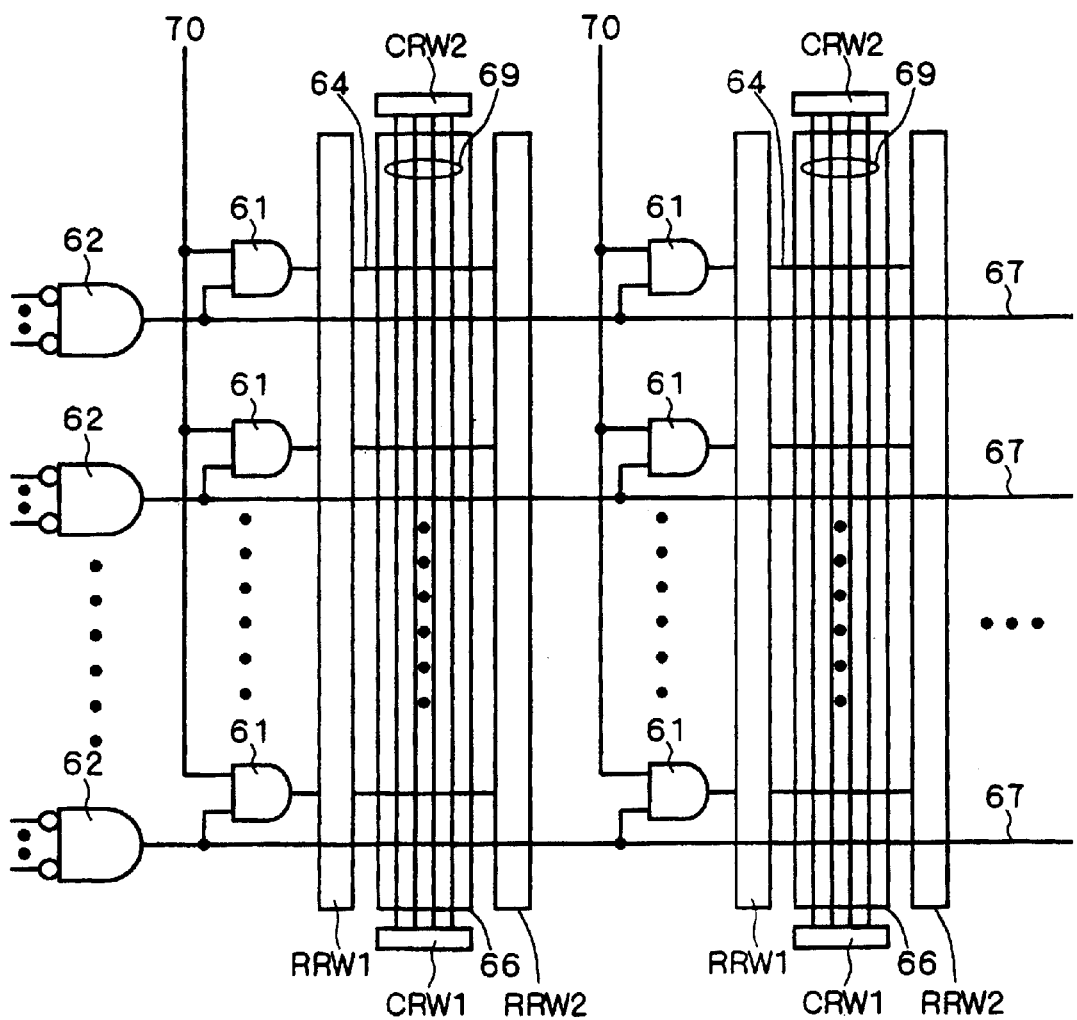
FIG. 34 is a block diagram showing a configuration with the word lines divided in an MRAM in accordance with a third preferred embodiment of the present invention.

FIG. 34 is a block diagram showing a configuration of an MRAM 400 in which the word lines are divided. The MRAM 400 has a plurality of MRAM cell arrays 66, as shown in FIG. 34.

Each MRAM cell array 66 has the row read/write first control circuit RRW1 connected to first ends of a plurality of word lines 64, the row read/write second control circuit RRW2 connected to second ends of the word lines 64, the column read/write first control circuit CRW1 connected to first ends of a plurality of bit lines 69 and the column read/write second control circuit CRW2 connected to second ends of the bit lines 69.

Further, these control circuits are the same as those of the MRAMs 100 to 300 in the second preferred embodiment of the present invention and given the same reference signs, but are not limited to these.

A plurality of memory cell array selecting lines 70 connected to a not-shown column decoder are provided, correspondingly to the MRAM cell arrays 66.

Outputs of a plurality of AND gates 62 constituting a row decoder are connected to main word lines 67, respectively. Further, the number of main word lines 67 is equal to the number of word lines in each MRAM cell array 66.

Two-input AND gates 61 whose inputs are the memory cell array selecting line 70 and the main word line 67 are connected at intersections of a plurality of memory cell array selecting lines 70 and a plurality of main word lines 67, and outputs thereof are connected to sub-word lines 64 through the row read/write first control circuit RRW1. The sub-word lines 64 correspond to the word lines of each MRAM cell array 66.

<C-1-2. Device Operation>

Discussion will be made below on an operation of the MRAM 400.

For example, when one of the memory cell array selecting lines 70 and one of the main word lines 67 become active, the AND gate 61 connected to the active memory cell array selecting line 70 and the active main word line 67 activates the sub-word line 64 connected to its output.

In this case, since the active main word line 67 is not directly connected to the MRAM cell, its capacitance does not include the capacitance of the MRAM cells constituting the MRAM cell array 66. Accordingly, the capacitance contained in the word line is greatly reduced as compared with a configuration in which an MRAM cell is selected by one word line across a plurality of MRAM cell arrays.

Moreover, by shortening the sub-word line 64 only across one MRAM cell array 66 SO that the delay (CR delay) caused by the capacitance and the resistance may become negligible, the MRAM 400 allows substantial reduction in time to select a specified MRAM cell, thereby improving its operation speed.

Now, the capacitance of the MRAM cell will be discussed. As an example taken is a case where the MRAM cell is constituted of the MTJ (magnetic tunnel junction) and the pn-junction diode which are connected in series.

In this case, the capacitance $C_M$ of the MRAM cell is capacitance obtained by serially connecting the capacitance $C_{TMR}$ of the MTJ and the capacitance $C_D$ of the pn-junction diode, as expressed by the following equation (11):

$$\frac{1}{C_M} = \frac{1}{C_{TMR}} + \frac{1}{C_D} \tag{11}$$

In the MRAM 400 of FIG. 34, since only the MRAM cells connected to the sub-word lines 64 in the selected MRAM cell array 66 are accessed, the current flowing between the sub-word lines 64 and the bit lines 69 decreases in proportion to the inverse number of the number of MRAM cell arrays as compared with the configuration in which the word lines are not divided, and the power consumption can be cut.

Further, though the AND gate is used in the MRAM 400 as a logic gate to control the sub-word lines 64, such a logic gate is not limited to an AND gate and other logic gates such as NAND gate, NOR gate and XOR gate may be used to produce the same effect as the MRAM 400 by inputting combination of a logic representing "High" or "Low" of the memory cell array selecting line 70 and the main word line 67 and the inverse logic (representing "Low" or "High") thereto. Herein, "High" and "Low" of logic each correspond to high value or low value of each signal voltage.

<C-2. Hierarchization of Word Lines>
<C-2-1. Device Structure>

Figure 35:
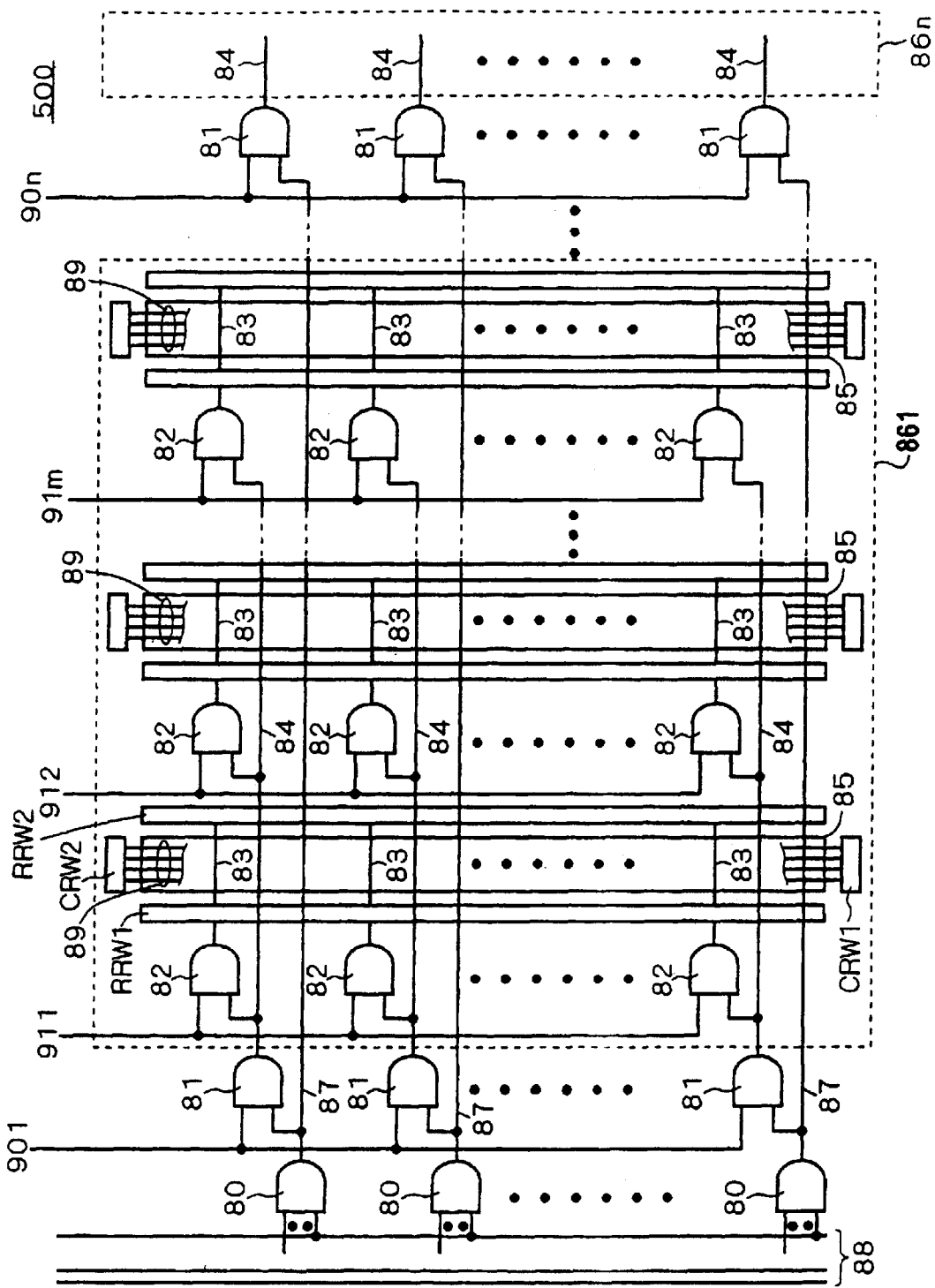
FIG. 35 is a block diagram showing a configuration with the word lines hierarchized in the MRAM in accordance with the third preferred embodiment of the present invention.

FIG. 35 is a block diagram showing a configuration of an MRAM 500 in which the word lines are hierarchized. As shown in FIG. 35, the MRAM 500 comprises n memory cell array groups 861 to 86n each having m MRAM cell arrays 85.

Taking the memory cell array group 861 as an example, each MRAM cell array 85 has the row read/write first control circuit RRW1 connected to first ends of a plurality of word lines 83, the row read/write second control circuit RRW2 connected to second ends of the word lines 83, the column read/write first control circuit CRW1 connected to first ends of a plurality of bit lines 89 and the column read/write second control circuit CRW2 connected to second ends of the bit lines 89.

Further, m memory cell array selecting lines 91*l* to 91*m* connected to a not-shown column decoder are provided, correspondingly to the MRAM cell arrays 85.

Outputs of a plurality of AND gates (sub-global decoders) 81 are connected to main word lines 84, respectively. Further, the number of main word lines 84 is equal to the number of word lines in each MRAM cell array 85.

Two-input AND gates (local row decoder) 82 whose inputs are any one of the memory cell array selecting lines 91*l* to 91*m* and one of the main word lines 84 are connected at intersections of the memory cell array selecting lines 91*l* to 91*m* and a plurality of main word lines 84, and outputs thereof are connected to sub-word lines 83 through the row read/write first control circuit RRW1. The sub-word lines 83 correspond to the word lines of each MRAM cell array 85.

Further, all first inputs of the sub-global decoders 81 are connected in common to a memory cell array group selecting line 90*l* provided correspondingly to the memory cell array group 86*l*.

Second inputs of the sub-global decoders 81 are connected to outputs of a plurality of AND gates (main global decoders) 80 through global word lines 87 connected thereto, respectively.

The memory cell array group selecting lines 90*l* to 90*n* are different from the global word lines 87, and these lines are so provided as to intersect each other.

Further, other memory cell array groups each have the same configuration as the memory cell array group 86*l*, being connected to a plurality of sub-global decoders 81, and the sub-global decoders 81 are connected to the memory cell array group selecting line.

Specifically, the memory cell array group selecting lines 90*l* to 90*n* are provided correspondingly to the memory cell array groups 86*l* to 86*n*, second inputs of the sub-global decoders 81 connected to the memory cell array groups 86*l* to 86*n* are connected to outputs of a plurality of main global decoders 80 through the global word lines 87.

Further, a plurality of main global decoders 80 are connected to an address signal line group 88.

<C-2-2. Device Operation>

Discussion will be made below on an operation of the MRAM 500.

One of the memory cell array groups 86*l* to 86*n* is selected by the memory cell array group selecting lines 90*l* to 90*n* and one of a plurality of MRAM cell arrays 85 in each of the memory cell array groups 86*l* to 86*n* is selected by the memory cell array selecting lines 91*l* to 91*m*.

An operation of the memory cell array groups 86*l* to 86*n* is the same as that of the MRAM 400 discussed referring to FIG. 34, and for example, when the memory cell array selecting line 91*l* and one of the main word lines 84 become active, the AND gate 82 connected to the active memory cell array selecting line 91*l* and the active main word line 84 activates the sub-word line 83 connected to its output.

In this case, since the capacitance of the active main word line 84 does not include the capacitance of the MRAM cells constituting the MRAM cell array 85, the capacitance contained in the word line is greatly reduced as compared with the background-art MRAM in which an MRAM cell is selected by one word line across a plurality of MRAM cell arrays.

Further, for example, when the memory cell array group selecting line 90*l* and one of the global word lines 87 become active, the AND gate 81 connected to the active memory cell array group selecting line 90*l* and the active global word line 87 activates the main word line 84 connected to its output.

In this case, since the capacitance of the active global word line 87 does not include the capacitance of the MRAM cell arrays 85 constituting one of the MRAM cell array groups 86*l* to 86*n*, the capacitance contained in the word line is greatly reduced as compared with a configuration in which an MRAM cell is selected by one word line across a plurality of MRAM cell array groups.

Accordingly, the current between the word lines 83 and the bit lines 89 is not only reduced in proportion to the inverse number of the number of MRAM cell arrays as compared with the background-art MRAM in which the word lines are not hierarchized but also reduced in proportion to the inverse number of the number of MRAM cell array groups, and the power consumption can be thereby cut.

<C-2-3. Overall Structure of MRAM with Hierarchized Word Lines>

Figure 36:
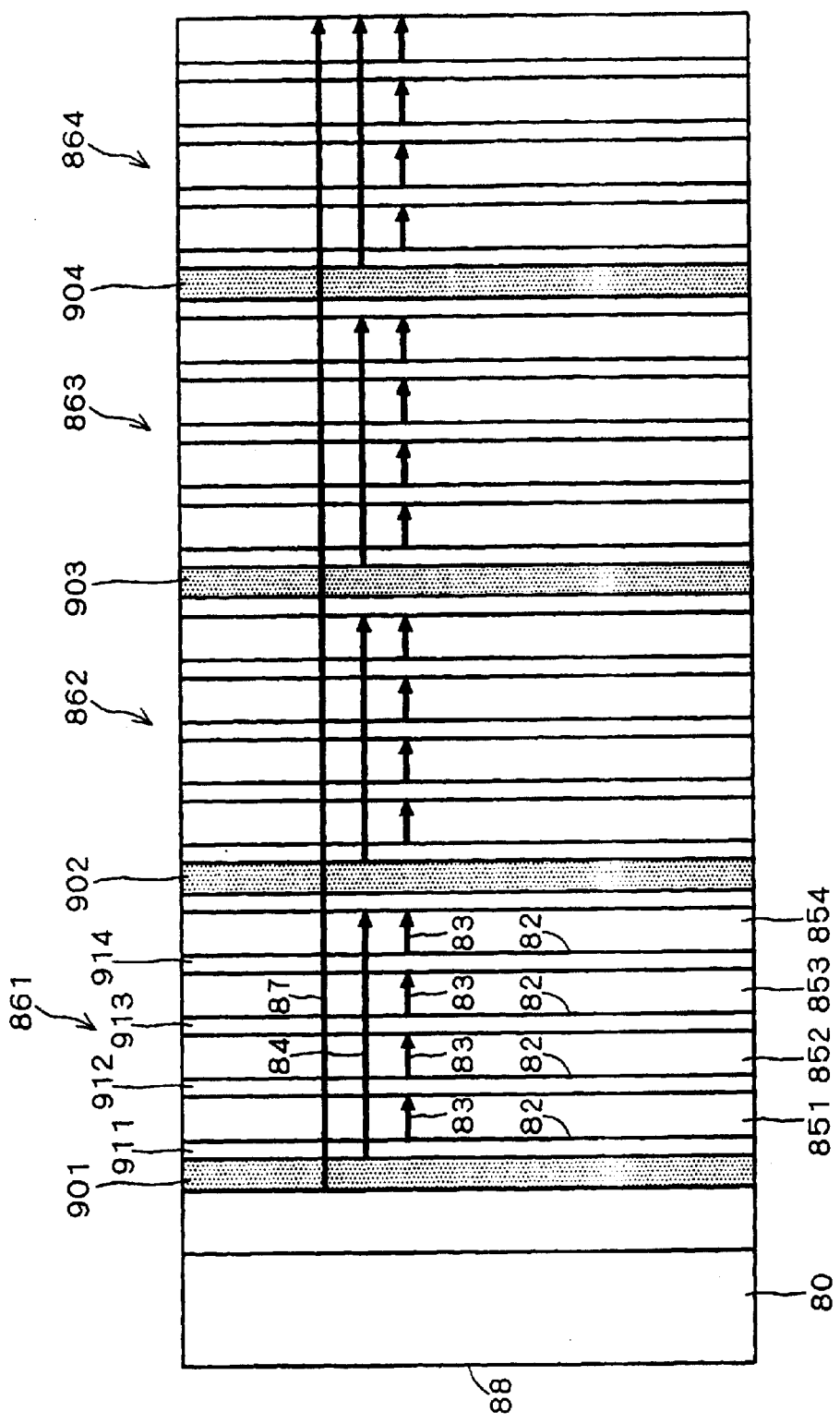
FIG. 36 is a conceptional diagram showing a structure with the word lines hierarchized in the MRAM in accordance with the third preferred embodiment of the present invention.

FIG. 36 shows an exemplary overall structure of an MRAM with the word lines hierarchized. FIG. 36 shows an MRAM comprising four memory cell array groups 861 to 864 each having four MRAM cell arrays 851 to 854, and four memory cell array group selecting lines 901 to 904 are provided correspondingly to the four memory cell array groups 861 to 864. Further, in each memory cell array group, four memory cell array selecting lines 911 to 914 are provided correspondingly to the four MRAM cell arrays 851 to 854.

Furthermore, in FIG. 36, structures of the MRAM cell arrays 85 and the like are shown by simple blocks and line paths of the global word lines 87 and the like are schematically shown by arrows. It can be seen from FIG. 36 that the word lines are hierarchized.

<C-3. Division of Bit Lines>

<C-3-1. Device Structure>

Figure 37:
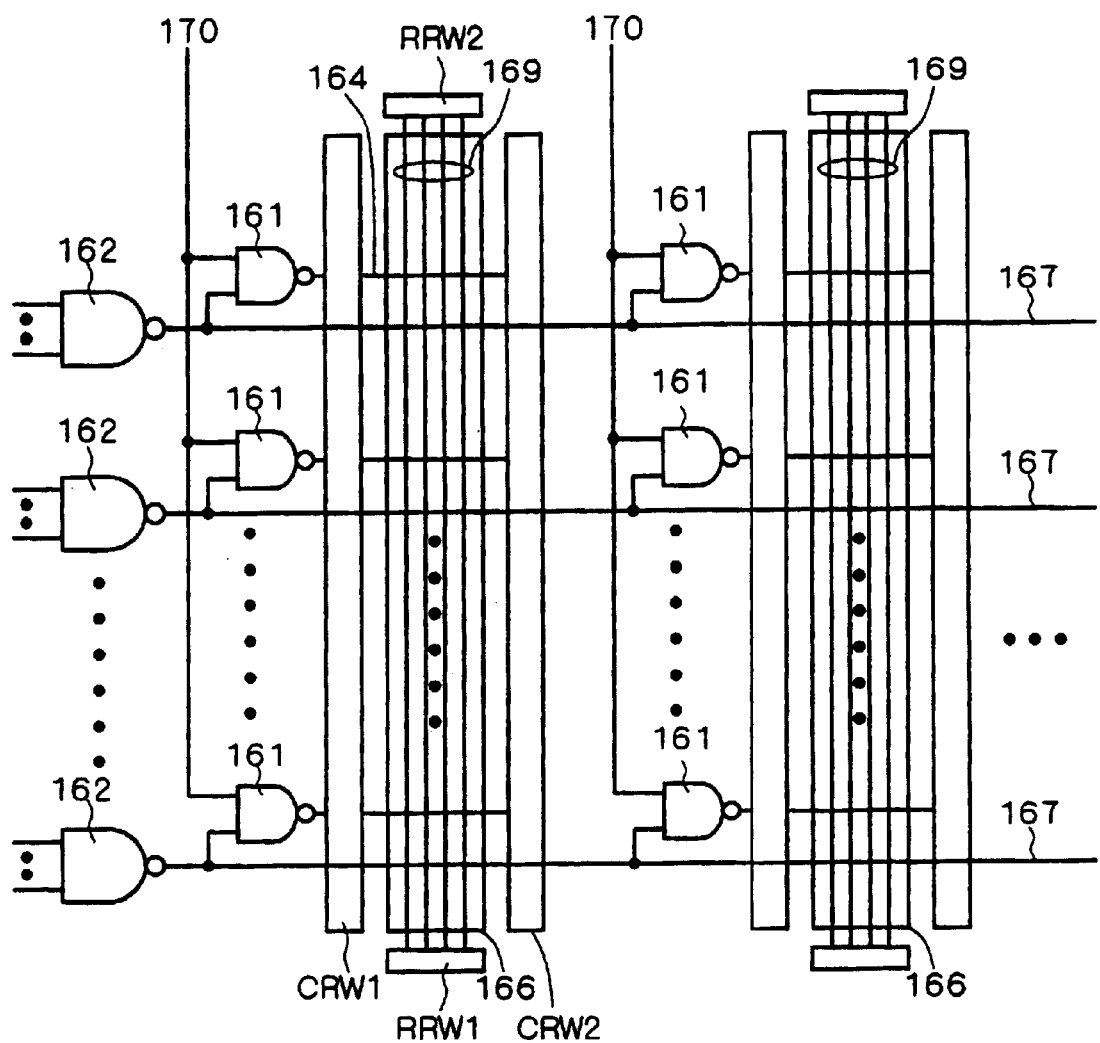
FIG. 37 is a block diagram showing a configuration with the bit lines divided in the MRAM in accordance with the third preferred embodiment of the present invention.

FIG. 37 is a block diagram showing a configuration of an MRAM 600 in which the bit lines are divided. The MRAM 600 has a plurality of MRAM cell arrays 166, as shown in FIG. 37.

Each MRAM cell array 166 has the row read/write first control circuit RRW1 connected to first ends of a plurality of word lines 160, the row read/write second control circuit RRW2 connected to second ends of the word lines 160, the column read/write first control circuit CRW1 connected to first ends of a plurality of bit lines 164 and the column read/write second control circuit CRW2 connected to second ends of the bit lines 164.

Further, these control circuits are the same as those of the MRAMs 100 to 300 in the second preferred embodiment of the present invention and given the same reference signs, but are not limited to these.

A plurality of memory cell array selecting lines 170 connected to a not-shown row decoder are provided, correspondingly to the MRAM cell arrays 166.

Outputs of a plurality of AND gates 162 constituting a column decoder are connected to main bit lines 167, respectively. Further, the number of main bit lines 167 is equal to the number of bit lines in each MRAM cell array 166.

Two-input NAND gates 161 whose inputs are the memory cell array selecting line 170 and the main bit line 167 are connected at intersections of a plurality of memory cell array selecting lines 170 and a plurality of main bit lines 167, and outputs thereof are connected to sub-bit lines 164 through the column read/write first control circuit CRW1. The sub-bit lines 164 correspond to the bit lines of each MRAM cell array 166.

<C-3-2. Device Operation>

Discussion will be made below on an operation of the MRAM 600.

For example, when one of the memory cell array selecting lines 170 and one of the main bit lines 167 become active, the NAND gate 161 connected to the active memory cell array selecting line 170 and the active main bit line 167 activates the sub-bit line 164 connected to its output.

In this case, since the active main bit line 167 is not directly connected to the MRAM cell, its capacitance does not include the capacitance of the MRAM cells constituting the MRAM cell array 166. Accordingly, the capacitance contained in the bit line is greatly reduced as compared with a configuration in which an MRAM cell is selected by one bit line across a plurality of MRAM cell arrays.

Moreover, by shortening the sub-bit line 164 only across one MRAM cell array 166 so that the delay (CR delay) caused by the capacitance and the resistance may become negligible, the MRAM 600 allows substantial reduction in time to select a specified MRAM cell, thereby improving its operation speed.

Since the capacitance of the MRAM cell has been discussed by using Eq. (11), the redundant discussion will be omitted. In the MRAM 600 of FIG. 37, since only the MRAM cells connected to the sub-bit lines 164 in the selected MRAM cell array 166 are accessed, the current flowing between the sub-bit lines 164 and the word lines 169 decreases in proportion to the inverse number of the number of MRAM cell arrays as compared with the configuration in which the bit lines are not divided, and the power consumption can be cut.

Further, though the NAND gate is used in the MRAM 600 as a logic gate to control the sub-bit lines 164, such a logic gate is not limited to a NAND gate and other logic gates such as AND gate, NOR gate and XOR gate may be used to produce the same effect as the MRAM 600 by inputting combination of a logic representing "High" or "Low" of the memory cell array selecting line 170 and the main bit line 167 and the inverse logic (representing "Low" or "High") thereto. Herein, "High" and "Low" of logic each correspond to high value or low value of each signal voltage.

<C-4. Hierarchization of Bit Lines>

<C-4-1. Device Structure>

Figure 38:
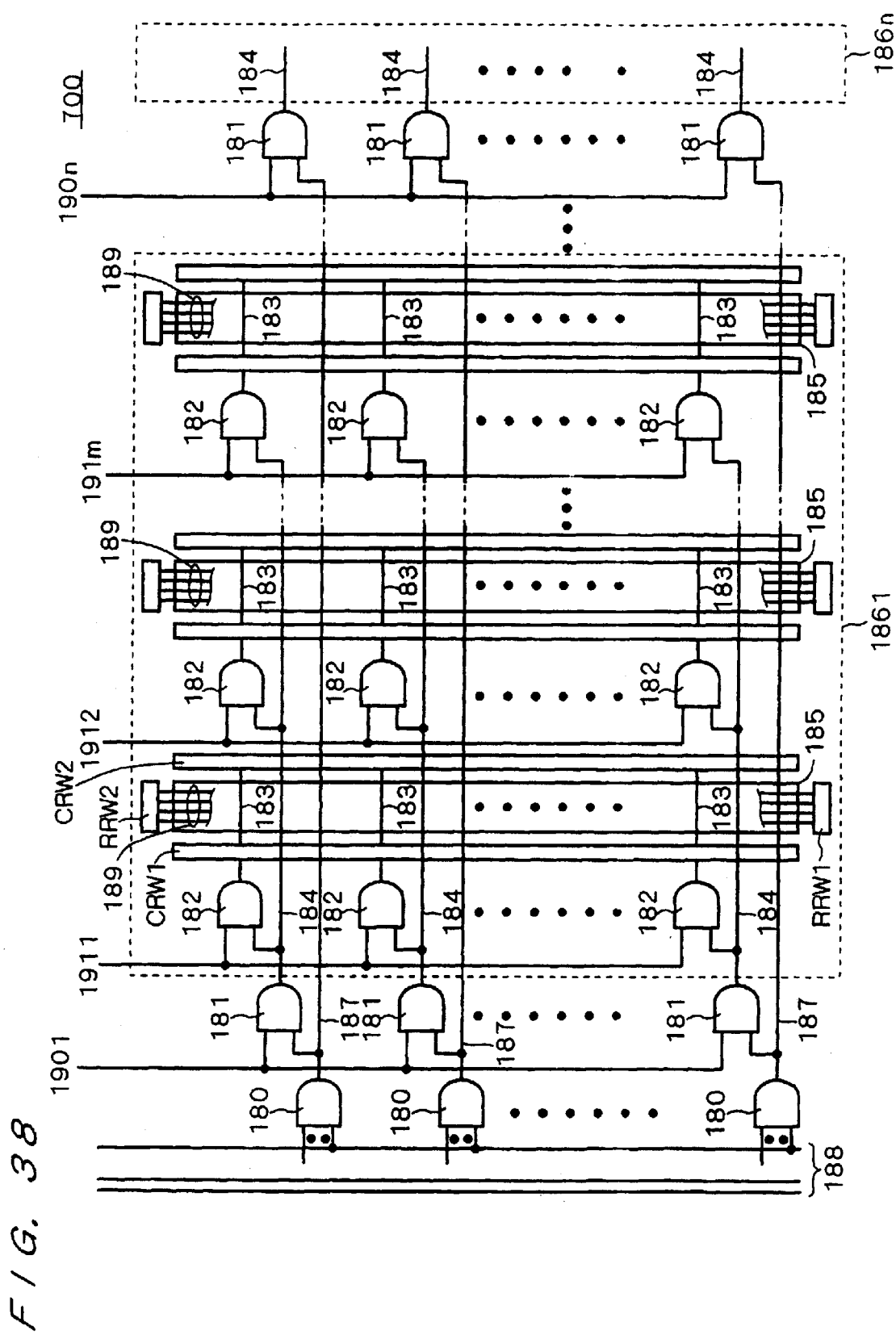
FIG. 38 is a block diagram showing a configuration with the bit lines hierarchized in the MRAM in accordance with the third preferred embodiment of the present invention.

FIG. 38 is a block diagram showing a configuration of an MRAM 700 in which the bit lines are hierarchized. As shown in FIG. 38, the MRAM 700 comprises n memory cell array groups 186*l* to 186*n* each having m MRAM cell arrays 185.

Taking the memory cell array group 186*l* as an example, each MRAM cell array 185 has the row read/write first control circuit RRW1 connected to first ends of a plurality of word lines 189, the row read/write second control circuit RRW2 connected to second ends of the word lines 189, the column read/write first control circuit CRW1 connected to first ends of a plurality of bit lines 183 and the column read/write second control circuit CRW2 connected to second ends of the bit lines 183.

Further, m memory cell array selecting lines 191*l* to 191*m* connected to a not-shown row decoder are provided, correspondingly to the MRAM cell arrays 185.

Outputs of a plurality of AND gates (sub-global decoders) 181 are connected to main bit lines 184, respectively.

Further, the number of main bit lines 184 is equal to the number of bit lines in each MRAM cell array 185.

Two-input AND gates (local row decoder) 182 whose inputs are any one of the memory cell array selecting lines 191*l* to 191*m* and one of the main bit lines 184 are connected at intersections of the memory cell array selecting lines 191*l* to 191*m* and a plurality of main bit lines 184, and outputs thereof are connected to sub-bit lines 183 through the column read/write first control circuit CRW1. The sub-bit lines 183 correspond to the bit lines of each MRAM cell array 185.

Further, all first inputs of the sub-global decoders 181 are connected in common to the memory cell array group selecting line 190*l* provided correspondingly to the memory cell array group 186*l*.

Second inputs of the sub-global decoders 181 are connected to outputs of a plurality of AND gates (main global decoders) 180 through global bit lines 187 connected thereto, respectively.

The memory cell array group selecting lines 190*l* to 190*n* are different from the global bit lines 187, and these lines are so provided as to intersect each other.

Further, other memory cell array groups each have the same configuration as the memory cell array group 186*l*, being connected to a plurality of sub-global decoders 181, and the sub-global decoders 181 are connected to the memory cell array group selecting line.

Specifically, the memory cell array group selecting lines 190*l* to 190*n* are provided correspondingly to the memory cell array groups 186*l* to 186*n*, second inputs of the sub-global decoders 181 connected to the memory cell array groups 186*l* to 186*n* are connected to outputs of a plurality of main global decoders 180 through the global bit lines 187.

Further, a plurality of main global decoders 180 are connected to an address signal line group 188.

<C-4-2. Device Operation>

Discussion will be made below on an operation of the MRAM 700.

One of the memory cell array groups 186*l* to 186*n* is selected by the memory cell array group selecting lines 190*l* to 190*n* and one of a plurality of MRAM cell arrays 185 in each of the memory cell array groups 186*l* to 186*n* is selected by the memory cell array selecting lines 191*l* to 191*m*.

An operation of the memory cell array groups 186*l* to 186*n* is the same as that of the MRAM 600 discussed referring to FIG. 37, and for example, when the memory cell array selecting line 191*l* and one of the main bit lines 184 become active, the AND gate 182 connected to the active memory cell array selecting line 191*l* and the active main bit line 184 activates the sub-bit line 183 connected to its output.

In this case, since the capacitance of the active main bit line 184 does not include the capacitance of the MRAM cells constituting the MRAM cell array 185, the capacitance contained in the bit line is greatly reduced as compared with the background-art MRAM in which an MRAM cell is selected by one bit line across a plurality of MRAM cell arrays.

Further, for example, when the memory cell array group selecting line 190*l* and one of the global bit lines 187 become active, the AND gate 181 connected to the active memory cell array group selecting line 190*l* and the active global bit line 187 activates the main bit line 184 connected to its output.

In this case, since the capacitance of the active global bit line 187 does not include the capacitance of the MRAM cell arrays 185 constituting one of the MRAM cell array groups 186l to 186n, the capacitance contained in the bit line is greatly reduced as compared with a configuration in which an MRAM cell is selected by one bit line across a plurality of MRAM cell array groups.

Accordingly, the current between the bit lines 183 and the word lines 189 is not only reduced in proportion to the inverse number of the number of MRAM cell arrays as compared with the background-art MRAM in which the bit lines are not hierarchized but also reduced in proportion to the inverse number of the number of MRAM cell array groups, and the power consumption can be thereby cut.

Though division and hierarchization of either the word lines or the bit lines have been discussed in the third preferred embodiment, combining these cases, a configuration with both the word lines and the bit lines divided and a configuration with the word lines and the bit lines hierarchized are possible. These configurations allow further reduction in power consumption and further improvement in operation speed of the MRAM.

<D. The Fourth Preferred Embodiment>

<Characteristic Feature of the Fourth Preferred Embodiment>

An MRAM in accordance with the fourth preferred embodiment of the present invention characteristically performs a batch erasing or a batch writing of data stored in a plurality of MRAM cells, using a magnetic field generated by an inductor.

<D-1. Device Structure>

Figure 39:
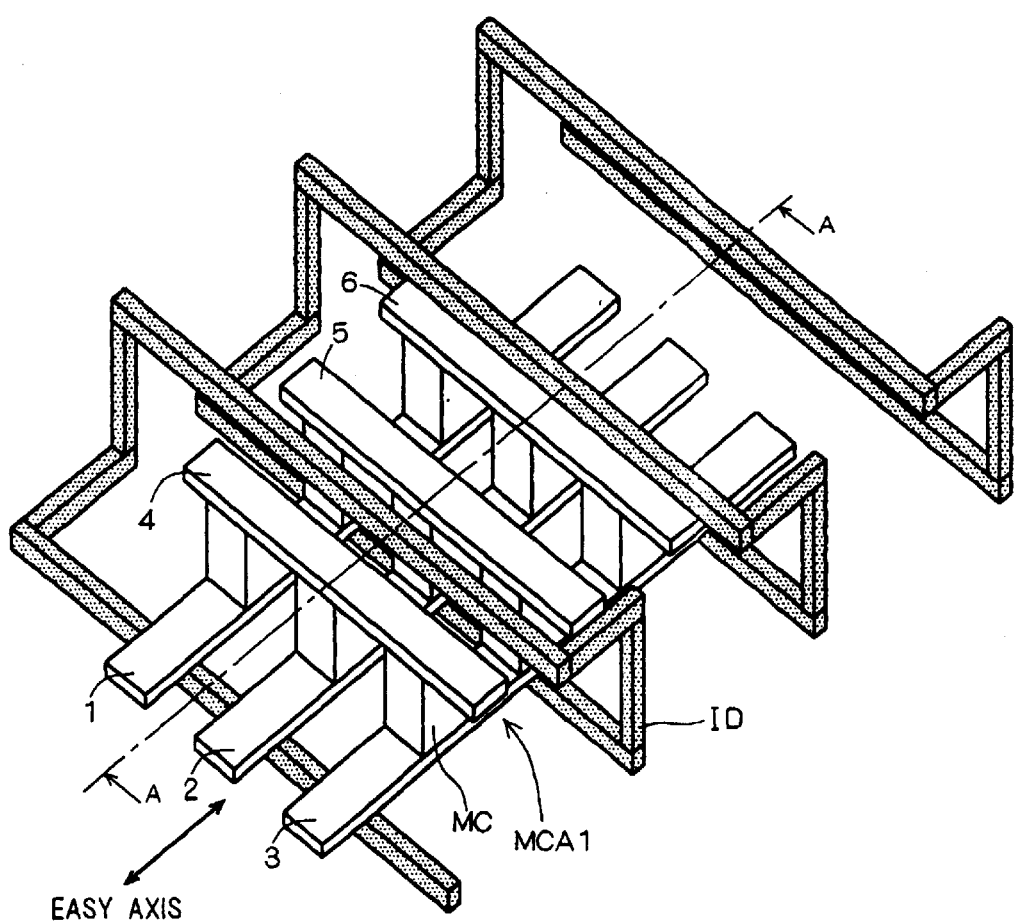
FIG. 39 is a perspective view showing a structure of an MRAM in accordance with a fourth preferred embodiment of the present invention.

FIG. 39 is a perspective view showing a structure of an MRAM 800 in accordance with the fourth preferred embodiment of the present invention. In FIG. 39, the word lines 1, 2 and 3 are provided in parallel to one another and bit lines 4, 5 and 6 are provided in parallel to one another, intersecting the word lines thereabove, and the MRAM cells MC are formed at intersections of the word lines and the bit lines therebetween, constituting an MRAM cell array MCA1.

Though the structure of the MRAM cell MC has been discussed referring to FIG. 1 and a redundant discussion will be omitted, the direction of the easy axis of the soft ferromagnetic layer which is a constituent element of the MRAM cell MC is a direction of extension of the word lines as indicated by the arrow.

A coil-like inductor ID is so provided as to surround the MRAM cell array MCA1.

The inductor ID is made of metal wires connected in a coil shape, winding along the direction of extension of the word lines 1 to 3.

An inductor driving circuit (not shown) capable of carrying bidirectional currents is connected to both ends of the inductor ID, allowing change in direction of the magnetic field generated in a region surrounded by the inductor ID by changing the direction of the current flowing in the inductor ID. The direction of the magnetic field generated by the inductor ID almost coincide with the direction of extension of the word lines 1 to 3, i.e., the direction of the easy axis of the soft ferromagnetic layer included in the MRAM cell MC.

Accordingly, when the batch erasing or the batch writing of data is performed on a plurality of MRAM cells MC in the MRAM cell array MCA1, a current of predetermined direction is passed through the inductor ID from the inductor driving circuit and the magnetic field generated thereby simultaneously changes the directions of spins of the soft ferromagnetic layer.

Though FIG. 39 shows 3-row and 3-colum memory cell array, for convenience of illustration, the size of rows and columns is not limited to this example.

Further, though an insulator of gas or solid is provided between the conductive lines, such as the inductor ID, the word lines 1 to 3 and the bit lines 4 to 6, the insulator is omitted in FIG. 39, for convenience of illustration.

Furthermore, though the winding pitch of the inductor ID is larger than the pitch of the MRAM cell array MCA1 in FIG. 39 for convenience of illustration, it is not limited to this.

No particular limitation is put on the structure of the MRAM cell MC and a structure having the double magnetic tunnel junction shown in FIG. 30, for example, is possible only if it has at least one magnetic tunnel junction. For example, a memory cell having a structure of magnetic material/non-magnetic material/magnetic material, in which a magnetic flux is looped by at least one magnetic tunnel junction and a magnetostatic coupling, may be used.

Further, the inductor is not limited to a coil-like shape, only if it can generate a magnetic field whose direction coincides with the direction of the easy axis of the soft ferromagnetic layer.

Now, discussion will be made on an operation of the MRAM 800, referring to the cross sections, FIGS. 40 to 42, taken along the line A—A of FIG. 39. The winding pitch of the inductor ID is different from that shown in FIG. 39, for convenience of illustration.

Figure 40:
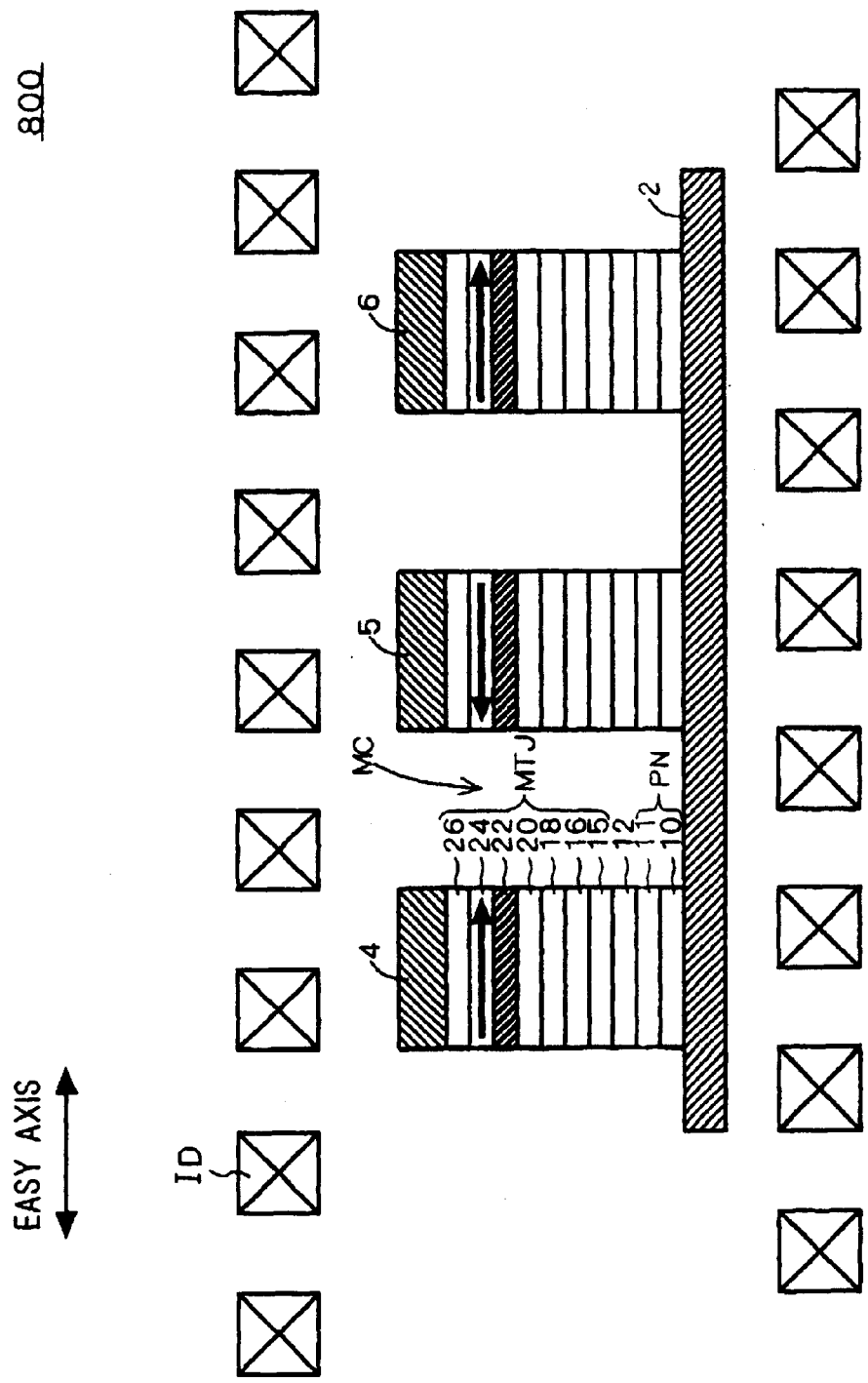
FIGS. 40 to 42 are cross sections illustrating an operation of the MRAM in accordance with the fourth preferred embodiment of the present invention.

FIG. 40 shows an exemplary state before the batch erasing. As shown in FIG. 40, the MRAM cell MC has a structure in which the magnetic tunnel junction (MTJ) is provided above the pn-junction diode. The direction of spin of the soft ferromagnetic layer 22 included in the MRAM cell MC below the bit line 5 is leftward in this figure, and the directions of the spins in other MRAM cells MC are rightward. In the state where neither the batch erasing nor the batch writing is performed, i.e., on standby of the inductor ID, the inductor ID is ground. This blocks external noises, protecting the MRAM cell array MCA1.

Figure 41:
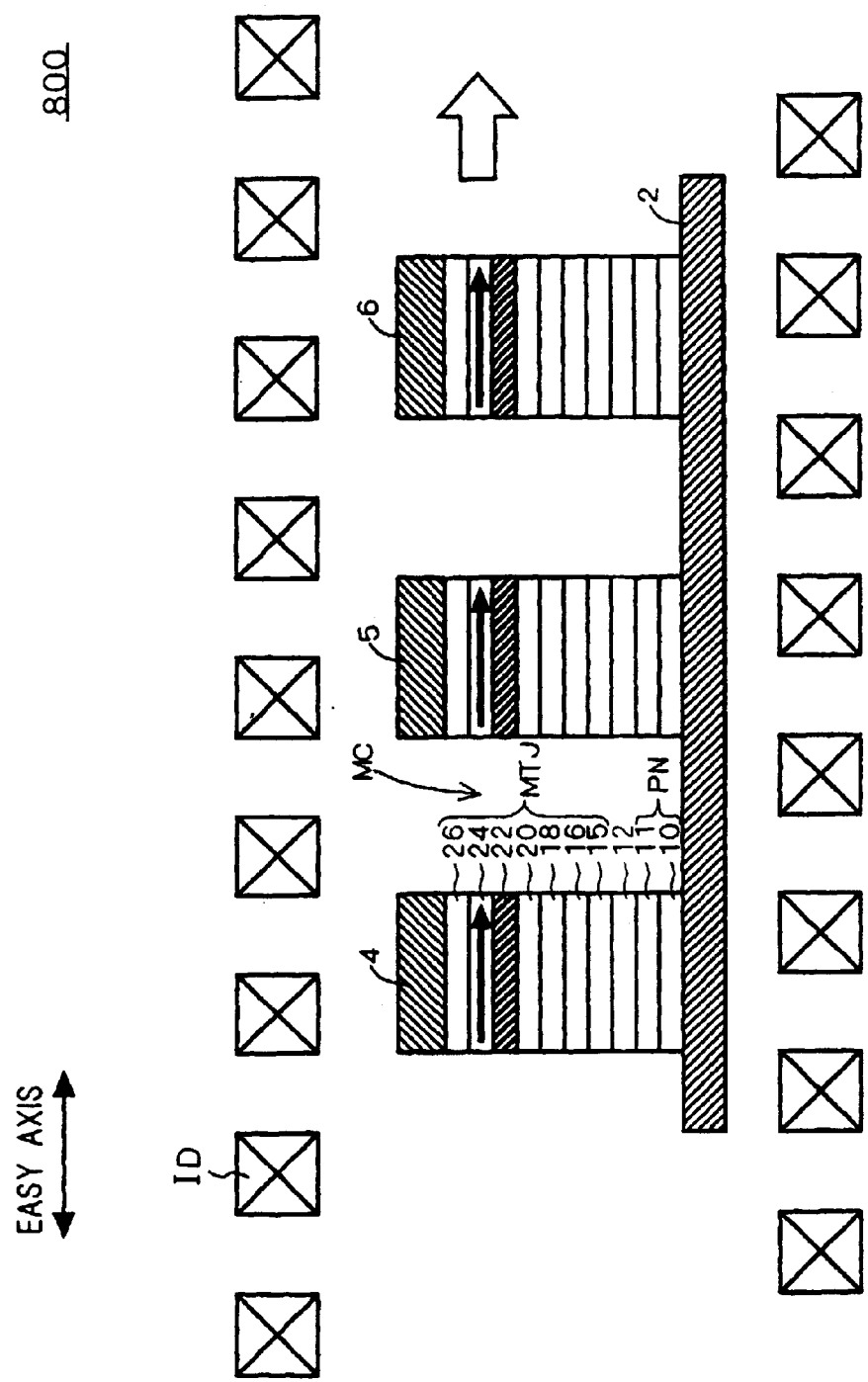

FIG. 41 shows an exemplary state of batch erasing. When a signal indicating batch erasing is inputted to the inductor driving circuit, a current of first direction flows in the inductor ID and a rightward magnetic field is generated as indicated by the arrow. At this time, as the pitch of the inductor ID is narrower, an external leak of the magnetic field inside the inductor is more reduced and the magnetic field is efficiently generated.

Herein, assuming that the direction of spin for erasing is rightward in this figure, the spins of the soft ferromagnetic layers 22 in all the MRAM cells MC are simultaneously directed rightward by the rightward magnetic field generated inside the inductor, and data are thereby simultaneously erased.

Figure 42:
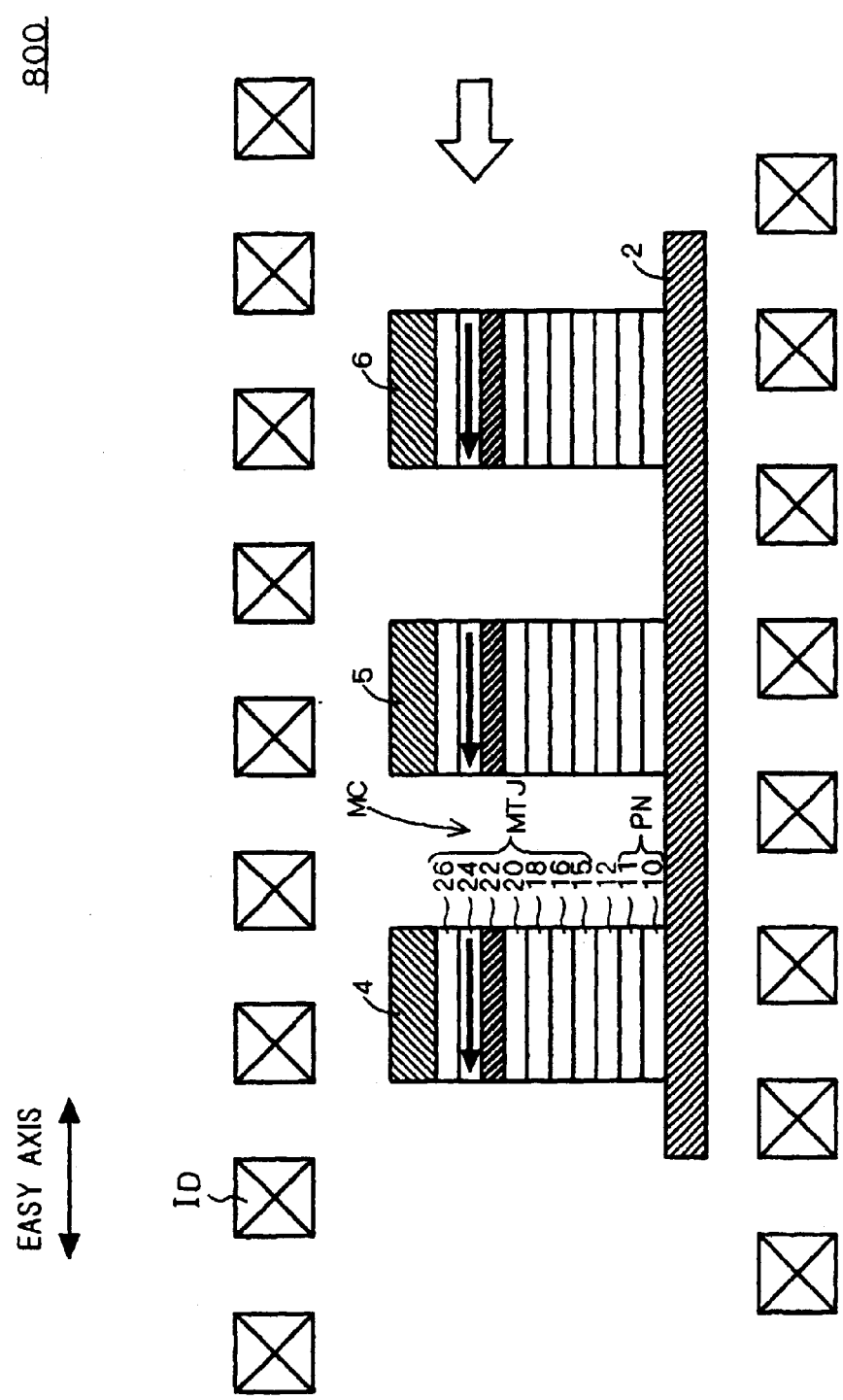

FIG. 42 shows an exemplary state of batch writing. When a signal indicating batch writing is inputted to the inductor driving circuit, a current of second direction opposite to the first direction flows in the inductor ID and a leftward magnetic field is generated as indicated by the arrow.

Herein, assuming that the direction of spin for writing is leftward in this figure, the spins of the soft ferromagnetic layers 22 in all the MRAM cells MC are simultaneously directed leftward by the leftward magnetic field generated inside the inductor, and data are thereby simultaneously written.

<D-2. Action and Effect>

When the batch erasing or the batch writing of data stored in a plurality of MRAM cells is performed, erasing or writing of stored data by selecting the addresses one by one with the word lines and the bit lines takes long time and needs large power consumption.

On the other hand, in the MRAM of the fourth preferred embodiment, short-time processing is realized as the batch erasing or the batch writing of data in a plurality of MRAM cells can be performed, and the power consumption can be cut as the magnetic field is efficiently generated by the inductor ID.

<D-3. Variation>

For the batch erasing or the batch writing of data store in a plurality of MRAM cells, other structure than the inductor may be adopted.

Figure 43:
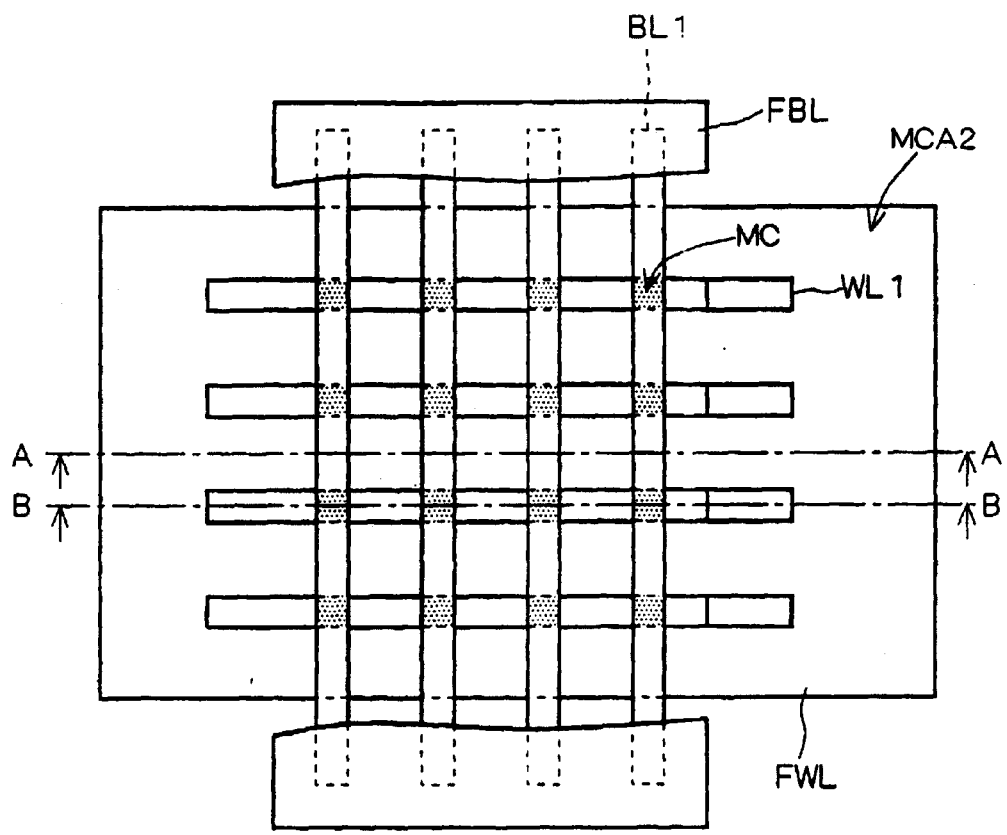
FIG. 43 is a plan view showing a structure of a variation of the MRAM in accordance with the fourth preferred embodiment of the present invention.

FIG. 43 is a plan view showing a structure of an MRAM 900 as a variation of the fourth preferred embodiment. Though FIG. 43 shows 4-row and 4-colum MRAM cell array MCA2, for convenience of illustration, the size of rows and columns is not limited to this example.

As shown in FIG. 43, a flash bit line FBL and a flash word line FWL used for batch processing of data are provided above and below the MRAM cell array MCA2.

The flash bit line FBL and the flash word line FWL are provided correspondingly to an entire region in which a plurality of bit lines BL1 and a plurality of word lines WL1 are arranged, both having a rectangular shape in a plan view in FIG. 43.

In FIG. 43, the bit lines BL1 intersect the word lines WL1 thereabove, and the MRAM cells MC are provided at intersections of the word lines WL1 and the bit lines BL1 therebetween.

The flash word line FWL is provided below the word lines WL1 and the flash bit line FBL is provided above the bit lines BL1. Further, in FIG. 43, the flash bit line FBL at the top is partially omitted, for convenience of illustration.

Figure 44:
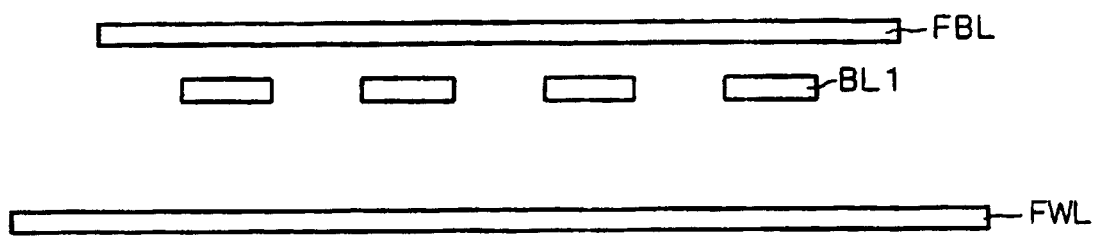
FIGS. 44 and 45 are cross sections showing structures of variations of the MRAM in accordance with the fourth preferred embodiment of the present invention.
Figure 45:
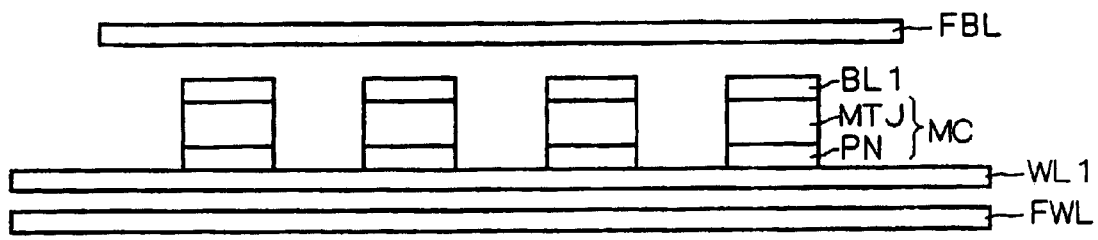

FIGS. 44 and 45 shows cross sections taken along the lines A—A and B—B of FIG. 43, respectively.

As shown in FIG. 45, the MRAM cell MC has a structure in which the magnetic tunnel junction (MTJ) is provided above the pn-junction diode PN.

Thus, the flash bit line FBL and the flash word line FWL are provided above and below the MRAM cell array MCA2, and in batch erasing or batch writing, a current of predetermined direction is passed through the flash bit line FBL and the flash word line FWL, simultaneously directing the spins of the soft ferromagnetic layers in all the MRAM cells MC to the same direction, to realize the batch erasing or the batch writing.

Further, the direction of current flowing in the flash bit line FBL and the flash word line FWL for the batch erasing or the batch writing may be the same as that flowing in the bit lines BL and the word lines WL in erasing or writing data individually.

Furthermore, a structure having both the flash bit line FBL and the flash word line FWL may be used and a structure having either one of these lines may be also used. Specifically, since the generated magnetic field is proportional to the magnitude of the current, when a large amount of current is carried, it is possible to reverse the spins even if either one of these lines is used.

When both of the flash bit line FBL and the flash word line FWL are used and magnetic fields of the same magnitude are generated by these lines, the total amount of current required to reverse the spins is reduced.

Further, in the state where neither the batch erasing nor the batch writing is performed, i.e., on standby of the flash bit line FBL and the flash word line FWL, grounding the flash bit line FBL and the flash word line FWL blocks external noises, which produces an effect of protecting the MRAM cell array MCA2.

Furthermore, though the MRAM 900 discussed above has a structure having one MRAM cell array MCA2, a structure having a plurality of MRAM cell arrays is applicable. This structure is shown in FIG. 46 as an MRAM 900A.

Figure 46:
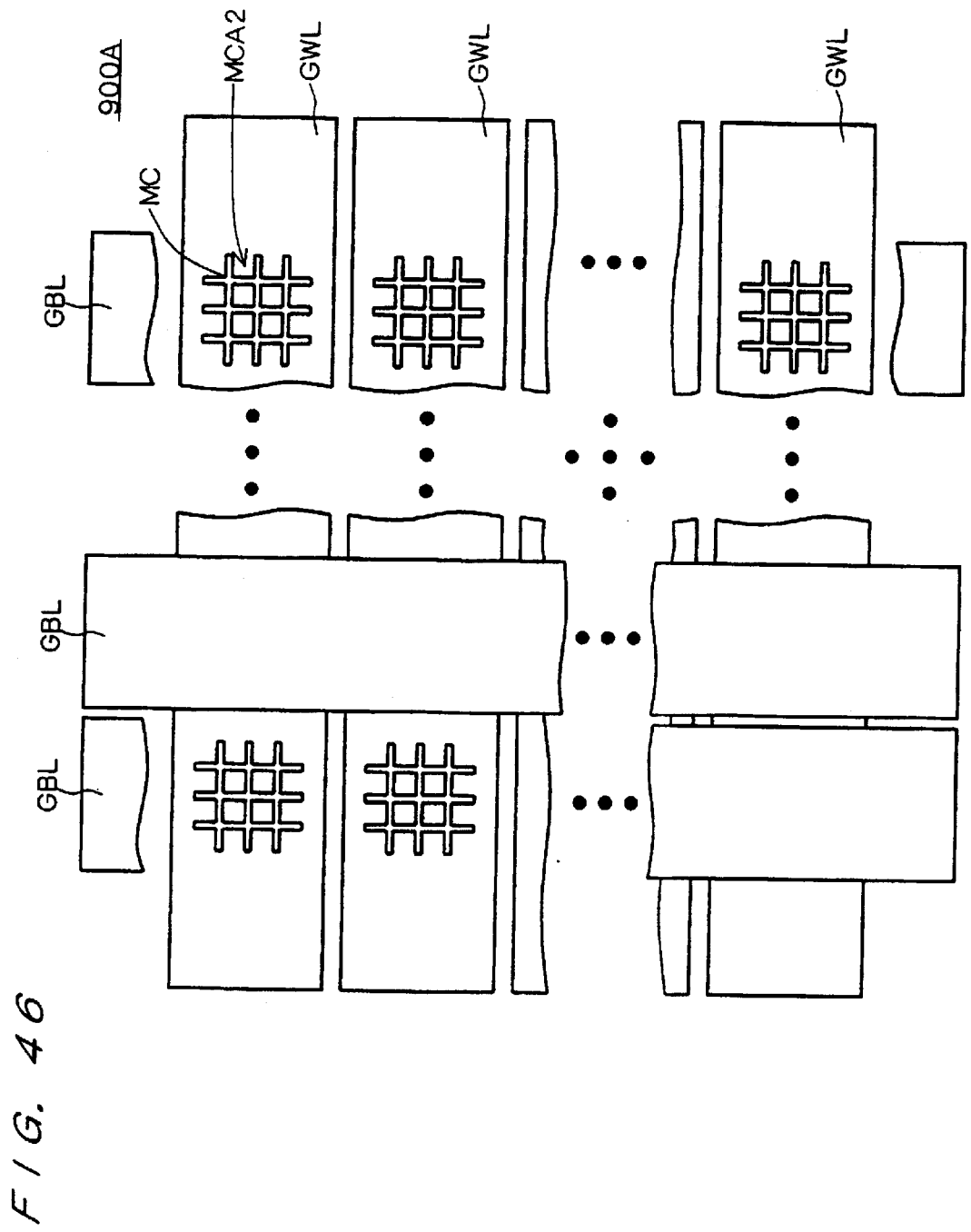
FIG. 46 is a plan view showing a structure of a variation of the MRAM in accordance with the fourth preferred embodiment of the present invention.

As shown in FIG. 46, in the MRAM 900A, a plurality of MRAM cell arrays MCA2 are arranged in matrix, and global flash bit lines GBL and global flash word lines GWL used for the batch processing of data are arranged in matrix above and below the MRAM cell arrays MCA2, correspondingly to the arrangement thereof.

The global flash bit line GBL and the global word line GWL have the same function as the flash bit line FBL and the flash word line FWL shown in FIG. 43 though description on these lines will be omitted, and their names are changed because these lines are used for a plurality of MRAM cell arrays MCA2 in common.

Further, as control circuits for the flash bit line FBL, the flash word line FWL, the global flash bit line GBL and the global flash word line GWL discussed above, the row read/write first control circuit RRW1, the row read/write second control circuit RRW2, the column read/write first control circuit CRW1 and the column read/write second control circuit CRW2 shown in FIGS. 27, 31 and 33 may be used.

Furthermore, in the structure having a plurality of MRAM cell arrays MCA2 such as the MRAM 900A of FIG. 46, since there is a possibility that a current may flow in non-selected MRAM cell arrays MCA2 provided in the same column and the same row as the MRAM cell array MCA2 selected for the batch erasing or the batch writing, a technical concepts in division of the word lines, division of the bit lines, hierarchization of the word lines and hierarchization of the bit lines shown in FIGS. 34 to 38 may be applied to the global flash bit line GBL and the global flash word line GWL.

<E. The Fifth Preferred Embodiment>
<Characteristic Feature of the Fifth Preferred Embodiment>

Characteristic feature of an MRAM in accordance with the fifth preferred embodiment of the present invention lies in that LC resonant of an inductor and a capacitor is utilized to recycle a current so that the current may be used for one or more rewritings of stored data.

<E-1. Device Structure>

Figure 47:
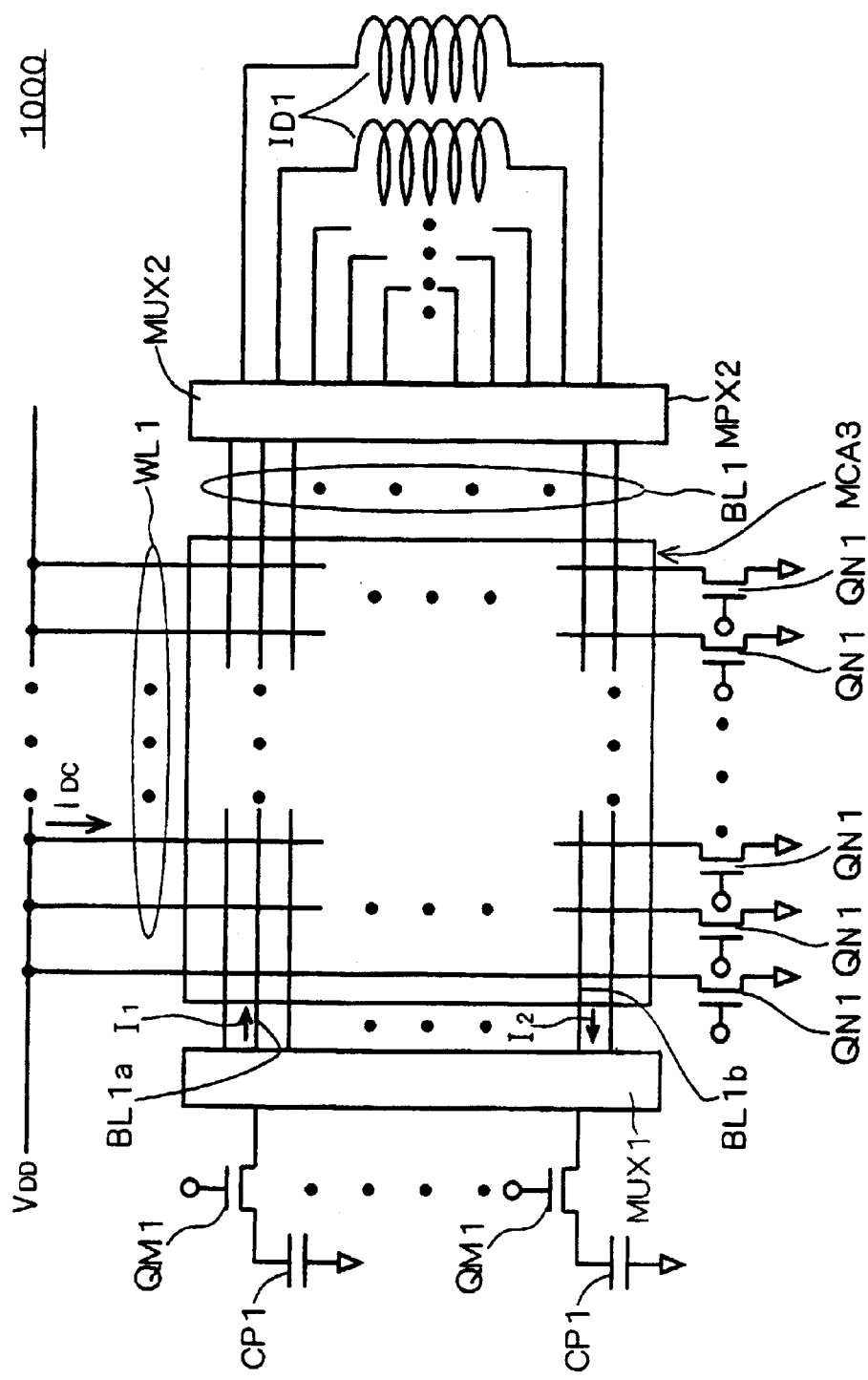
FIGS. 47 and 48 are plan views each showing a configuration of an MRAM in accordance with a fifth preferred embodiment of the present invention.

FIG. 47 is a plan view showing a configuration of an MRAM 1000 in accordance with the fifth preferred embodiment of the present invention. In FIG. 47, a multiplexer MUX1 is connected to first ends of a plurality of bit lines BL1 in an MRAM cell array MCA3 and a multiplexer MUX2 is connected to second ends thereof. Further, a drain voltage $V_{DD}$ is given to first ends of a plurality of word lines WL1 and the NMOS transistor QN1 is connected to second ends thereof.

Furthermore, a plurality of NMOS transistors QM1 provided correspondingly to the number of bit lines BL1 are connected to the multiplexer MUX1 and source electrodes of the NMOS transistors QM1 are connected to capacitors CP1.

The multiplexer MUX2 has such a structure as to connect one inductor ID1 to two bit lines BL1, and consequently the multiplexer MUX2 is connected to the inductors ID1 of which number is half the number of bit lines BL1.

Further, though the column decoder, the row decoder and the control circuits shown in FIG. 26 are connected to the bit lines BL1 and the word lines WL1, these elements, which have few relation with this preferred embodiment, are not shown in this figure or described for simple discussion.

<E-2. Device Operation>

Next discussion will be made on an operation of the MRAM 1000. Hereinafter, the bit lines BL1 are distinguished from one another, being represented by reference signs BL1a and BL1b in some cases.

First, the word line WL1 at the selected address is selected and a DC current $I_{DC}$ flows in the selected word line WL1.

Next, the bit line BL1 at the selected address is selected by the multiplexer MUX1 and a writing current $I_1$ flows in the multiplexer MUX2 through the selected bit line BL1a. In this case, the inductor ID1 connected to the selected bit line BL1a is selected by the multiplexer MUX2 and the energy of the writing current $I_1$ is conserved in the inductor ID1 as a magnetic field.

Selecting the other one of the bit lines BL1 connected to the inductor ID1 by the multiplexer MUX2 allows the writing current $I_1$ flowing in the inductor ID1 to flow in the selected bit line BL1b, being recycled as a current $I_2$.

The current $I_2$ flows through the multiplexer MUX1, to be accumulated in a free capacitor CP1 as electric charges, and by approximately connecting the capacitor CP1 to the multiplexers MUX1 and MUX2 again, writing can be performed whatever number of times in principle.

Further, ON/OFF of a plurality of NMOS transistors QM1 is controlled in accordance with the timings of charge and discharge of the capacitor CP1, and ON/OFF of a plurality of NMOS transistors QN1 is controlled in accordance with the timing of carrying the DC current $I_{DC}$ to the word lines WL1.

<E-3. Action and Effect>

As discussed above, recycling of the writing current in the bit lines BL1 by utilizing the LC resonant of the inductor ID1 and the capacitor CP1 allows reduction of the power consumption in writing.

<E-4. Variation>

Figure 48:
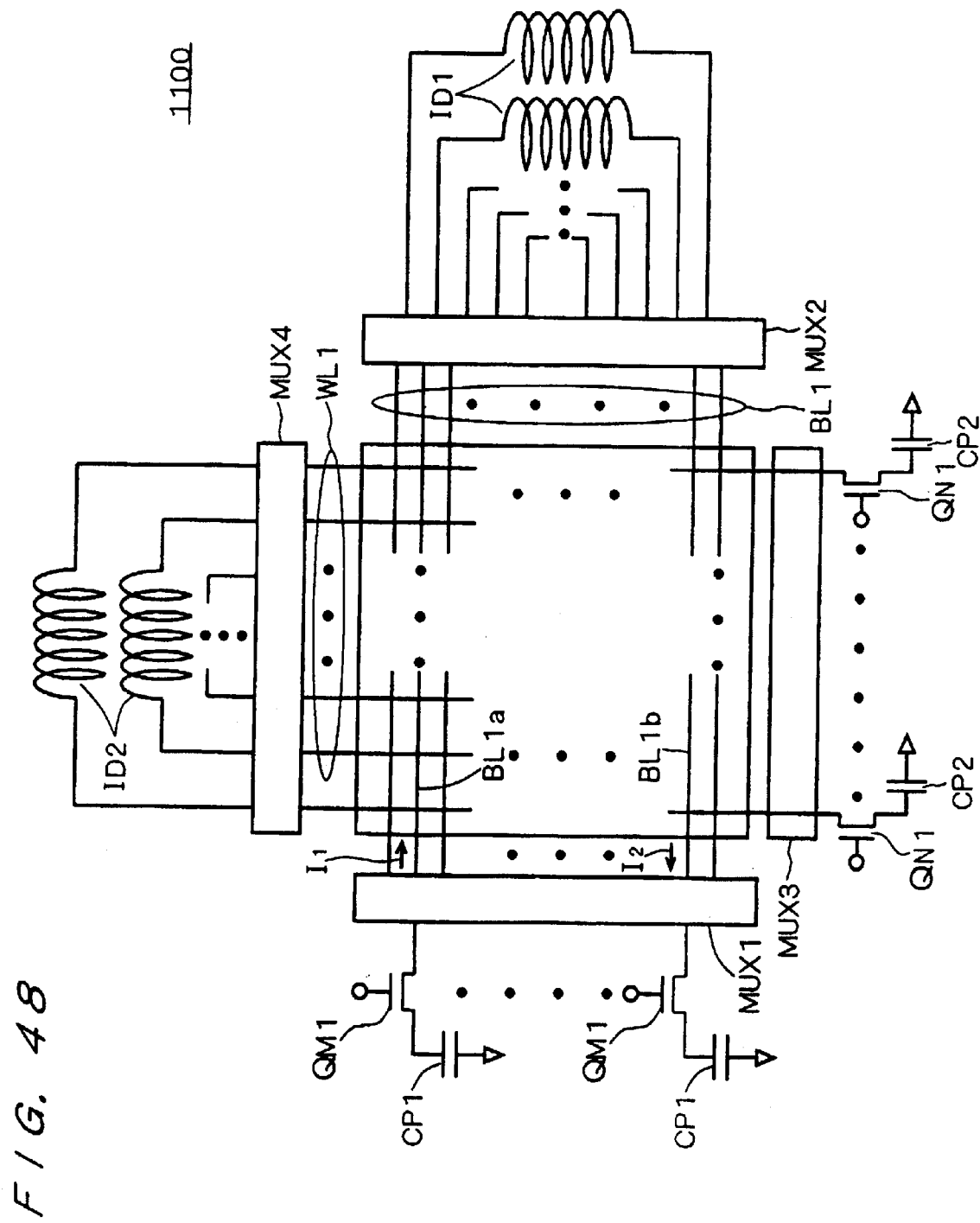

FIG. 48 is a plan view showing a configuration of an MRAM 1100 as a variation of the fifth preferred embodiment. In the MRAM 1100, additionally to the arrangement of the MRAM 1000 shown in FIG. 47, a multiplexer MUX3 is connected to first ends of a plurality of word lines WL1 in the MRAM cell array MCA3 and a multiplexer MUX4 is connected to second ends thereof.

Further, a plurality of NMOS transistors QN1 provided correspondingly to the number of word lines WL1 are connected to the multiplexer MUX3 and source electrodes of the NMOS transistors QN1 are connected to capacitors CP2.

Furthermore, the multiplexer MUX4 has such a structure as to connect one inductor ID2 to two word lines WL1, and consequently the multiplexer MUX4 is connected to the inductors ID2 of which number is half the number of word lines WL1.

In the MRAM 1100 having such a structure, not only the writing current in the bit lines BL1 but also the writing current in the word lines WL1 can be recycled by utilizing the LC resonant of the inductor ID2 and the capacitor CP2, and therefore the power consumption caused by consumption of the writing current can be further reduced.

Further, since the recycling operation utilizing the LC resonant of the inductor ID2 and the capacitor CP2 is the same as that utilizing the LC resonant of the inductor ID1 and the capacitor CP1, discussion thereof will be omitted.

Furthermore, currents consumed in the inductor ID1 and the capacitor CP1, and the inductor ID2 and the capacitor CP2 are compensated by a general current sensing compensation circuits provided in the multiplexers MUX1 to MUX4.

As the inductors ID1 and ID2, for example, a spiral inductor made of wire wound in spiral may be used.

The structures shown in FIGS. 47 an 48 are examples, and a structure of this preferred embodiment is not limited to the above ones, only if it can ensure recycling of the writing current by utilizing the LC resonant.

<F. The Sixth Preferred Embodiment>

<Characteristic Feature of the Sixth Preferred Embodiment>

Characteristic feature of a magnetic substrate in accordance with the sixth preferred embodiment of the present invention lies in that a multilayer film which is to become a magnetic tunnel junction (MTJ) is formed on its main surface in advance.

<F-1. Substrate Structure>

FIG. 49 shows a cross-sectional structure of a magnetic substrate in accordance with a sixth preferred embodiment of the present invention. In FIG. 49, entirely over a main surface of a silicon substrate SB, an insulating layer IL1 such as a silicon oxide film or a silicon nitride film is formed and a conductive layer ML1 which is to become word lines or bit lines later is formed thereon.

On the conductor layer ML1, an n-type silicon layer SF1 having an n-type impurity of relatively high concentration and a p-type silicon layer SF2 having a p-type impurity of relatively high concentration are layered. These two layers are to become a pn-junction diode later.

On the p-type silicon layer SF2, a tungsten layer STD which is to become a tungsten stud later, and the multilayer film which is to become the MTJ later is formed on the tungsten layer STD.

Specifically, the multilayer film comprises a template layer TPL made of platinum (Pt), an initial ferromagnetic layer IFL (having a film thickness of 4 nm) made of permalloy of $Ni_{81}Fe_{19}$, a diamagnetic layer AFL (having a film thickness of 10 nm) made of $Mn_{54}Fe_{46}$, a ferromagnetic layer FFL (having a film thickness of 8 nm) made of permalloy of CoFe or $Ni_{81}Fe_{19}$, a tunnel barrier layer TBL made of $Al_2O_3$, a soft ferromagnetic layer FML made of a multilayer film consisting of CoFe having a film thickness of 2 nm and $Ni_{81}Fe_{19}$ having a film thickness of 20 nm, and a contact layer CL made of Pt from the bottom.

Further, a conductor layer ML2 which is to become the word lines or bit lines later is formed on the contact layer CL and at the top, an insulating film IL2 is formed as an antioxidizing film for metal layers.

If such the magnetic substrate is sold, a user can form, e.g., the MRAM cell array MCA1 shown in FIG. 39 by patterning, such as argon ion milling, with a photoresist mask.

<F-2. Action and Effect>

Thus, if the magnetic substrate in which the multilayer film which is to become the pn-junction diode and the MTJ is formed on its main surface in advance is sold by a substrate maker, the user who uses this magnetic substrate can omit some manufacturing process, cutting some manufacturing cost as compared with a case of forming the multilayer film on a main surface of a simple silicon substrate.

<F-3. Variation>

Figure 50:
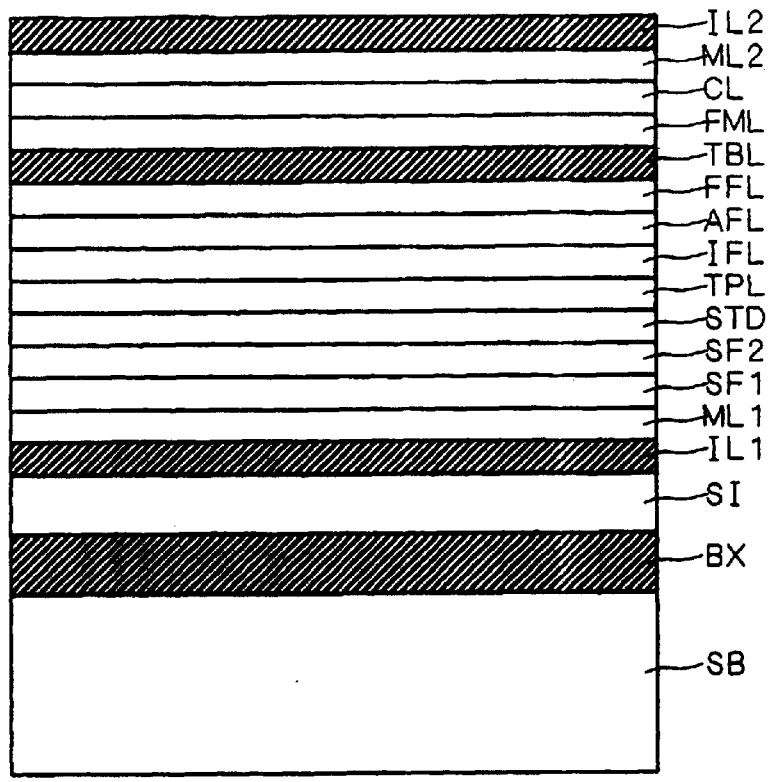

FIG. 50 shows a magnetic substrate in which a multilayer film which is to become the pn-junction diode and the MTJ is formed on a main surface of a SOI (Silicon On Insulator) substrate in advance.

In FIG. 50, a buried oxide film BX is formed on the silicon substrate SB and a SOI layer SI is formed on the buried oxide film BX. Then, on the SOI layer SI, the multilayer film shown in FIG. 49 is formed.

As discussed referring to FIGS. 31 and 33, a MOSFET is needed in an MRAM. Since parasitic capacitance can be reduced when the MOSFET is formed on the SOI layer, the operation speed of the MOSFET becomes faster and consequently that of the MRAM becomes faster.

Further, though the structure in which the multilayer film which is to become the magnetic tunnel junction is deposited on the bulk silicon substrate or the SOI substrate is shown and referred to as a magnetic substrate in the sixth preferred embodiment discussed above, the multilayer film which is to become the magnetic tunnel junction (multilayer film of thin-film magnetic material) may be deposited on a glass substrate or a resin substrate, and the kind of substrate serving as a base is not limited to a semiconductor substrate.

Therefore, in the present invention, a structure in which the multilayer film of thin-film magnetic material is deposited on some substrate serving as a base is referred to as a thin-film magnetic substrate.

<G. The Seventh Preferred Embodiment>
<Characteristic Feature of the Seventh Preferred Embodiment>

An MRAM in accordance with the seventh preferred embodiment of the present invention is characteristically formed on various function blocks which are formed on a main surface of a substrate.

<G-1. Device Structure>

Figure 51:
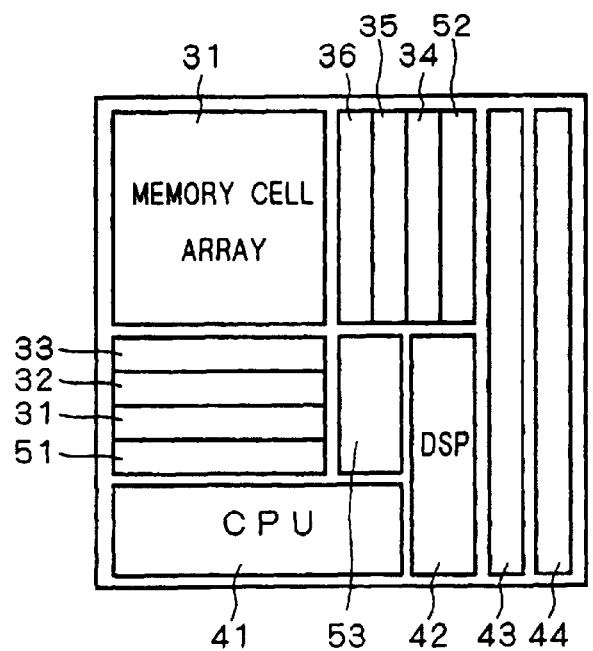
FIG. 51 is a block diagram showing a structure of a general MRAM.

First, for discussion on the difference from the seventh preferred embodiment, a structure of a background-art general MRAM is shown in a block diagram of FIG. 51.

In FIG. 51, as peripheral circuits of a memory cell array 31, a column address buffer 31, a column decoder 32, a column read/write control circuit 33, a row address buffer 34, a row decoder 35 and a row read/write control circuit 36 are provided around the memory cell array 31.

Further, as other function blocks, an I/O buffer for sending/receiving a signal to/from the outside of the device, an ESD (Electric Static Discharge) circuit 44 for resetting the transmitted signal to a rated value when the signal overshoots or undershoots the rated value, a modulator/demodulator 43 for modulating a signal or demodulating a modulated signal, a DSP (Digital Signal Processing) 42 for processing a digital signal, a first cache 51 and a second cache 52 for intervening data transmission (temporarily holding data) between the memory cell array 31 and the peripheral circuits or synchronizing the data transmission between the peripheral circuits and the memory cell array 31, an I/O controller 53 for controlling input/output of data to/from the memory cell array 31 and a CPU (micro processor) 41 for computing data.

The background-art semiconductor memory devices, such as DRAM, SRAM and EEPROM, have to be formed on a main surface of a semiconductor substrate since a memory cell array includes a MOSFET, and consequently the memory cell array and various function blocks are formed on a main surface of one semiconductor substrate.

Now, a structure of an MRAM 1200 in accordance with the seventh preferred embodiment of the present invention is shown in a block diagram of FIG. 52.

In FIG. 52, the MRAM cell array MCA is formed above a region for providing the peripheral circuits of the MRAM cell array MCA, i.e., the column address buffer CAB, the column decoder CD, the column read/write control circuit CRW, the row address buffer RAB, the row decoder RD and the row read/write control circuit RRW, overlapping the region.

Further, the constitution of the peripheral circuits is the same as that shown in FIG. 26, and other function blocks, which are the same as those in the background-art semiconductor memory device, will not be discussed.

<G-2. Action and Effect>

Since the MRAM cell array MCA does not include a MOSFET therein but include only the pn-junction diode as a semiconductor element as shown in FIGS. 28, 31 and 33, its formation region is not limited to a main surface of a substrate.

Therefore, other structures than the MRAM cell array MCA, i.e., various function blocks including the peripheral circuits of the MRAM cell array MCA are formed on a main surface of a substrate and the MRAM cell array MCA is formed thereon, to thereby cut the area of device.

<G-3. Variation>

A structure of an MRAM 1300 as a variation of the seventh preferred embodiment is shown in a block diagram of FIG. 53.

As shown in FIG. 53, in the MRAM 1300, the MRAM cell array MCA is formed entirely over a region for providing the peripheral circuits and various function blocks, overlapping the region.

Thus, providing the MRAM cell array MCA and the peripheral circuits and various function blocks in different layers increases degree of freedom in selection of location and size of the MRAM cell array MCA, reduces the area of device and ensures high selectivity of device layout.

<H. The Eighth Preferred Embodiment>
<Characteristic Feature of the Eighth Preferred Embodiment>

An MRAM in accordance with the eighth preferred embodiment of the present invention is characteristically provided in a form of MCP (Multi Chip Package) in which the MRAM cell array and its peripheral circuits and various function blocks are provided as different semiconductor chips and both chips are contained in one package as a module.

<Introduction>

The maximum formation temperature in manufacturing the peripheral circuits of the MRAM cell array and various function blocks is about 1000° C. to 1200° C. and on the other hand, the maximum formation temperature in manufacturing the MRAM cell array is about 400° C. to 700° C. depending on the Curie temperature.

When the MRAM cell array and the peripheral circuits and various function blocks are formed on one semiconductor substrate, in order to avoid problems caused by the difference in formation temperature, the MRAM cell array is formed in a wiring process where the maximum formation temperature is about 400° C. to 700° C.

For this reason, process steps sequentially proceed in the manufacturing process of the MRAM, requiring high manufacturing cost.

On the other hand, recently, a MCP structure in which a plurality of semiconductor chips are contained in one package is being used. Considering such a situation, the prevent inventors have come to the conclusion that an MRAM in which the MRAM cell array and its peripheral circuits and various function blocks are provided as different semiconductor chips and both chips are contained in one package as a module can solve the above problem, but have recognized that in practically providing the MRAM of MCP structure, the background-art package structure can not be used for the MRAM.

Hereafter, problems in realizing the MRAM of MCP structure will be discussed and then a structure of an MRAM 2000 in accordance with the eighth preferred embodiment will be discussed.

<H-1. MCP Structure in Background Art>

As a packaging method of a semiconductor chip including semiconductor devices, the QFP (Quad Flat Package) has been used in the background art but the QFP has a problem of requiring a large packaging area. Then, the CSP (Chip Size Package) needing a packaging area almost equal to the area of chip is being used recently. This package method, which only needs a packaging area too much smaller than that in the QFP, is used for DRAM and the like for LSI for a cellular phone and PC (Personal Computer).

Figure 54:
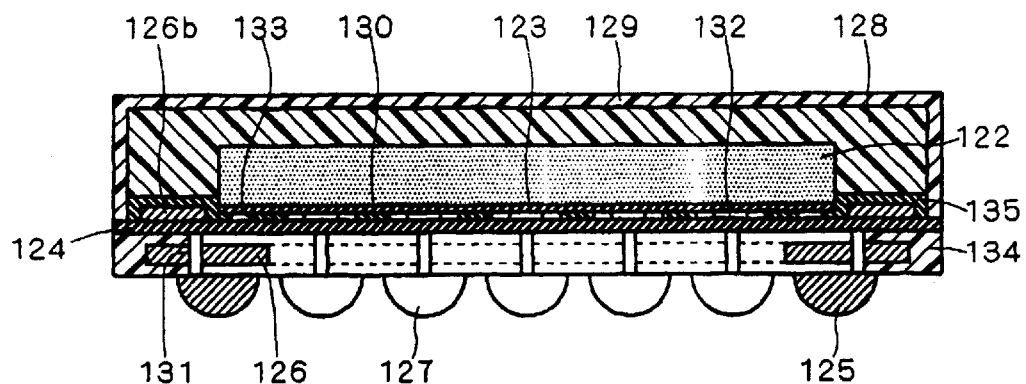
FIGS. 54 and 55 are cross sections each showing a structure of a general packaged MRAM.

FIG. 54 is a cross section showing an exemplary structure of the background-art CSP. In FIG. 54, a semiconductor chip 122 is contained in a box-like package 129 and a bottom main surface of the semiconductor chip 122 is covered with a passivation film 123, being protected from external environment.

The passivation film 123 is made of an insulating film such as silicon nitride film or silicon oxynitride and has a plurality of openings, through which chip electrodes 132 serving as I/O terminals of the semiconductor chip 122 penetrate the passivation film 123.

The package 129 has a box shape with a bottom and no cover and from its opening, the semiconductor chip 122 is inserted. The opening of the package 129 is eventually closed by a bottom-surface substrate 134. A body of the bottom-surface substrate 134 is made of insulative material such as polyimide resin and on its main surface facing the outside, a plurality of shielding solder bumps 125 and a plurality of signal transmitting solder bumps 127.

The bottom-surface substrate 134 has a plurality of internal wires 130 and 131 for electrically connecting the shielding solder bumps 125 and the signal transmitting solder bumps 127 to the internal constituent elements.

Both the internal wires 130 and 131 are connected to a carrier film 124 provided on a main surface facing the inside of the bottom-surface substrate 134. As discussed later, the carrier film 124 has an electrical wire (including a pad) and a bonding layer 133 provided on an insulating film. An electrical signal from the signal transmitting solder bump 127 is transmitted to the semiconductor chip 122 through the chip electrode 132 connected to the internal wire 130 and the pad of the carrier film 124. Further, the bonding layer 133 bonds the carrier film 124 and the semiconductor chip 122. Furthermore, not shown in FIG. 54, the carrier film 124 is bonded to the bottom-surface substrate 134 with another bonding layer.

A shielding electrode 126 made of conductive material is buried inside the bottom-surface substrate 134. The shielding electrode 126 has a rectangular shape in a plan view and has an opening through which the internal wire 130 passes without coming into contact with the shielding electrode 126. FIG. 54 is a cross section taken at a position where the opening of the shielding electrode 126 is provided, and the opening is indicated by the broken lines.

The shielding electrode 126 is fixed to a power supply potential or a ground potential through the shielding solder bump 125 and the internal wire 131, thereby preventing the internal wire 130 from picking some external electrical noises.

Further, a shielding electrode 126b is so provided on a top main surface of the carrier film 124 as to surround the semiconductor chip 122. The shielding electrode 126b is a flat plate having a rectangular ring shape in a plan view and electrically connected to the internal wire 131 through the electrical wire on the carrier film 124, being fixed to the power supply potential or the ground potential.

A stress relieving film 135 is so provided as to cover the shielding electrode 126b. The stress relieving film 135 relieves a stress between the semiconductor chip 122 and the bottom-surface substrate 134.

The cross section of the stress relieving film 135 originally has a rectangular shape, but is deformed with its thickness partially thinned when sandwiched between an edge portion of the semiconductor chip 122 and the carrier film 124. Specifically, though the stress concentrates on a portion sandwiched between the edge portion of the semiconductor chip 122 and the carrier film 124, thinning in thickness of the film relieves the stress.

As the stress relieving film 135, for example, a thermoplastic elastomer is used. The thermoplastic elastomer is a polymeric material to be molded in various ways, having rubber elasticity in the room temperature and being plasticized in high temperature.

Further, as a bonding material for bonding the semiconductor chip 122 and the stress relieving film 135, an epoxy resin or the like is used. While the volume expansion of the thermoplastic elastomer is about $2.7 \times 10^{-6}$, that of silicon is about $3.1 \times 10^{-6}$. Since the difference in volume expansion between these materials is small, thermal stress can be relieved.

In order to ensure both increase in the number of terminals and size reduction of package in the semiconductor package, for the purpose of solving the problems that the internal wire is likely to become longer and thinner and pick noises, the shielding electrode 126 and the shielding solder bumps 125 are provided. Further, in order to avoid increase in thermal stress between the semiconductor chip 122 and the bottom-surface substrate 134 causing loss in reliability of electrical connection, the stress relieving film 135 is provided.

The shielding electrode 126 has the above-discussed function and is connected to the shielding solder bumps 125 through the internal wire 131. The shielding solder bumps 125 are so provided as to surround the signal transmitting solder bumps 127 and have a function of preventing the internal wire 130 from picking some external electrical noises through the signal transmitting solder bumps 127. Further, not shown in this figure, the shielding solder bumps 125 and the signal transmitting solder bumps 127 are connected to a motherboard with interconnection printed thereon.

Figure 55:
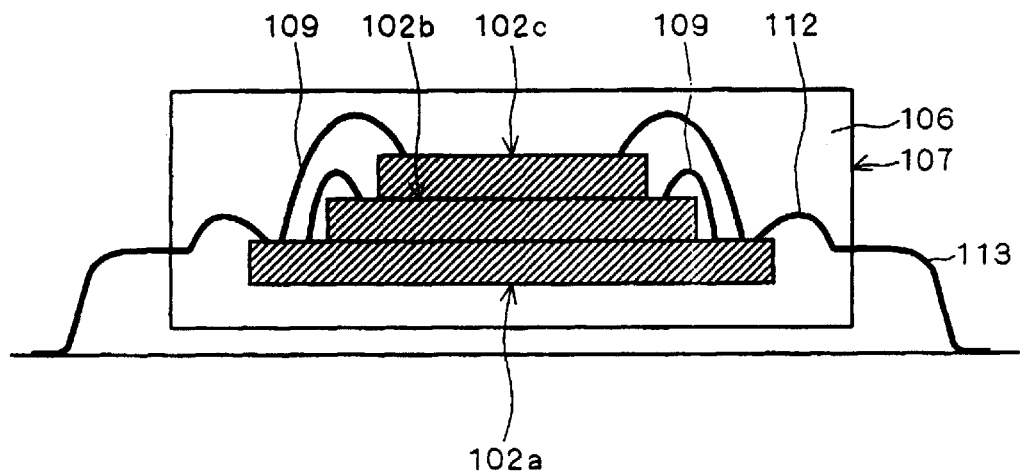

Furthermore, the MCP structure has been realized only with the QFP in the background art. FIG. 55 shows a cross-section of the MCP structure using the QFP. In FIG. 55, three semiconductor chips 102a, 102b and 102c are layered inside a package 107 and the package 107 is sealed by a resin 106.

As an example, the semiconductor chips 102a and 102c are SRAMs and the semiconductor chip 102b is a flash EEPROM.

The semiconductor chips are connected to one anther with an internal wire 109 and electrically connected to the outside by an external lead line 113 through a bonding wire 112.

Such a structure can ensure more memory capacity than a structure in which one package has only one semiconductor chip per occupied area. Therefore, there is great demand for this structure in the field of mobile information terminal.

The QFP, however, has problems that its packaging area is larger than the area of chip and the external lead line is likely to pick some noises.

Thus, both the CSP and the QFP have some merits and some demerits. Further, in the MRAM, since it is necessary to prevent the spins of the soft ferromagnetic layer from being reversed by the effect of external magnetic field, the background-art package structure can not be adopted itself.

<H-2. Device Structure>

Discussion will be made below on a structure of the MRAM 2000 of the eighth preferred embodiment, referring to FIGS. 56 to 65.

Figure 56:
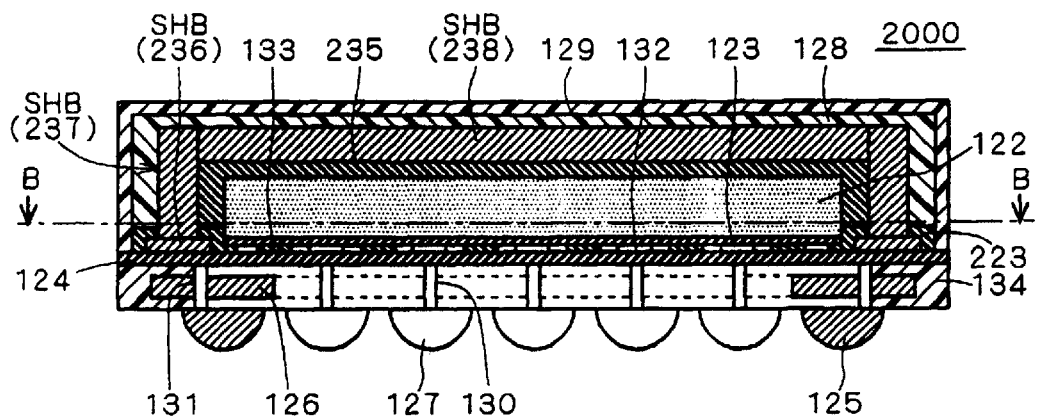
FIG. 56 is a cross section showing a structure of an MRAM in accordance with an eighth preferred embodiment of the present invention.
Figure 57:
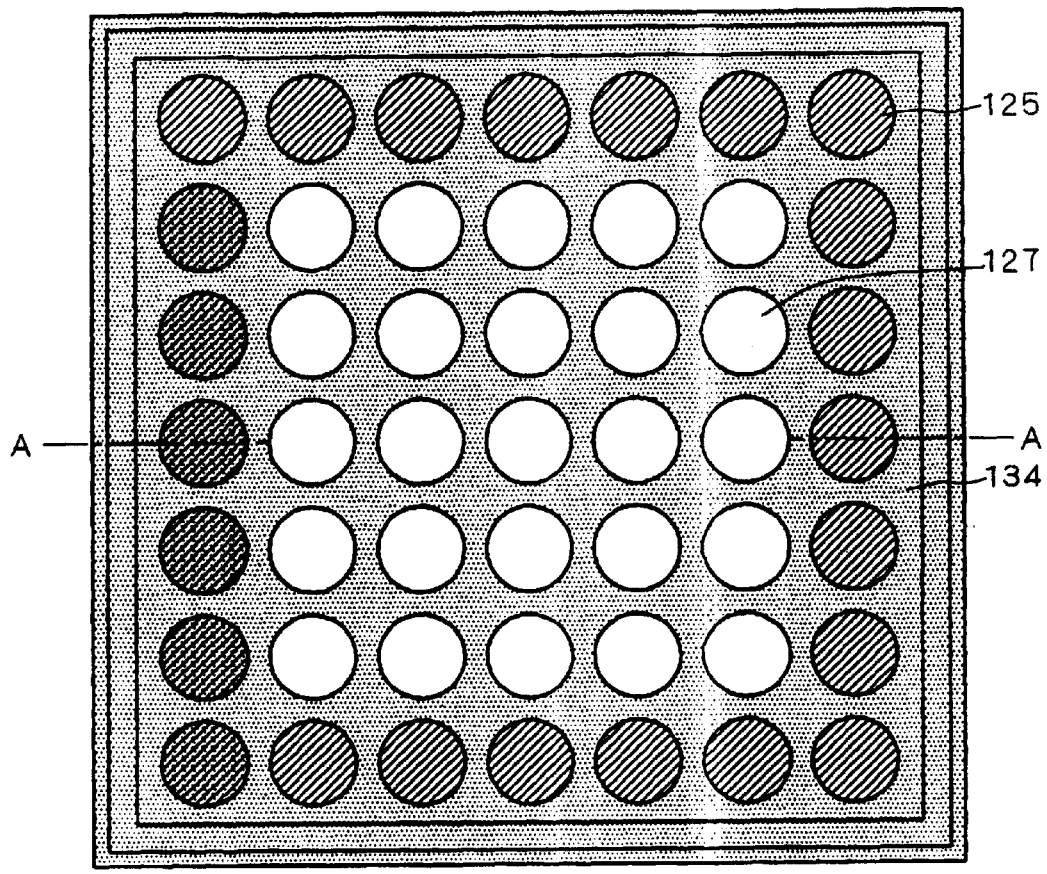
FIG. 57 is a plan view showing a structure of the MRAM in accordance with the eighth preferred embodiment of the present invention.

FIG. 56 shows a cross-sectional structure of the MRAM 2000, and FIG. 57 shows a planar structure of the MRAM 2000 viewed from lower side. Further, FIG. 56 is a cross section taken along the line A—A of FIG. 57.

As shown in FIG. 56, the semiconductor chip 122 including the peripheral circuits of the MRAM cell array and various function blocks is contained in a box-like shield body SHB made of conductive material having high magnetic permeability such as permalloy ($Ni_{80}Fe_{20}$).

As a material of the shield body SHB, supermalloy ($Mo_5Ni_{79}Fe_{16}$) as well as permalloy may be used as a ferromagnetic material having magnetic permeability equal to or higher than that of the soft ferromagnetic material used for, e.g., the MRAM cell. Since a ferromagnetic material having large coercivity serves as a permanent magnet, having possibility of affecting electric equipments therearound, it is desirable to use a ferromagnetic material having small coercivity. Permalloy, supermalloy and ferrite such as $Mn_{50}Zn_{50}$ are materials to satisfy this condition.

On an inner wall of the shield body SHB, a stress relieving film 235 made of thermoplastic elastomer is provided. The stress relieving film 235 relieves a stress between the semiconductor chip 122 and the shield body SHB.

The shield body SHB has a tubular outer frame 237 as its body, an upper plate 238 covering one end of the outer frame 237 and a lower plate 236 covering the other end of the outer frame 237, and the stress relieving film 235 is provided on inner surfaces of the upper plate 238 and the outer frame 237.

Further, the lower plate 236 has an opening and the internal wire 130 connected to the semiconductor chip 122 penetrates the opening.

The package 129 has a box shape with a bottom and no cover and from its opening, the shield body SHB having the semiconductor chip 122 is inserted.

The package 129 has such a size as to contain the shield body SHB and further have space, and a resin material 128 made of a resin such as epoxy resin is provided between the shield body SHB and the inner wall of the package 129.

The opening of the package 129 is eventually covered with the bottom-surface substrate 134. The body of the bottom-surface substrate 134 is made of insulative material such as polyimide resin and on its main surface facing the outside, a plurality of shielding solder bumps 125 and a plurality of signal transmitting solder bumps 127. Further, the bottom-surface substrate 134 is fixed by a bonding agent which is applied to the carrier film 124, the lower plate 236 and the like.

The bottom-surface substrate 134 has a plurality of internal wires 130 and 131 electrically connecting the shielding solder bumps 125 and the signal transmitting solder bumps 127 to the inner constituent elements.

The internal wires 130 and 131 are so provided as to be connected to the carrier film 124 provided on the main surface facing the inside of the bottom-surface substrate 134, and the internal wire 131 is electrically connected to the lower plate 236 of the shield body SHB through the pad and electrical wire provided on the carrier film 124.

Further, the internal wire 131 is electrically connected to the shielding electrode 126 made of conductive material buried inside the bottom-surface substrate 134. Furthermore, part of the shielding electrode 126 does not necessarily exist in the same cross section as the internal wires 130 and 131, being indicated by the broken lines.

The shielding electrode 126 is fixed to the power supply potential or the ground potential, preventing the internal wire 130 from picking some external electrical noises.

The chip electrode 132 serving as an I/O terminal of the semiconductor chip 122 is directly connected to the pad (film electrode) provided on the carrier film 124 and electrically connected to the internal wire 130 through the film electrode and the electrical wire patterned on the carrier film 124. Further, the internal wire 130 is connected to the signal transmitting solder bumps 127.

The signal transmitting solder bump 127 is a terminal for transmitting electrical signals between the outside and the semiconductor chip inside the package and the shielding solder bump 125 is a terminal for fixing the potential of the shield body SHB to the ground potential.

Further, as shown in FIG. 57, the shielding solder bumps 125 are so provided as to surround the signal transmitting solder bumps 127.

Furthermore, the signal transmitting solder bump 127 and the shielding solder bump 125 have a function of dispersing the stress on the bottom-surface substrate 134 into the mount board (motherboard), and by providing the shielding solder bumps 125, the stress applied to one solder bump can be reduced.

<H-3. Packaging Method>

Next discussion will be made on outline of method of packaging the MRAM 2000, referring to FIGS. 58 and 62. Further, FIGS. 58 to 62 schematically show the method of packaging the MRAM 2000 and does not precisely show the structure of FIG. 56.

Figure 58:
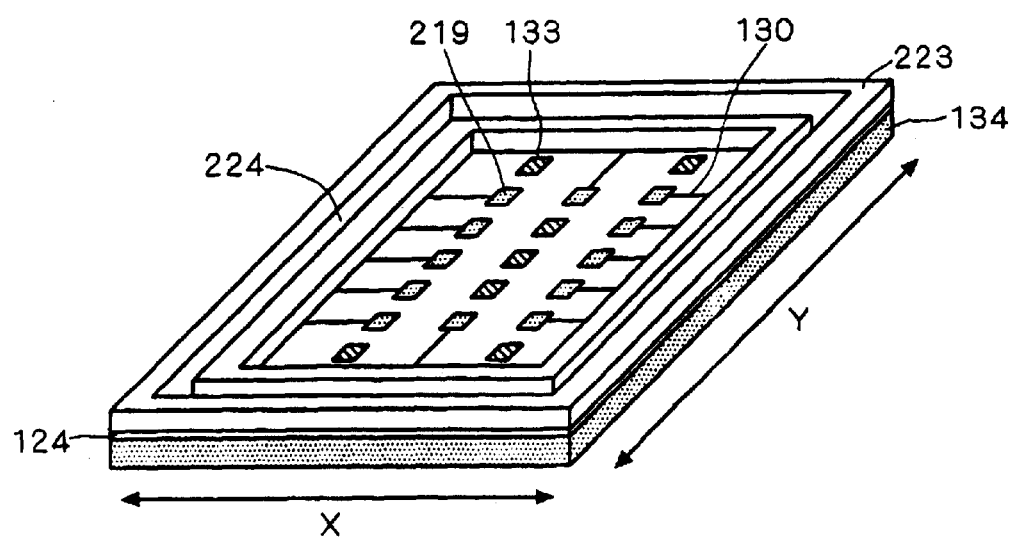
FIGS. 58 to 62 are perspective views showing a manufacturing process of the MRAM in accordance with the eighth preferred embodiment of the present invention.

In FIG. 58, the carrier film 124 is bonded onto the bottom-surface substrate 134 and a stress relieving film 223 is bonded onto the carrier film 124.

The stress relieving film 223 has a rectangular ring shape and is so provided as to surround a providing region for a film electrode 219 provided on the carrier film 124. Further, a trench 224 of rectangular ring is formed in the stress relieving film 223 and the lower plate 236 of the shield body SHB (FIG. 56) is provided in the trench 224. Further, the structure in which the lower plate 236 is provided in the trench 224 is shown in FIGS. 64A and 64B.

Further, not shown in this figure, the outer frame 237 of the shield body SHB (FIG. 46) is formed along the trench 224 in the later process step, being connected to the lower plate 236.

Furthermore, the stress relieving film 223, which has a rectangular ring shape, can relieve the stress in the X and Y directions (FIG. 58) equally.

The film electrode 219 provided on the carrier film 124 which is insulative is connected to the signal transmitting solder bump 127 through the internal wire 130.

Further, by approximately patterning the film electrode 219 and the internal wire 130 on the carrier film 124, connection of each bump and each chip electrode can be arbitrarily set.

The bonding layer 133 besides the film electrode 219 is selectively provided on the carrier film 124. The bonding layer 133 serves to bond the semiconductor chip 122 and the carrier film 124.

Figure 59:
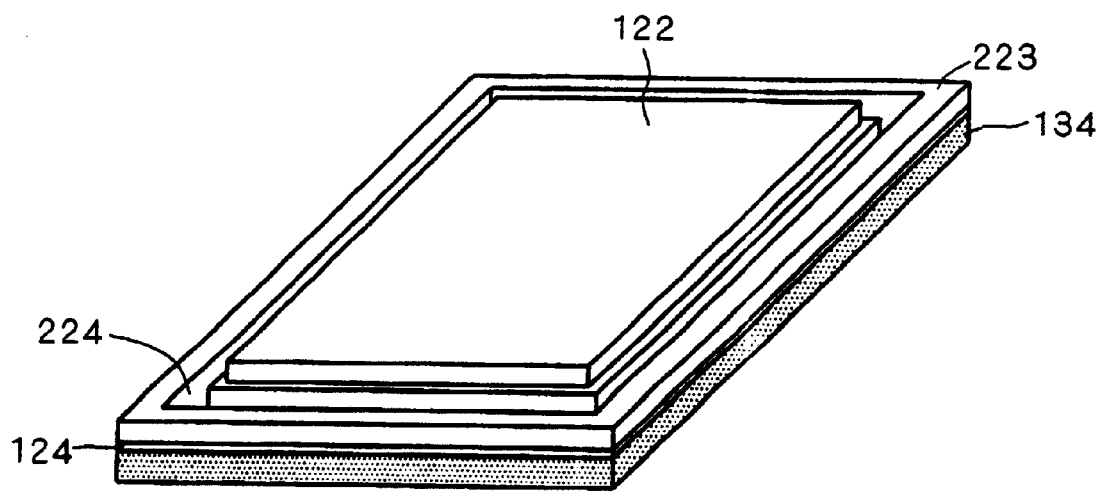

Next, in the process step of FIG. 59, the semiconductor chip 122 is mounted so that the chip electrodes of the semiconductor chip 122 may come into contact with the film electrodes of the carrier film 124, respectively, and fixed by the bonding layer 133.

Figure 60:
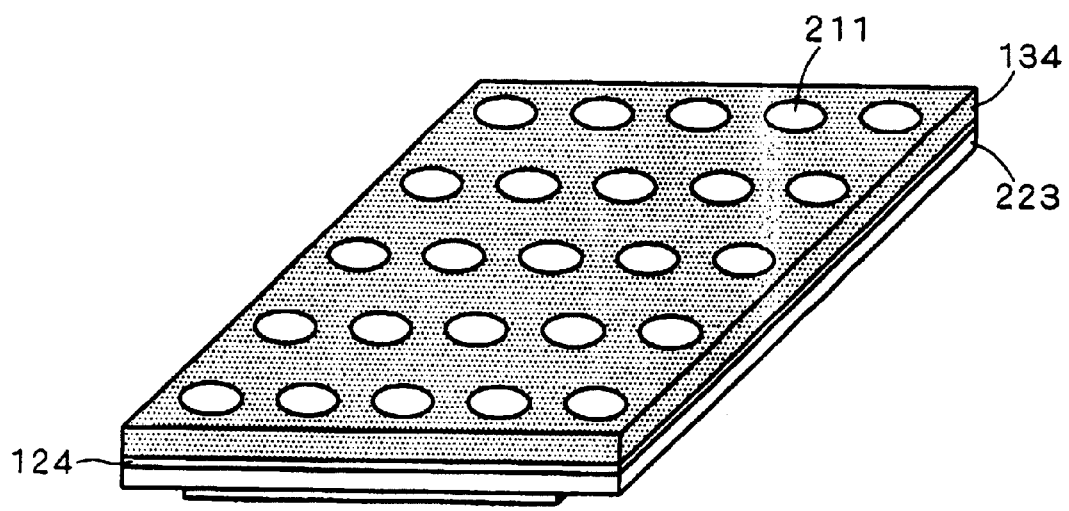

FIG. 60 shows a state of the bottom-surface substrate 134 which is reverse of that shown in FIG. 59, and a dome-shaped solder bump forming hole 211 is provided on the bottom-surface substrate 134. The internal wires 130 and 131 (see FIG. 56) reach an inner wall of the solder bump forming hole 211 and when a solder bump fills the inside of the solder bump forming hole 211 in the later process step, the solder bump and the internal wires 130 and 131 are electrically connected. Further, instead of the solder bump, a conductive polymer may be used.

Figure 61:
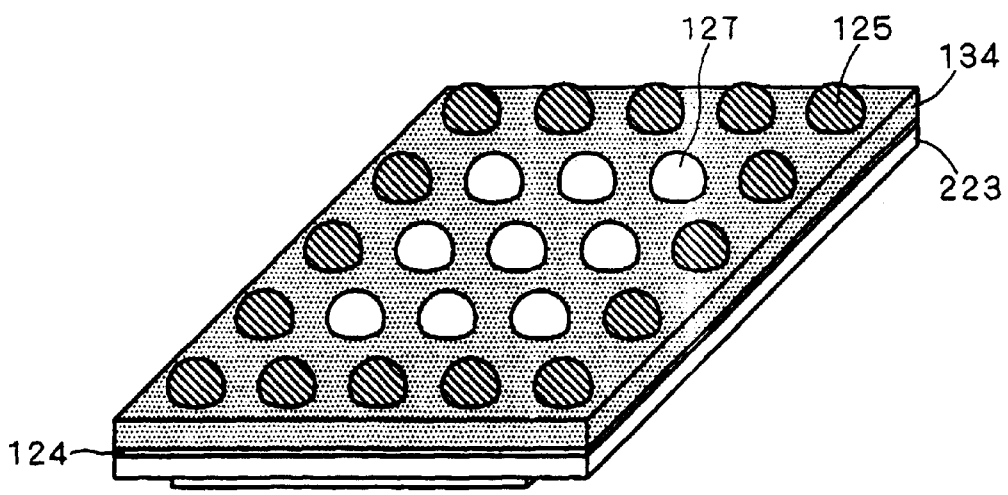
Figure 62:
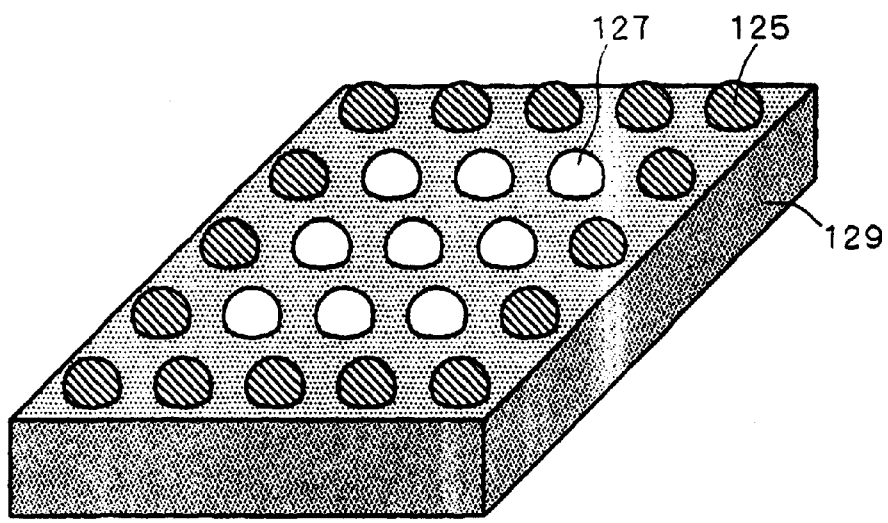

FIG. 61 shows a state where the signal transmitting solder bumps 127 and the shielding solder bumps 125 are provided in the solder bump forming holes 211.

After covering the semiconductor chip 122 with the shield body SHB having the stress relieving film 235 (FIG. 56) therein, the semiconductor chip 122 is inserted in the package 129 with a bottom and no cover and a sealing agent such as resin is injected into space, to achieve a structure having the signal transmitting solder bumps 127 and the shielding solder bumps 125 on its back surface as shown in FIG. 62.

Now, discussion will be made on a plan view of the lower plate 236 which is a constituent element of the shield body SHB and the stress relieving film 223, referring to FIGS. 63, 64A and 64B. Further, FIG. 63 shows a schematic cross-sectional structure taken along the line B—B of FIG. 56, and FIGS. 64A and 64B show cross-sectional structures taken along the lines C—C and D—D of FIG. 63, respectively.

As shown in FIG. 63, the lower plate 236 is made of a rectangular plate having an rectangular opening OP in the central portion and provided with the shielding electrode 126 (FIG. 56) of rectangular ring for making an electrical connection with the shielding solder bumps 125 on a side of the bottom-surface substrate 134. Further, the outer dimensions of the shielding electrode 126 is almost equal to that of the lower plate 236.

Furthermore, since the stress relieving films 223 are provided inside and outside an opening edge of the shield body SHB and the stress relieving film 235 (see FIG. 56) is provided entirely inside the shield body SHB, the stress externally applied on the semiconductor chip 231 and semiconductor chip 232 can be reduced.

<H-4. Action and Effect>

In the MRAM 2000 of the eighth preferred embodiment of the present invention as discussed above, since the semiconductor chip 122 including the MRAM cell array is surrounded by the shield body SHB for blocking the external magnetic field, it is possible to prevent the direction of magnetization, i.e., data from being rewritten through the reverse of the spins of the MRAM cells by the external magnetic field.

Further, since the stress relieving films 223 are provided inside and outside the opening edge of the shield body SHB and the stress relieving film 235 is provided entirely inside the shield body SHB, it is possible to reduce the external stress caused by the warp of the mount board (motherboard) and temperature cycle on the semiconductor chip 122.

<H-5. Variation 1>

Figure 65:
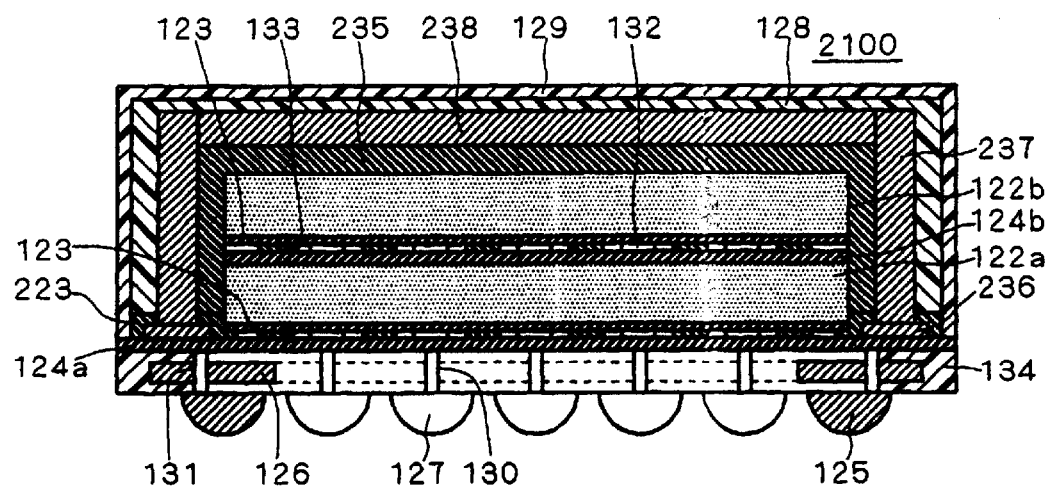
FIGS. 65 and 66 are cross sections each illustrating a structure of the MRAM in accordance with the eighth preferred embodiment of the present invention.

Furthermore, though one semiconductor chip is packaged in the above-discussed MRAM 2000, like an MRAM 2100 shown in FIG. 65, a structure in which a semiconductor chip 122a (circuit chip) including the peripheral circuits of the MRAM cell array and various function blocks and a semiconductor chip 122b (magnetic memory chip) including the MRAM cell array provided thereon are packaged may be adopted.

The semiconductor chip 122a comprises chip electrodes on both its main surfaces, and the semiconductor chip 122a and the semiconductor chip 122b are connected by the film electrode and the electrical wire on a carrier film 124b provided therebetween. Further, the semiconductor chip 122a and the semiconductor chip 122b are fixedly bonded by the bonding layer 133.

Further, the electrical connection between the semiconductor chip 122a and the signal transmitting solder bumps 127 is the same as that between the semiconductor chip 122 and the signal transmitting solder bumps 127 shown in FIG. 56, and since the structure is basically the same as that of the MRAM 2000 except that the carrier film is replaced by the carrier film 124a, discussion will be omitted.

Furthermore, the vertical arrangement of the semiconductor chip 122a and the semiconductor chip 122b may be reversed. In this case, it is only necessary to provide the chip electrodes on both main surfaces of the semiconductor chip 122b.

As combination of the semiconductor chip 122a and the 122b, any combinations of the well-known semiconductor chips are possible only if at least one of the semiconductor chips is provided with the MRAM cell array.

In the MRAM 2100 of FIG. 65, since the semiconductor chip 122a including the peripheral circuits of the MRAM cell array and various function blocks and the semiconductor chip 122b including the MRAM cell array are separately manufactured and then combined, consideration on the difference in formation temperature is not needed and respective formation temperature can be optimized. Further, since the semiconductor chip 122a and the semiconductor chip 122b are separately manufactured, the manufacturing process steps proceed in parallel, to reduce the manufacturing time.

<H-6. Variation 2>

Though the shield body SHB is made of a ferromagnetic material in the MRAM 2000 of FIG. 56, instead, an antiferromagnetic material such as IrMn containing Ir (iridium) by 20 to 30 atom. % may be used to produce the same effect.

Figure 66:
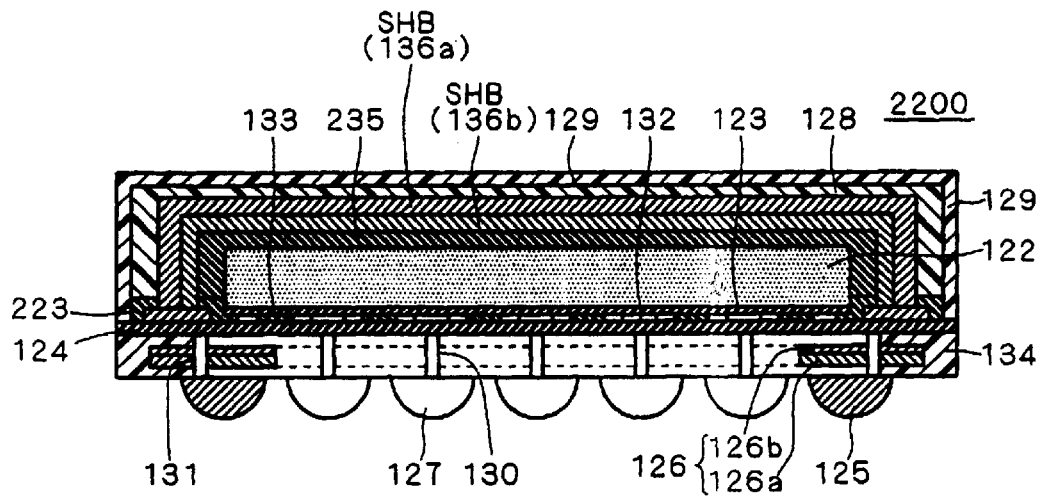
Figure 67:
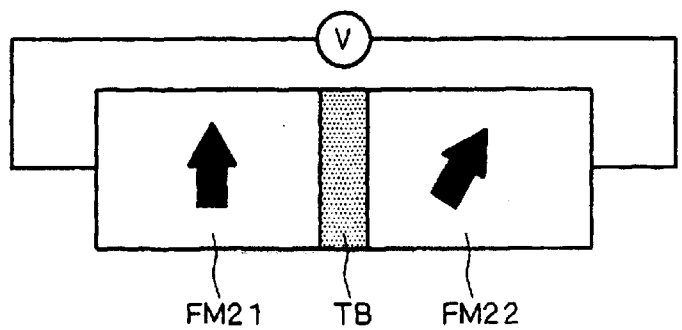
FIG. 67 is a view showing a concept of a magnetic tunnel junction.
Figure 68:
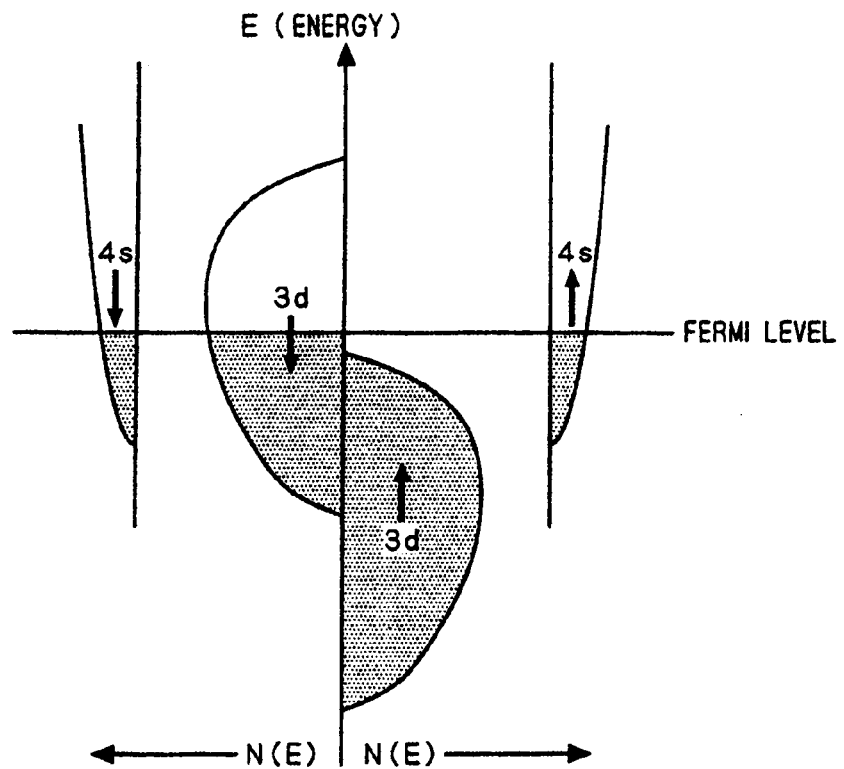
FIG. 68 is a view schematically showing the density of states of a transition metal.
Figure 69:
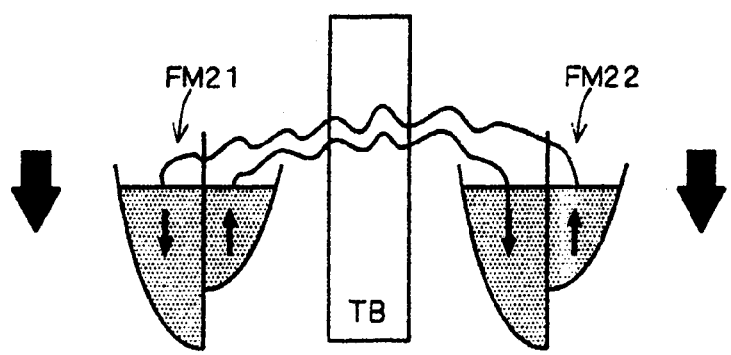
FIGS. 69 and 70 are schematic views illustrating a tunnel magnetic resistance effect.
Figure 70:
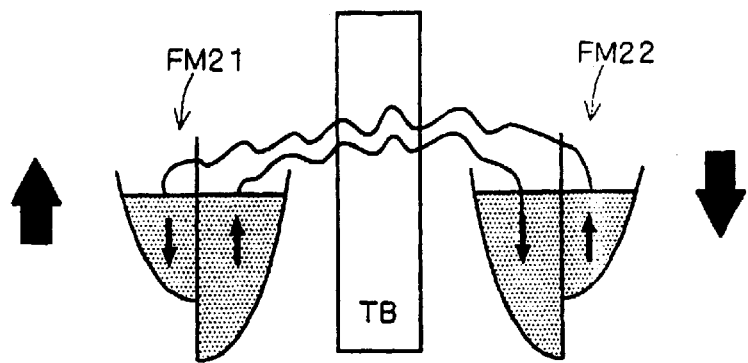
Figure 71:
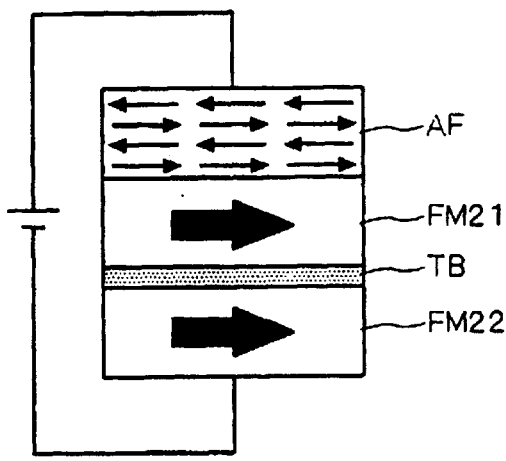
FIGS. 71 and 72 are views each showing an exemplary structure of a magnetic tunnel junction.
Figure 72:
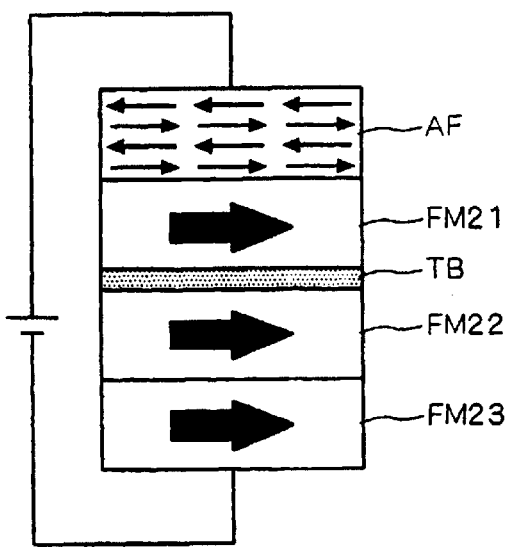
Figure 73:
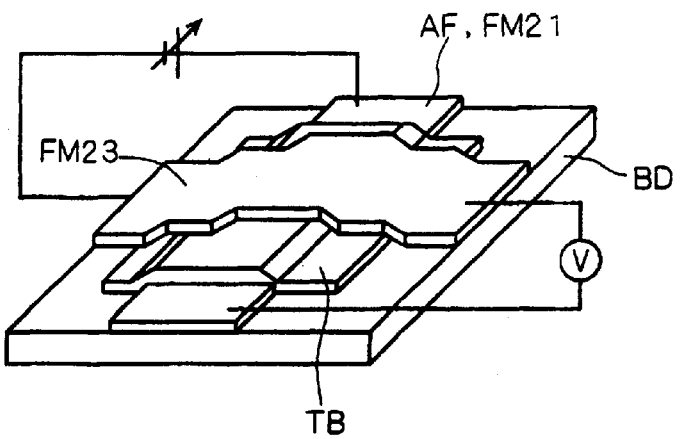
FIG. 73 is a view showing an example of spin valve type ferromagnetic tunnel junction element.
Figure 74:
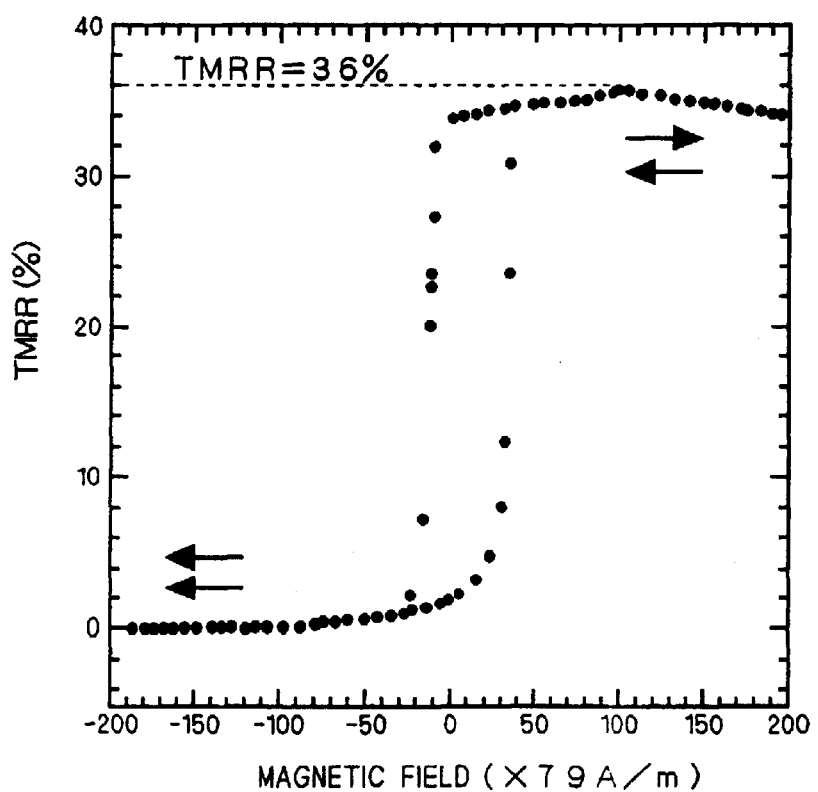
FIG. 74 is a view showing measured characteristics of the spin valve type ferromagnetic tunnel junction element.
Figure 75:
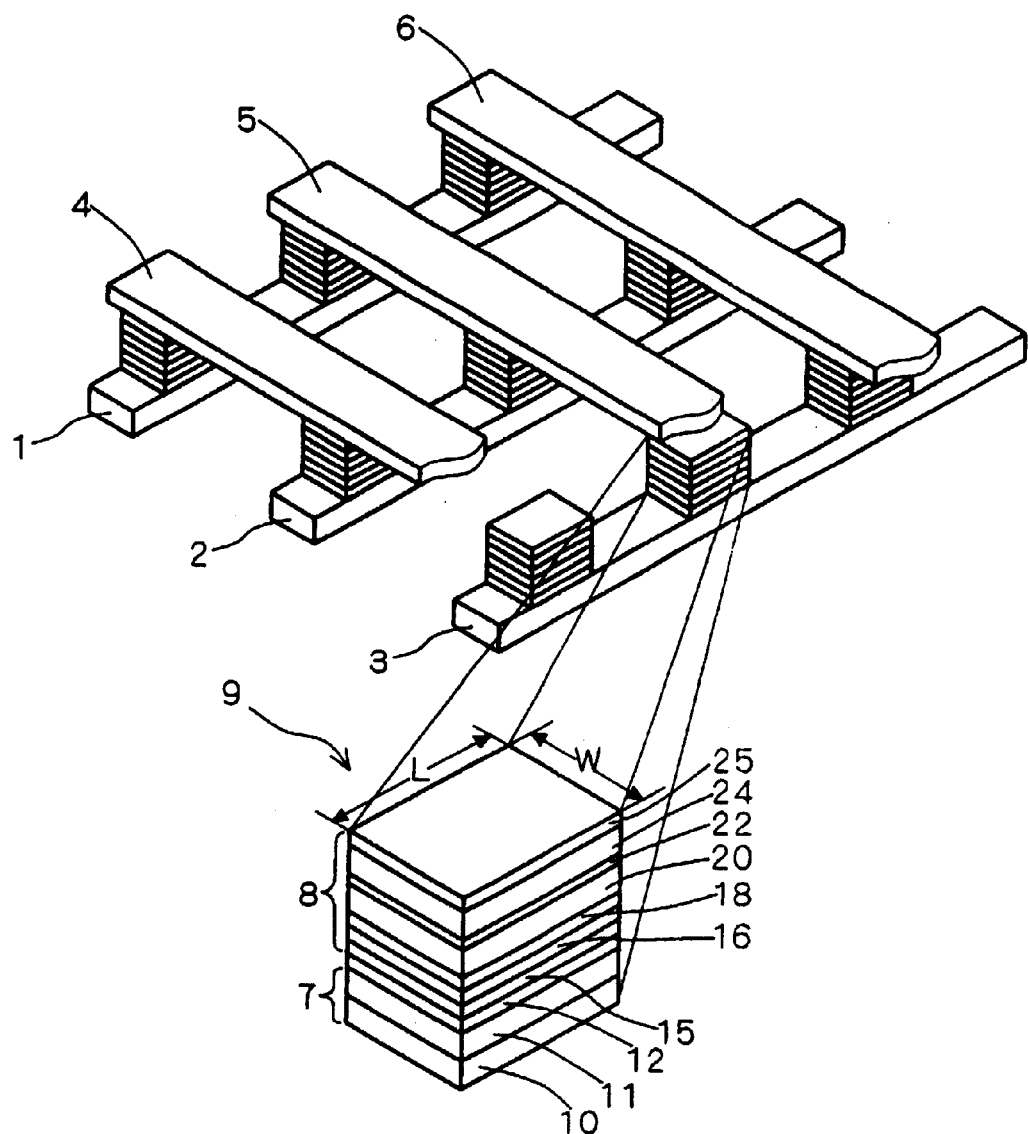
FIG. 75 is a perspective view showing a structure of an MRAM cell array in the background art.
Figure 76:
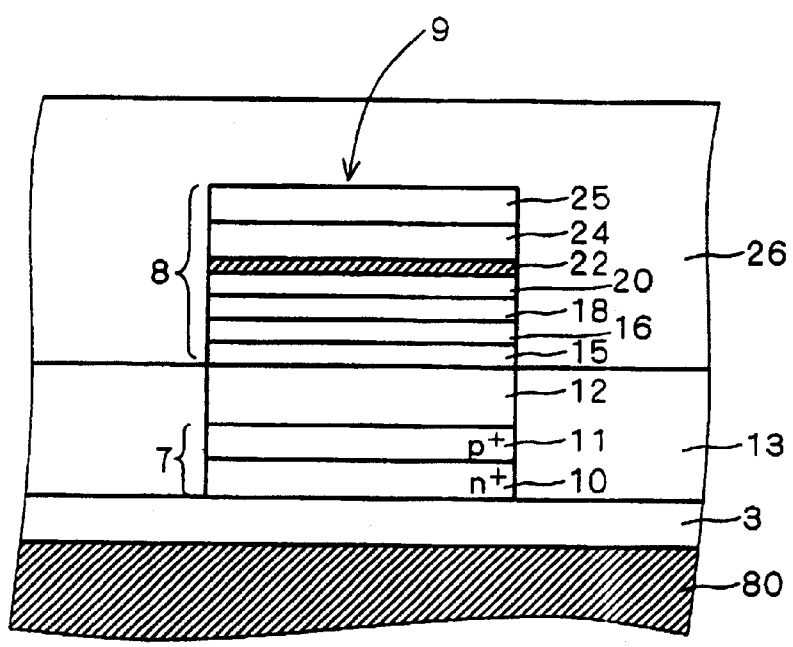
FIG. 76 is a schematic view showing the structure of the MRAM cell array in the background art.
Figure 77:
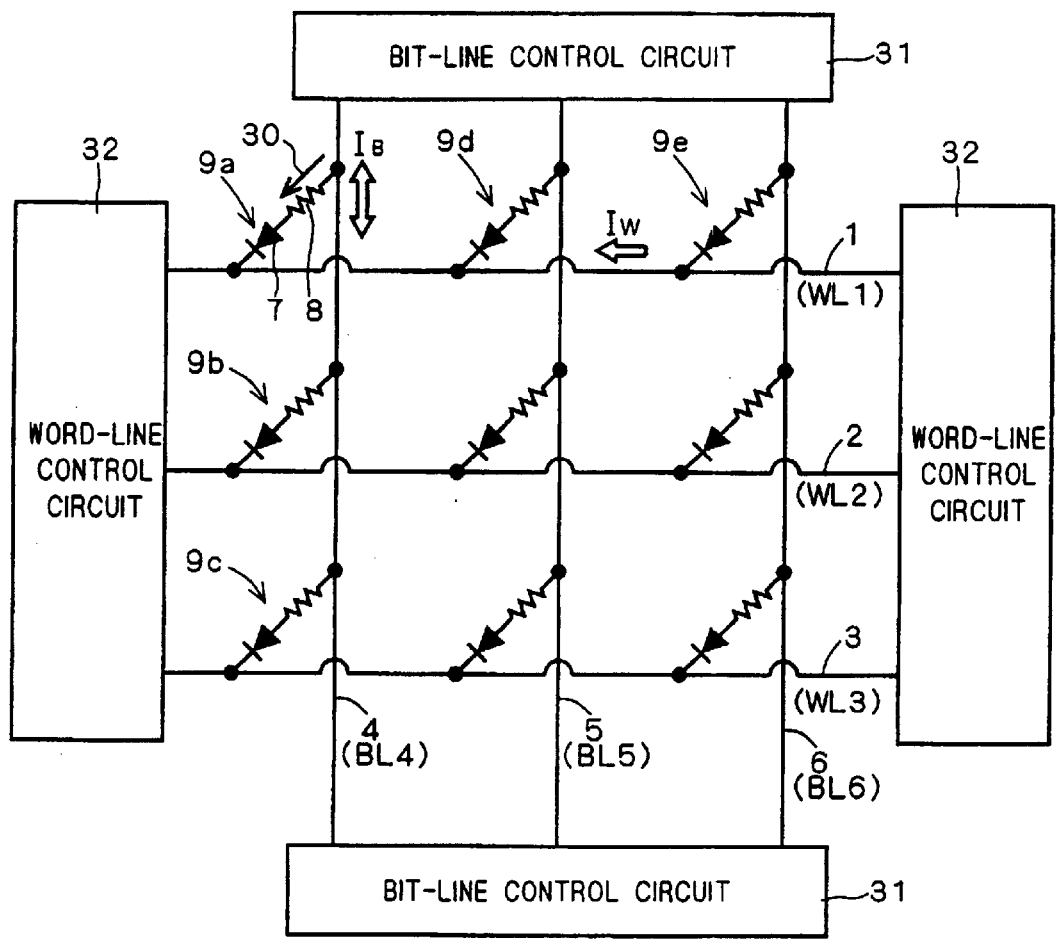
FIG. 77 is an equivalent circuit diagram of the MRAM cell array in the background art.
Figure 78:
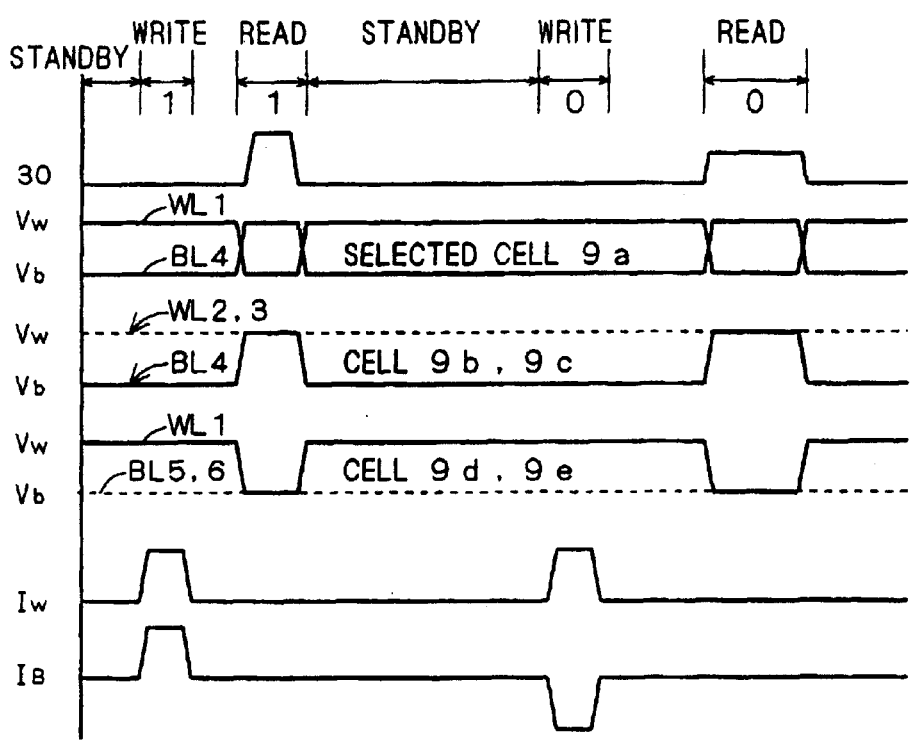
FIG. 78 is a view illustrating an operation of the MRAM cell array in the background art.

Further, like an MRAM 2200 shown in FIG. 66, the shield body SHB may be made of a multilayer film consisting of a ferromagnetic material 136a and an antiferromagnetic material 136b. In this case, the shielding electrode 126 in the bottom-surface substrate 134 has to be also made of a multilayer film consisting of a ferromagnetic material 126a and an antiferromagnetic material 126b. The vertical arrangement of the multilayer film is not limited to the above case.

While the invention has been shown and described in detail, the foregoing description is in all aspects illustrative and not restrictive. It is therefore understood that numerous modifications and variations can be devised without departing from the scope of the invention.

What is claimed is:

1. A magnetic memory device, comprising:
   at least one memory cell array consisting of
   a plurality of bit lines and a plurality of word lines, intersecting one another without being in contact to make up a matrix, and
   plurality of memory cells provided at intersections of said plurality of bit lines and said plurality of word lines, including at least one magnetic tunnel junction; and
   at least one flash bit line and at least one flash word line both having a flat-plate shape, being so provided outside said plurality of bit lines and said plurality of word lines in said at least one memory cell arrays, as to cover a formation region of said plurality of bit lines and said plurality of word lines.

2. The magnetic memory device according to claim 1, wherein
   said at least one memory cell array includes a plurality of memory cell arrays,
   said plurality of memory cell arrays are provided in matrix,
   said at least one flash bit line and at least one flash word line include a plurality of flash bit lines and a plurality of flash word lines, respectively, which are provided in matrix along the arrangement of said plurality of memory cell arrays.

* * * * *